United States Patent [19]

Shiraishi

[11] Patent Number: 5,546,225

[45] Date of Patent: Aug. 13, 1996

[54] HIGH RESOLUTION PRINTING TECHNIQUE BY USING IMPROVED MASK PATTERN AND IMPROVED ILLUMINATION SYSTEM

[75] Inventor: Naomasa Shiraishi, Kawasaki, Japan

[73] Assignee: Nikon Corporation, Tokyo, Japan

[21] Appl. No.: 455,141

[22] Filed: May 31, 1995

Related U.S. Application Data

[63] Continuation of Ser. No. 136,048, Oct. 14, 1993, abandoned, which is a continuation of Ser. No. 932,216, Aug. 19, 1992, abandoned.

[30] Foreign Application Priority Data

| Aug. 22, 1991 | [JP] | Japan | 3-210891 |
| Aug. 22, 1991 | [JP] | Japan | 3-210892 |
| Aug. 23, 1991 | [JP] | Japan | 3-211282 |

[51] Int. Cl.$^6$ ............ G02B 27/46; G03B 27/42; G21K 5/00; G03F 9/00
[52] U.S. Cl. ............ 359/559; 355/53; 359/564; 378/34; 430/5
[58] Field of Search ............ 359/559, 561, 359/564; 430/5; 382/55; 355/53; 378/34

[56] References Cited

U.S. PATENT DOCUMENTS

| 4,820,899 | 4/1989 | Hikima et al. | 219/121.76 |
| 4,884,101 | 11/1989 | Tanimoto | 355/68 |
| 4,895,780 | 1/1990 | Nissan-Cohen et al. | 430/5 |
| 4,947,413 | 8/1990 | Jewell et al. | 378/34 |
| 5,242,770 | 9/1993 | Chen et al. | 430/5 |
| 5,275,894 | 1/1994 | Tanabe | 430/5 |

FOREIGN PATENT DOCUMENTS

| 62-50811 | 4/1987 | Japan. |
| 62-59296 | 4/1987 | Japan. |
| 64-044449 | 2/1989 | Japan. |

OTHER PUBLICATIONS

Terasawa et al, "Submicron Photolithography using Phase-Shifting Mask", Papers of the Institute of Applied Physics, 1988 Autumn Meeting, p. 497.

Terasawa et al, "0.3–micron optical lithography using a phase–shifting mask", SPIE vol. 1088 Optical/Laser Microlithography II (1989), pp. 25–33.

Patent Abstracts of Japan, vol. 13, No. 242 (P-880) Jun. 7, 1989.

Patent Abstracts of Japan, vol. 14, No. 213 (E-923) May 7, 1990.

*Primary Examiner*—Martin Lerner
*Attorney, Agent, or Firm*—Shapiro and Shapiro

[57] ABSTRACT

In a method of manufacturing a lithographic mask by generating a plurality of light-shielding or transparent pattern elements with respect to a predetermined energy beam on a predetermined original plate on the basis of design data defining shapes and layout of the respective pattern elements, it is determined whether an outer edge of a specific pattern element of a predetermined width or less in the plurality of pattern elements is spaced apart from other pattern elements adjacent thereto by a predetermined distance or more. The design data is corrected so as to complementarily expand the outer edge portion of the specific pattern element outward from other outer edge portions by a small amount when the outer edge portion of the specific pattern element is spaced apart from the other pattern elements by the predetermined distance or more. The plurality of pattern elements are generated on the original plate on the basis of the corrected design data.

23 Claims, 45 Drawing Sheets

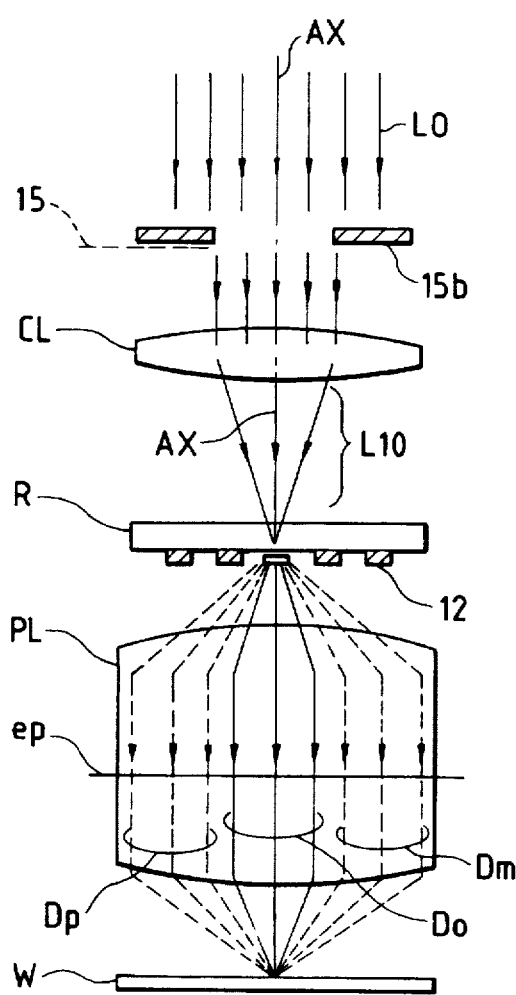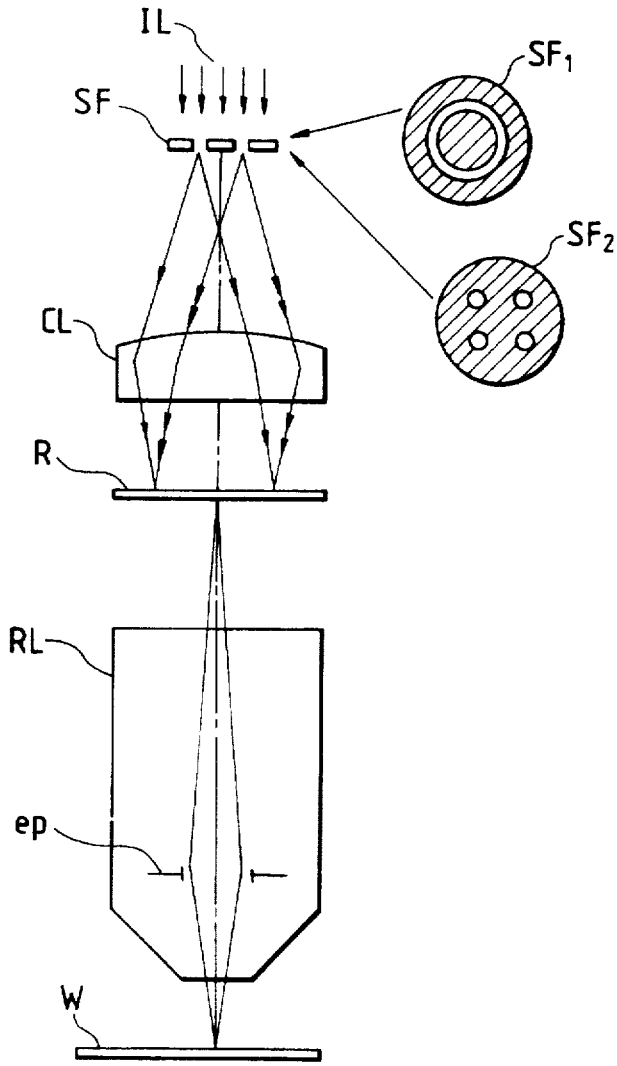

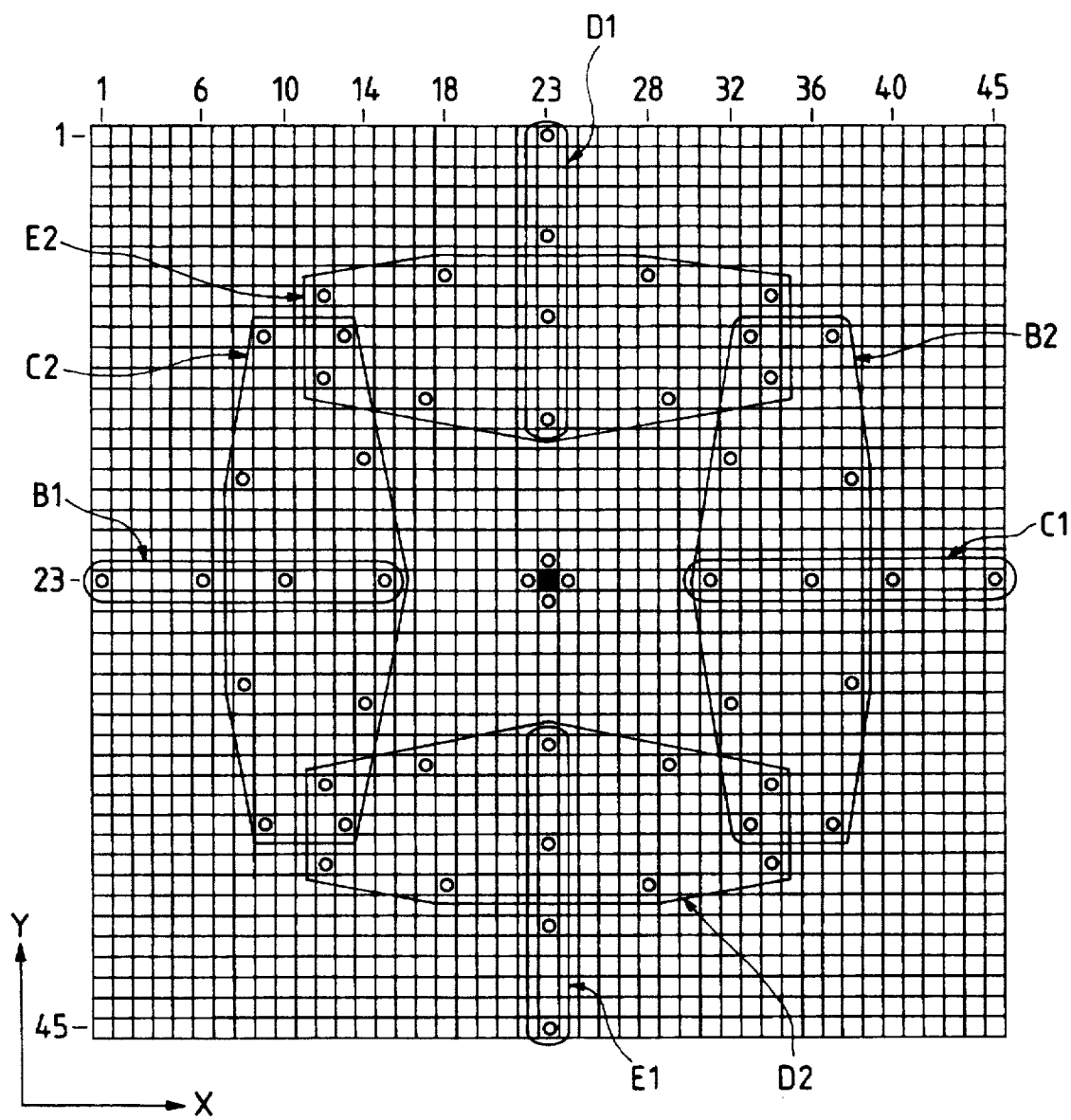

PRINCIPLE OF SHRINC

SECTION OF OPTICAL IMAGE M₁-M₂

SECTION OF OPTICAL IMAGE M₁-M₂

SECTION OF OPTICAL IMAGE M₃-M₄

SECTION OF OPTICAL IMAGE M₃-M₄

NEGATIVE RESIST IMAGE (TOP PLANE VIEW)

POSITIVE RESIST IMAGE (PERSPECTIVE VIEW)

HIGH RESOLUTION PRINTING TECHNIQUE BY USING IMPROVED MASK PATTERN AND IMPROVED ILLUMINATION SYSTEM

This is a continuation of application Ser. No. 08/136,048 filed Oct. 14, 1993, which is a continuation of application Ser. No. 07/932,216 filed Aug. 19, 1992, both now abandoned.

BACKGROUND OF THE INVENTION

1. Field of the Invention

The present invention relates to an improved lithographic mask pattern, a projection exposure system for the mask pattern, and the manufacture of the mask pattern.

2. Related Background Art

A lithographic technique is generally used in formation of a circuit pattern such as a semiconductor element. This process employs a method of transferring a reticle (mask) pattern onto a sample substrate such as a semiconductor wafer. A photoresist having photosensitive properties is applied to the surface of the sample substrate, and a circuit pattern is transferred to the photoresist in accordance with an illumination light image, i.e., the shape of a transparent pattern of the reticle pattern. In a projection exposure apparatus (e.g., a stepper), an image of the circuit pattern depicted on the reticle, which is to be transferred, is focused on the sample substrate (wafer) through a projection optical system.

FIG. 1 shows a schematic arrangement of a conventional general projection exposure apparatus (stepper). In this conventional projection exposure apparatus, light passing through a Fourier transform plane 15 for reticle patterns 12 has an almost uniform intensity distribution within a circular area (or a rectangular area) centered on the optical axis of an illumination optical system. Illumination light $L_0$ is limited to illumination light $L_{10}$ having a predetermined shape by an aperture stop (spatial filter) 15b in the illumination optical system. The illumination light $L_{10}$ illuminates the patterns 12 of a reticle R through a condenser lens CL.

In this case, the spatial filter 15b is located at or near a Fourier transform plane 15 (to be referred to as an illumination system pupil plane 15 hereinafter) for the reticle patterns 12. The spatial filter 15b causes an opening having an almost circular shape centered on an optical axis AX of a projection optical system to limit a secondary source (surface light source) image formed within the pupil plane to a circular image. The illumination light passing through the reticle patterns 12 can focus the reticle patterns 12 on a resist layer on a wafer W through a projection optical system PL. Solid lines representing rays represent a 0th-order light component Do emerging from one point of the reticle pattern 12. At this time, a ratio of the numerical aperture of the illumination optical system (15b and CL) to the reticle-side numerical aperture of the projection optical system PL, i.e., a σ value, is determined by the aperture stop (e.g., the aperture size of the spatial filter 15b). The σ value generally falls within the range of about 0.5 to about 0.6.

A conventional mask pattern is a pattern having the same shape as or similar shape to a pattern to be formed on a wafer as, e.g., a semiconductor integrated circuit pattern. A mask used for one-to-one exposure (e.g., a contact scheme, a proximity scheme, or a mirror projection scheme) has a pattern having the same shape (congruence) as a pattern to be formed on the wafer. A mask used for reduction projection exposure (e.g., a stepper scheme) has a larger pattern than a pattern to be formed on the wafer in accordance with a reduction ratio. If a reduction ratio is ⅕, the size of the pattern on the reticle is five times that of the pattern on the wafer (mask-side conversion).

Since the σ value (coherence factor) of the illumination system in the conventional projection exposure apparatus falls within the range of 0.5 to 0.6, as described above, coherency on the reticle is low. Interference between light components between adjacent patterns does not pose any problem.

The illumination light $L_{10}$ is diffracted by the patterns 12 formed on the reticle R into the 0th-order diffracted light component Do, a (+) 1st-order diffracted light component Dp, and a (−) 1st-order diffracted light component Dm from the patterns 12. These diffracted light components (Do, Dm, and Dp) are focused by the projection optical system PL to form interference fringes on the wafer W. These interference fringes represent images of the patterns 12. At this time, an angle θ (reticle side) formed between the 0th-order diffracted light component Do and the (±) 1st-order diffracted light components Dp and Dm is determined by $\sin\theta = \lambda/P$ (where λ is the exposure wavelength and P is the pattern pitch).

When a pattern pitch decreases, the sinθ increases. When the sinθ becomes larger than the reticle-side numerical aperture ($NA_R$) of the projection optical system PL, the (±) 1st-order diffracted light components Dp and Dm cannot pass through the projection optical system PL. At this time, only the 0th-order diffracted light component Do reaches the wafer W, and interference fringes are not formed thereon. That is, if condition $\sin\theta > NA_R$ is established, the images of the patterns 12 cannot be obtained. As a result, the patterns 12 cannot be transferred onto the wafer W.

Judging from the above description, in a normal projection exposure apparatus, the pitch P satisfying $\sin\theta = \lambda/p \simeq NA_R$ is given as follows:

$$P \simeq \lambda/NA_R \quad (1)$$

Since the minimum pattern size is ½ the pitch P, the minimum pattern size becomes about $0.5 \cdot \lambda/NA_R$. In the practical photolithographic process, however, a given depth of focus is required due to wafer warping, an influence of a step formed in the wafer in the process, and the thickness of the photoresist itself. For this reason, a practical minimum resolution pattern size is represented by $k \cdot \lambda/NA$ where k is the process coefficient which falls within the range of about 0.6 to about 0.8. Since a ratio of the reticle-side numerical aperture $NA_R$ to the wafer-side numerical aperture $NA_W$ is almost equal to the focusing magnification of the projection optical system, the minimum resolution pattern size becomes $k \cdot \lambda/NA_R$ and the minimum resolution pattern size on the wafer becomes $k \cdot \lambda/NA_W = k \cdot \lambda/B \cdot NA_R$ (where B is the focusing magnification (reduction factor)).

In order to transfer a finer pattern, an exposure light source having a shorter wavelength or a projection optical system having a larger numerical aperture must be used. It is possible to optimize both the exposure wavelength and the numerical aperture. Alternatively, a so-called phase shifting reticle is proposed in Japanese Patent Publication No. 62-50811, in which, of all transmission parts of the circuit pattern of the reticle, the phase of light transmitted from a specific part is shifted from that from an adjacent part by π. When this phase shift reticle is used, a finer pattern can be transferred.

The same technique as in Japanese Patent Publication No. 62-50811 is also described in Japanese Patent Publication No. 62-59296 (priority claimed to U.S. Ser. No. 365,672 on Apr. 5, 1982).

In the conventional projection exposure apparatus, however, when the illumination light has a shorter wavelength than that currently used, a high-power laser source for ultraviolet rays is required, as proposed in U.S. Pat. No. 4,820,899 or 4,884,101. In addition, "when the wavelength is 200 nm or less,"; the wavelength is 200 nm or less, the existing projection optical system including a diffractive element cannot be used at the wavelength of 200 nm or less because an appropriate material which can be used as a transmission optical member does not exist.

The numerical aperture of the state-of-the-art projection optical system is almost a theoretical limit, and a significant increase does not seem a realistic possibility; the numerical aperture is assumed not to. Even if the numerical aperture can be larger than that currently used, the depth of focus abruptly decreases with an increase in numerical aperture (N.A.), "and the depth of focus used in"; and the depth of focus used in, resulting in inconvenience.

On the other hand, the phase shift reticle is expensive due to the complicated manufacturing process, and neither a test method nor a correction method is established, thus posing many problems. In addition, when a phase shift reticle is used, the σ value as an illumination condition must be small, as disclosed in Japanese Patent Publication No. 62-59296.

A projection transfer technique having a higher resolving power than that in the conventional technique by using an existing projection exposure apparatus but without using a phase shift reticle is proposed in U.S. Pat. No. 4,947,413. In U.S. Pat. No. 4,947,413, a spatial filter is arranged on a Fourier transform plane within a projection optical system, and two specific diffracted light components (e.g., the (+) 1st- and (−) 1st-order diffracted light components, or the 0th-order diffracted light component and one of the (±) 1st-order diffracted light components) generated from the reticle patterns pass toward the wafer.

The present inventor filed U.S. Ser. No. 791,138 (Nov. 13, 1991) describing an improved practical projection transfer technique as compared that described in U.S. Pat. No. 4,947,413. According to this disclosed technique, a high resolving power and a large depth of focus can be obtained without arranging a spatial filter on the Fourier transform plane of the projection optical system. Although the principle of this technique will be described in detail later, the concept essentially different from that in U.S. Pat. No. 4,947,413 is to concentrate the intensity of exposure illumination light at four positions of the Fourier transform plane in the illumination optical system, so that a two-dimensional periodic pattern on a reticle can be projected at a high resolving power with a high contrast. A method of determining the above four positions is a characteristic feature, which cannot be anticipated from U.S. Pat. No. 4,947,413.

In the present invention, a technique for obtaining better image quality than that in a conventional normal focusing scheme by improving only the illumination optical system is called SHRINC (Super High Resolution by IllumiNation Control). Another form of SHRINC incorporates formation in which the shape of a secondary source formed on the Fourier transform plane of the illumination optical system is set as an annular shape.

As described above, although the resolving power and the depth of focus certainly increase in accordance with the SHRINC method and the phase shift method, this applies to only periodic patterns. Satisfactory results are not necessarily obtained for portions having no periodicity, and the causes of problems of the respective techniques will be briefly summarized as follows.

(A) Phase Shift Method

Since the σ value of the illumination optical system of the conventional projection exposure apparatus shown in FIG. 1 is relatively as large as 0.5 to 0.7, coherency of the illumination light on the reticle pattern surface is low. For this reason, adjacent patterns do not substantially influence each other regardless of the type of pattern adjacent to a specific pattern.

In order to maximally enhance the effect of the phase shift method, the σ value of the illumination optical system must be set as small as about 0.2 to about 0.3. For this reason, coherency of the illumination light on the reticle increases, and the width of a resist line upon exposure and transfer of one pattern is influenced by an adjacent pattern.

According to an experimental conclusion, in the phase shift method, the resist line width of a line pattern located at an end position of a periodic pattern in the periodic direction, or an isolated pattern tends to be smaller than that of the periodic pattern. The above conclusion is based on an assumption that patterns to be compared with each other have the same size on the reticle and are exposed and transferred with the same exposure amount, as a matter of course.

In the phase shift method, in order to obtain desired line widths of both the periodic pattern portion and the isolated pattern portion as resist images (i.e., the circuit pattern sizes obtained upon pattern etching), the shapes of the respective patterns of the reticle patterns must be corrected beforehand.

A technique for adding auxiliary patterns near the vertices of a small square so as to clearly expose a four corners of, e.g., a small square transmission pattern (contact hole pattern) has been reported. However, this technique does not propose the correction in consideration of interaction between necessary patterns. In order to enhance the effect of the phase shift method, a method of forming an auxiliary pattern near an original pattern (Papers of the Institute of Applied Physics, 1988 Autumn Meeting). However correction is not made in consideration of the interaction between necessary patterns in this method either. The correction methods described above are based on empirical manual operations and are not automatic correction methods in which algorithms are established.

(B) SHRINC Method

The SHRINC method disclosed in U.S. Ser. No. 791,138 filed by the present inventor is illustrated in FIG. 2. FIG. 2 additionally illustrates the SHRINC method for providing an annular illumination light distribution.

Referring to FIG. 2, a projection optical system PL is located between a reticle R and a photosensitive substrate (wafer) W, and a pattern on the reticle R is focused on the wafer W. At this time, the reticle R is illuminated with exposure illumination light through a condenser lens CL in an illumination optical system. A spatial filter $SF_1$ for shaping illumination light IL into annular light or a spatial filter $SF_2$ having small openings at two to four discrete positions is arranged within the Fourier transform plane (the same plane as the illumination system pupil plane 15 in FIG. 1) of the illumination optical system. Light components parallel to the optical axis of the projection lens or projection optical system PL are eliminated by the spatial filter $SF_1$ or $SF_2$, and illumination light having light components having a specific angle reaches the reticle R. The spatial filter $SF_1$ or $SF_2$ is located on the Fourier transform plane of the illumination optical system, as described above, and at the same time is conjugate with a pupil plane ep of the projection optical system PL.

When the inclination characteristics of the illumination light with respect to the reticle R are converted into specific ones by the illumination optical system, the resolving power and the depth of focus of the pattern can be improved by about 10% to 40%.

When the exposure apparatus which employs the SHRINC method described above is used, the incident direction of the illumination light on the reticle is limited to the direction different from that in the conventional case. For this reason, coherency different from that in the conventional case occurs in the illumination light on the reticle, and the interaction between the adjacent patterns cannot be neglected. For this reason, if several patterns having the same size are present on a reticle, the exposed and transferred images (i.e., photoresist images) on the wafer are thickened or thinned by influences of adjacent patterns of the reticle patterns having the same size.

According to an experimental conclusion, when the SHRINC method (particularly the filter $SF_2$) is used, the resist line width of an isolated pattern and an end portion of a periodic pattern in the periodic direction tend to be smaller than that of the periodic pattern. The above conclusion is based on an assumption that patterns to be compared with each other have the same size on the reticle and are exposed and transferred with the same exposure amount, as a matter of course. In addition, if the isolated pattern is a linear pattern, the length of the line tends to slightly decrease.

In the SHRINC method, in order to obtain desired line widths of both the periodic pattern portion and the isolated pattern portion as resist images (i.e., the circuit pattern sizes obtained upon pattern etching), the shapes of the respective patterns of the reticle patterns must be corrected beforehand.

In the conventional SHRINC method, an algorithm (correction method) for automatically performing such correction and a correction apparatus are not realized at all.

SUMMARY OF THE INVENTION

It is an object of the present invention to provide formation of a reticle pattern (mask pattern) in which a change in size of a pattern image projected using a phase shift method or a SHRINC method can be compensated.

It is another object of the present invention to provide a method of transferring a desired pattern as a design pattern onto a photosensitive substrate (wafer) using the compensated reticle pattern.

It is still another object of the present invention to provide a method of automatically correcting a reticle pattern in accordance with a predetermined algorithm, and a mask manufacturing system for practicing the method.

It is still another object of the present invention to provide an algorithm capable of automatically correcting a reticle pattern projected and exposed by a SHRINC scheme in the form of design data (CAD data or the like).

It is still another object of the present invention to provide a mass-production system for depicting a pattern on a reticle (mask) on the basis of pattern data automatically corrected to a pattern size optimized for the phase shift method or the SHRINC scheme.

In order to achieve the above objects, the present invention is basically constituted as follows.

First, the present invention relates to a method of manufacturing a lithographic mask by generating, on a predetermined original plate, a plurality of pattern elements for shielding or transmitting a predetermined energy beam on the basis of design data which defines the shapes and layout of the respective pattern elements.

In this method, of the plurality of pattern elements, it is determined whether an outer edge of a specific pattern having a predetermined line width or less is spaced apart from other patterns adjacent thereto by a predetermined distance or more. If the specific pattern is spaced apart from other patterns by the predetermined distance or more, design data is corrected such that the outer edge of this specific pattern element is expanded outward relative to other outer edges by a small amount. The plurality of pattern elements are formed on the original plate on the basis of the corrected design data.

Second, the present invention relates to a system for generating the corrected pattern to manufacture a lithographic mask.

This system comprises:

a binary development circuit (2) for developing a design image corresponding to at least part of an original plate into a binary image consisting of a set of small pixels on the basis of design data;

a test circuit (200–206) for testing on the basis of information of the developed binary image whether an outer edge of a specific pattern of the plurality of pattern elements which has a predetermined line width or less is spaced apart from other pattern elements adjacent thereto by a predetermined distance or more; and a correction circuit (216, 218, 220) for correcting the binary image so that the outer edge of the specific pattern element is expanded outward relative to other outer edges by a small amount in units of pixels when the test circuit detects that the outer edge of the specific pattern element is spaced apart from other pattern elements by the predetermined distance or more.

the plurality of pattern elements are generated on the original plate on the basis of information of the binary image corrected by the correction circuit.

The present invention constituted as described above is particularly suitable for correction of a mask pattern in the phase shift method.

Third, in order to maximally enhance the effect of the SHRINC method disclosed in U.S. Ser. No. 791,138, a mask whose pattern line width is corrected to expand or reduce a pattern edge by a small amount is used depending on whether the pattern edge is an isolated edge or an end portion.

Fourth, in order to obtain a mask pattern suitable for the SHRINC method, a system of the present invention comprises:

a binary development circuit (2) for developing a design image corresponding to at least part of a mask original plate into a binary image consisting of a set of small pixels on the basis of design data;

a first test circuit (200S, 207S) for testing on the basis of information of the developed binary image whether a target edge portion ($A_{PX}$) of outer edges of the pattern elements is spaced apart from other pattern elements adjacent thereto by a predetermined number of pixels, and for outputting a first test signal (KA) when the target edge portion is spaced apart from other pattern elements; and a second test circuit (202S, 205S, 206S, 208S, 209S, 210S, 211S) for testing on the basis of the information of the developed binary image whether the target edge portion ($A_{PX}$) is an edge for defining a widthwise direction of a portion near a pattern end portion of a predetermined width or less, and for outputting a second test signal (KB) when the target edge portion is the edge portion of the portion near the pattern edge portion. In addition, the system comprises a correction circuit (220S–223S) for correcting the binary image so that the target edge portion is expanded outward relative to other edge portions by a first small amount in units of pixels when the first test signal (KA) is output, correcting the binary image so that the target edge portion is expanded outward relative to other edge portions by a second small amount in units of pixels when the second test signal (KB) is output, and correcting the binary image so that the target edge is expanded outward relative to other edge portions by an amount determined by synthesis of the first and second small amounts when both the first and second test signals are output.

BRIEF DESCRIPTION OF THE DRAWINGS

FIG. 1 is a view for explaining the principle of focusing in a conventional projection exposure apparatus;

FIG. 2 is a view showing a schematic arrangement of an exposure apparatus suitable for projecting a reticle pattern formed in the present invention;

FIG. 21 is a view showing the layout of a test element according to the second embodiment;

9

Figure 42:
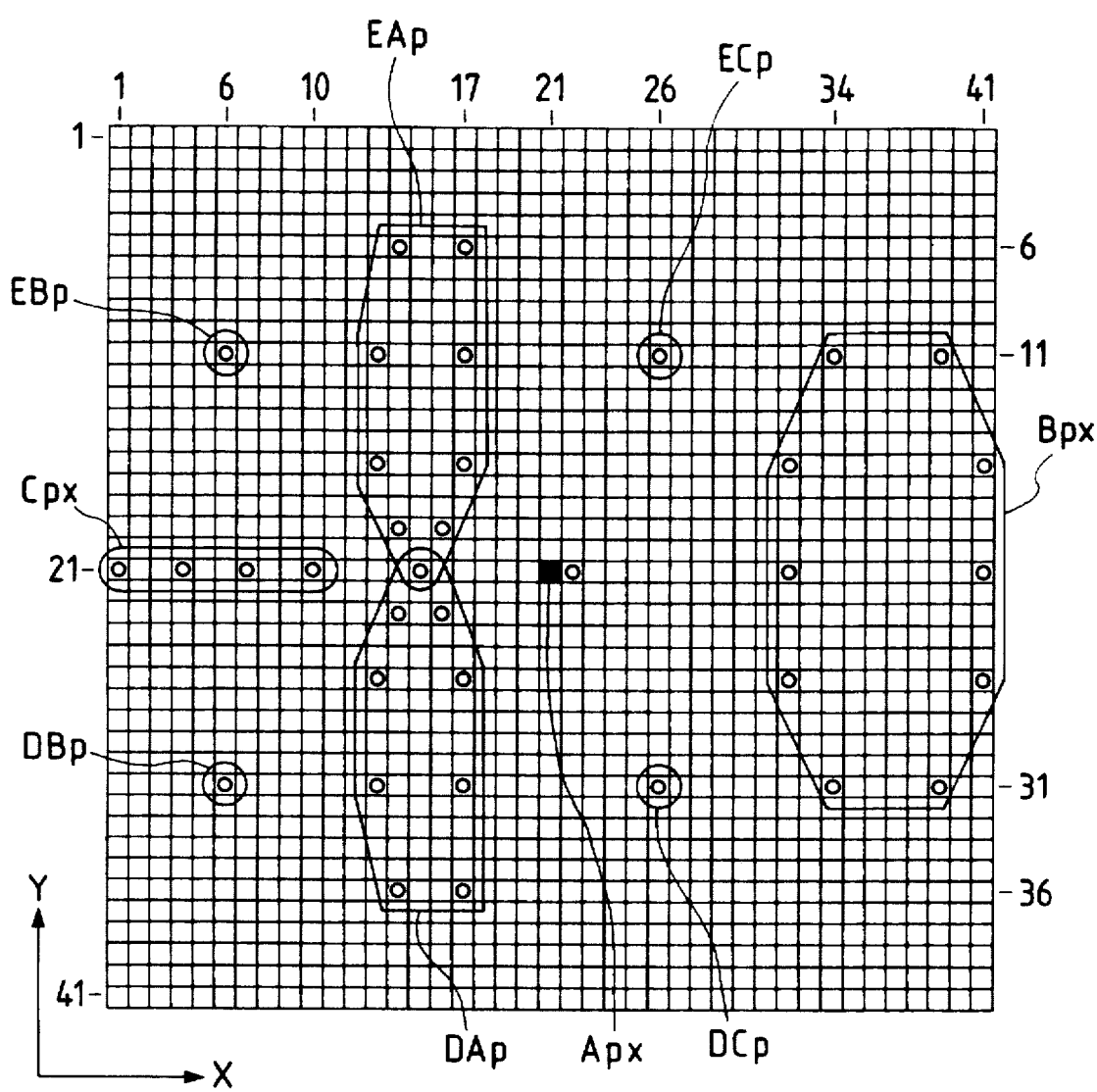
FIG. 42 is a view showing the bit arrangement of a test element set within an extraction window.
Figure 46:
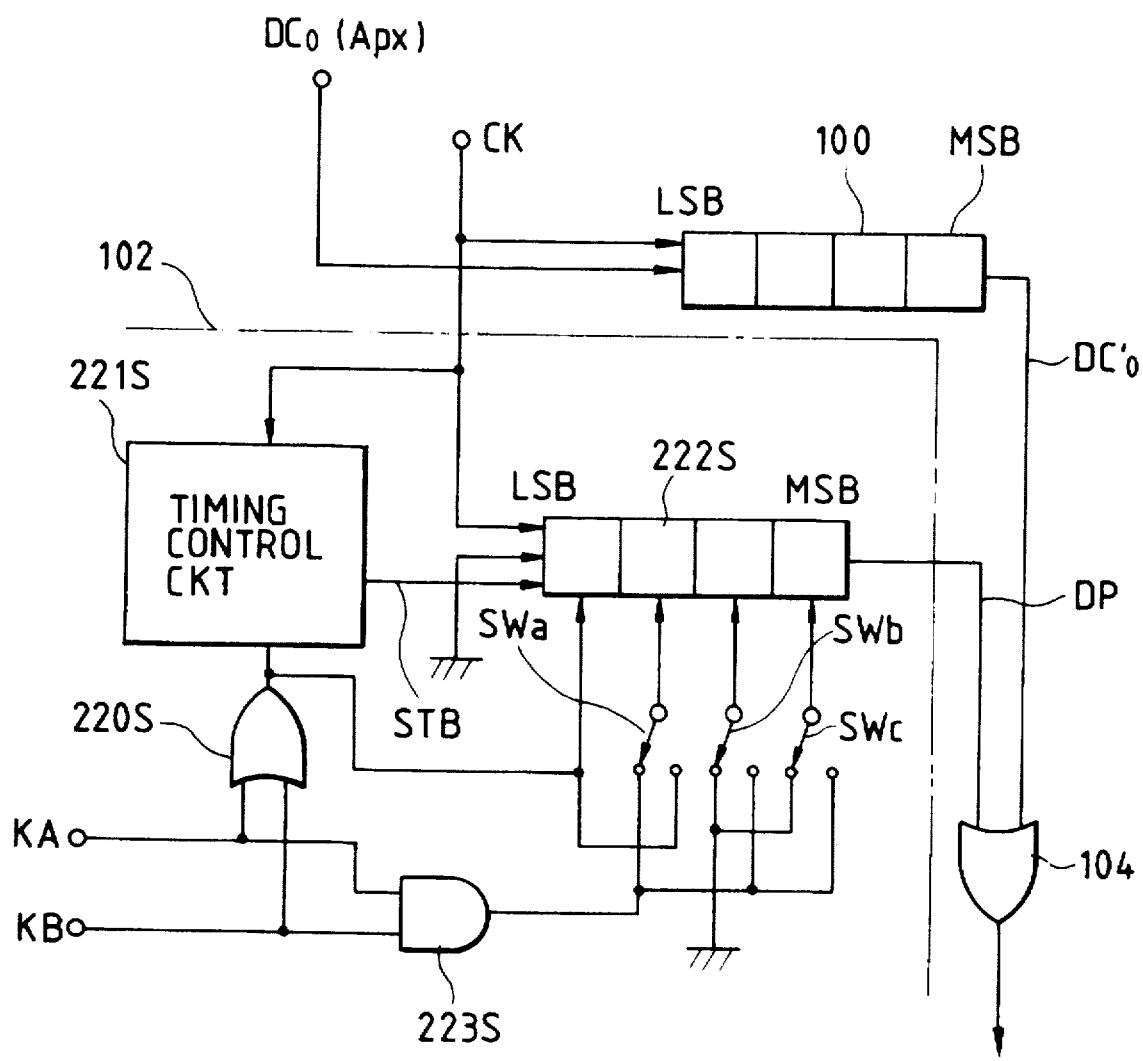
Figure 47:
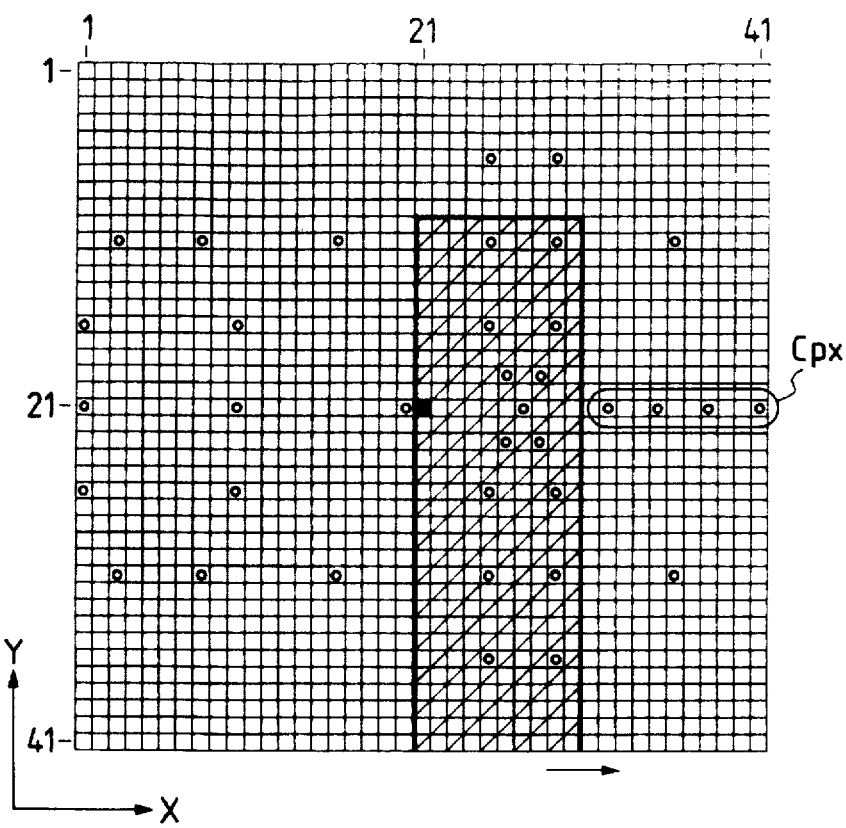
Figure 48:
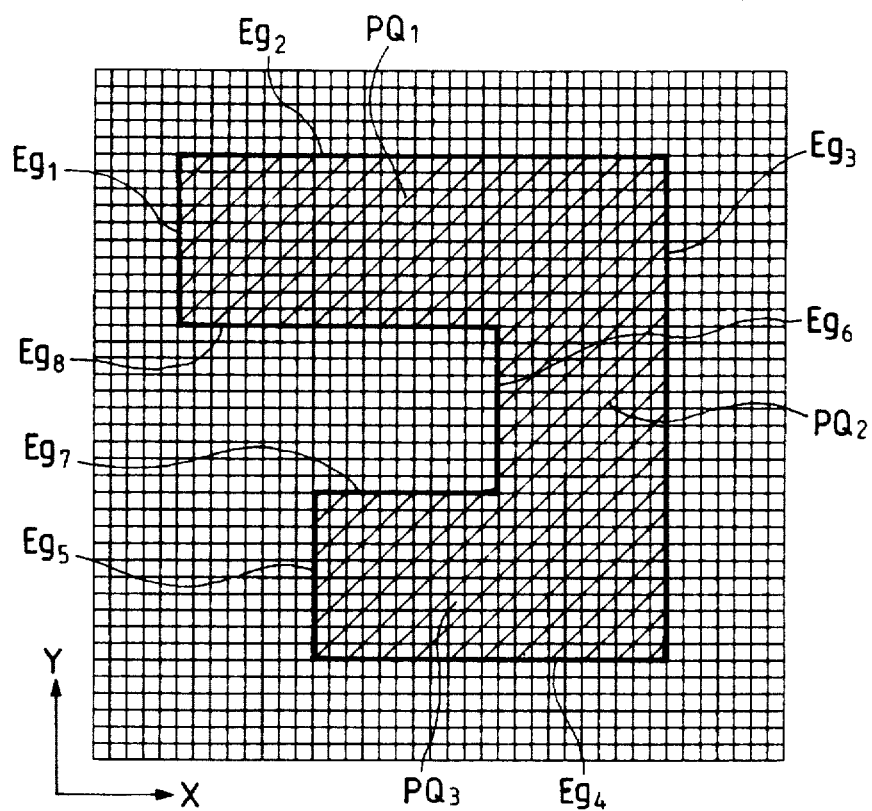
Figure 49:
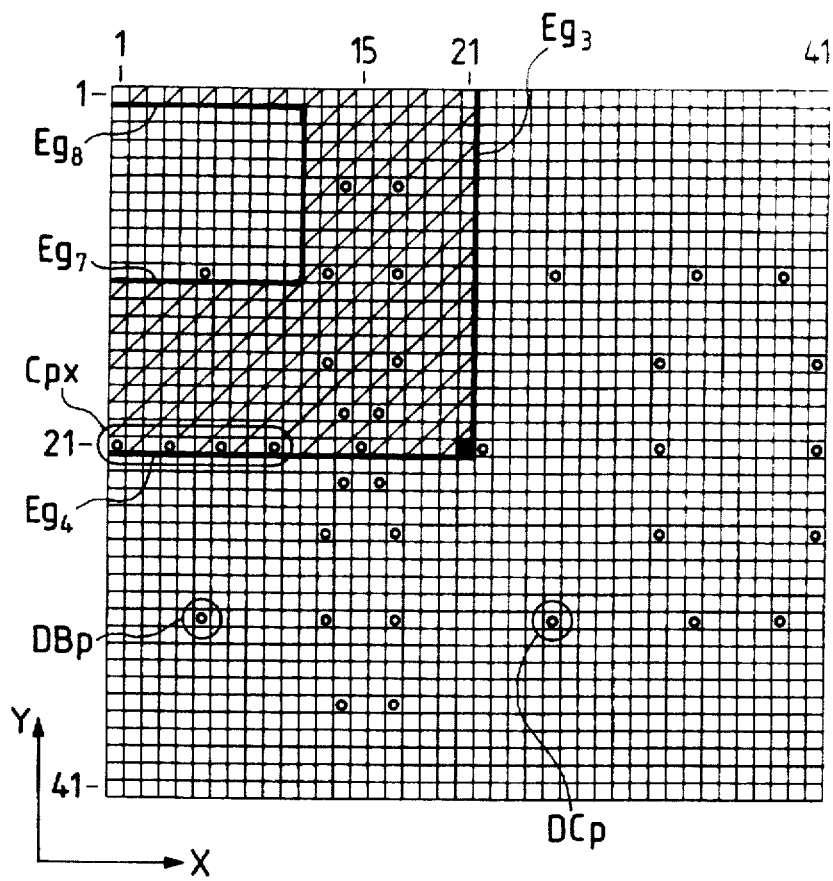
Figure 50:
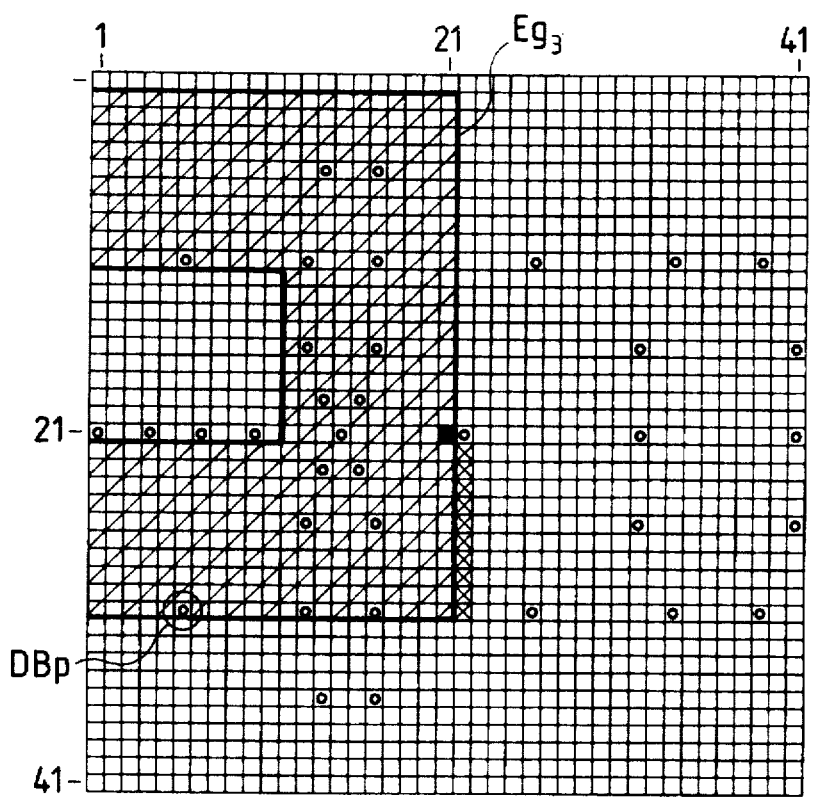
Figure 51:
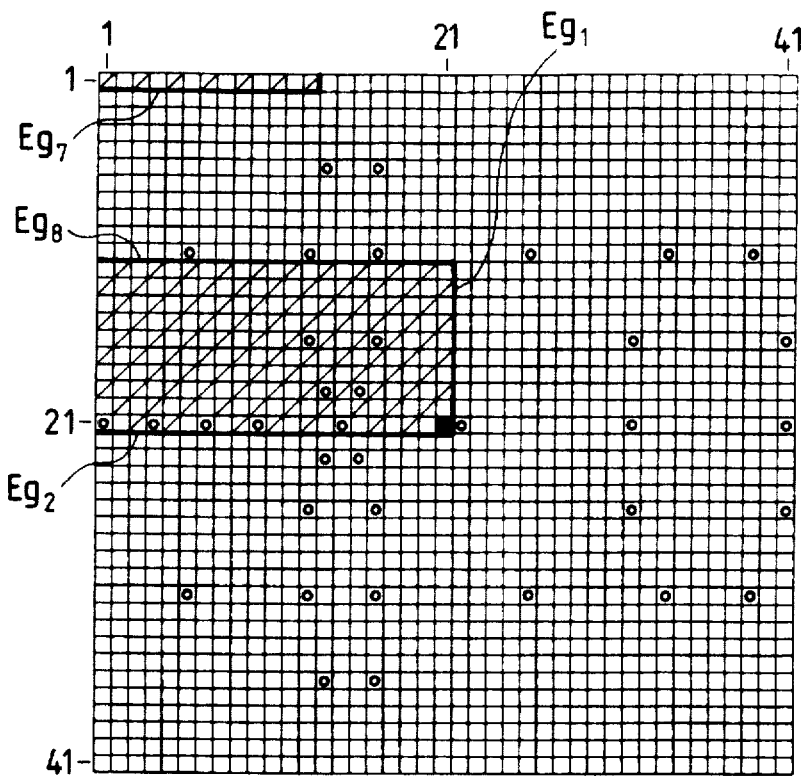
Figure 52:
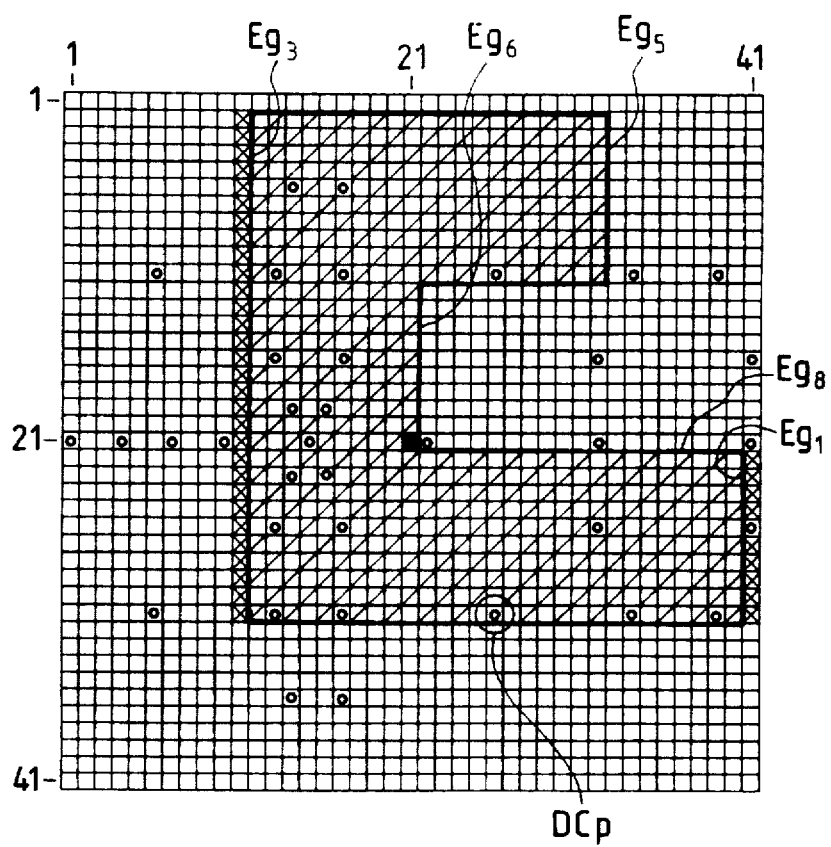
Figure 53:
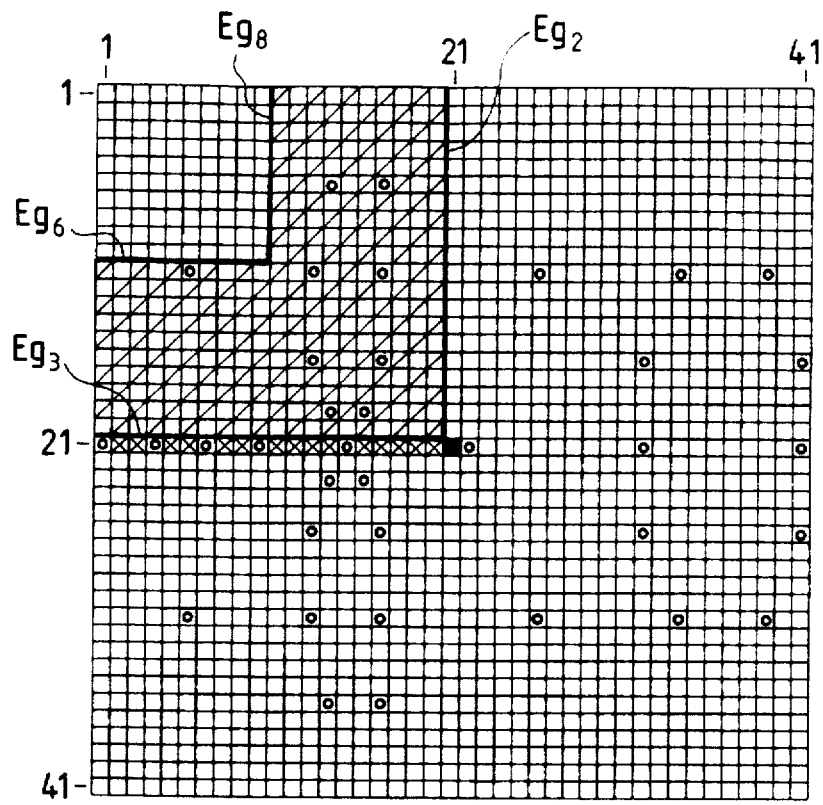
Figure 54:
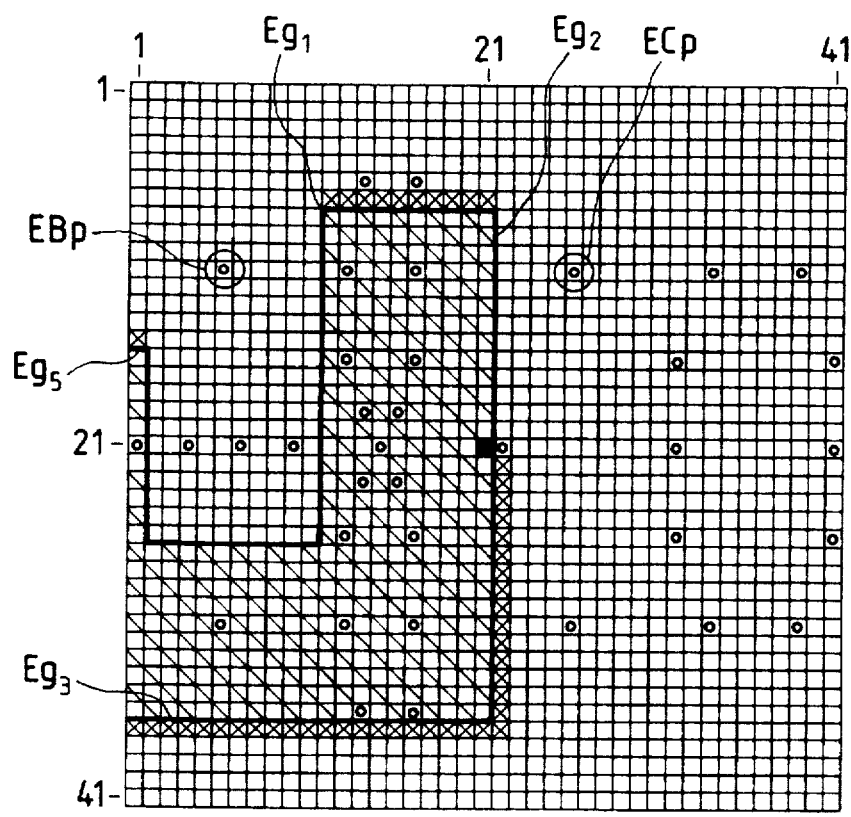
Figure 55:
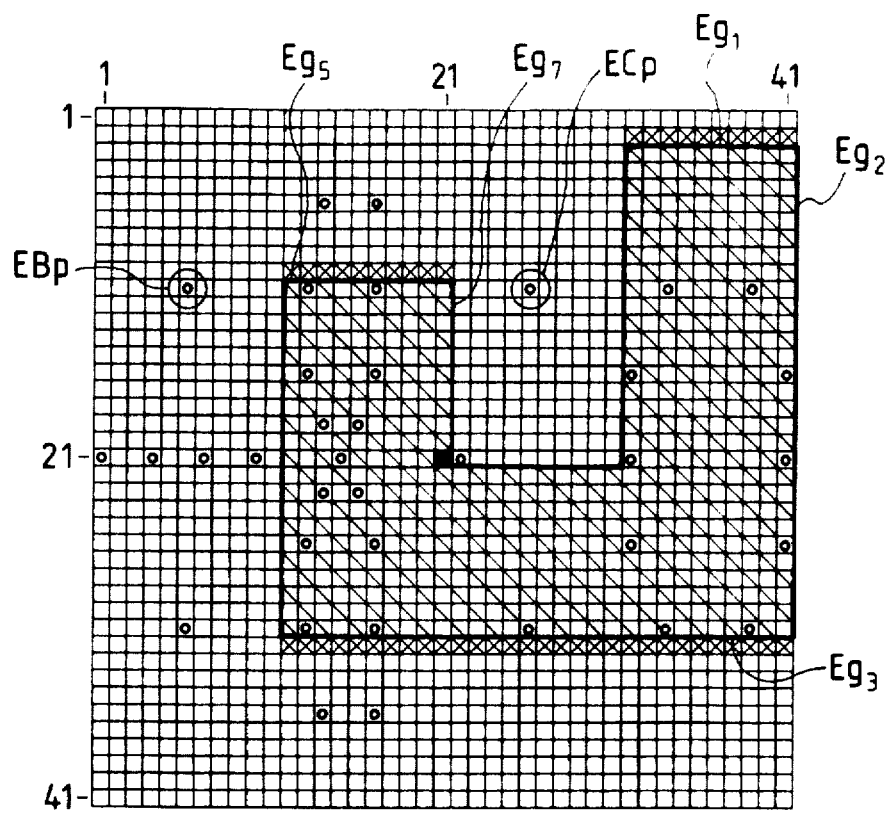
Figure 56:
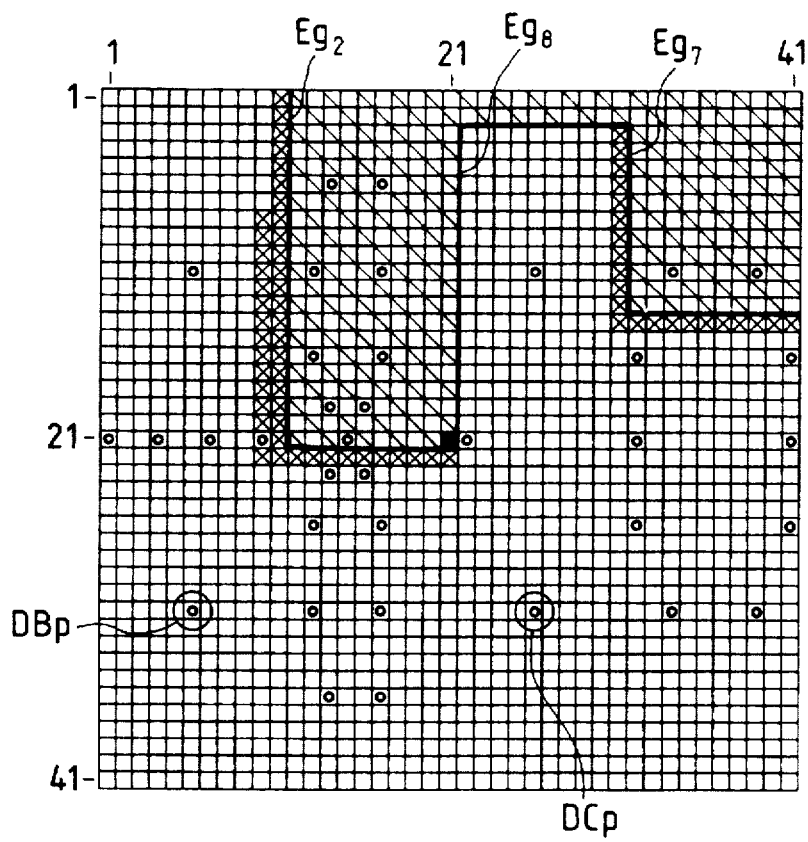
Figure 57:
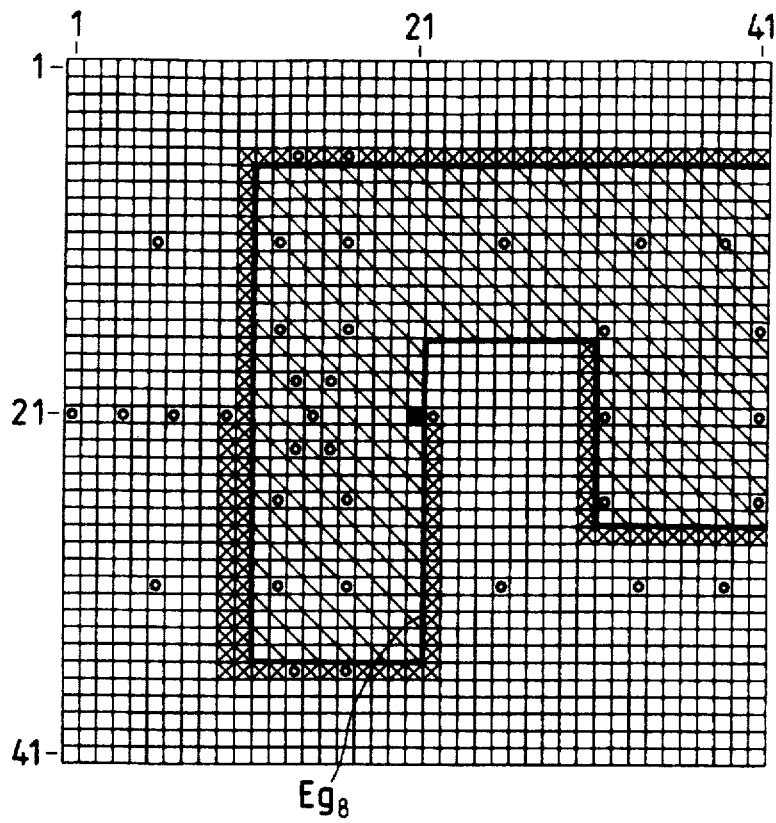
Figure 58:
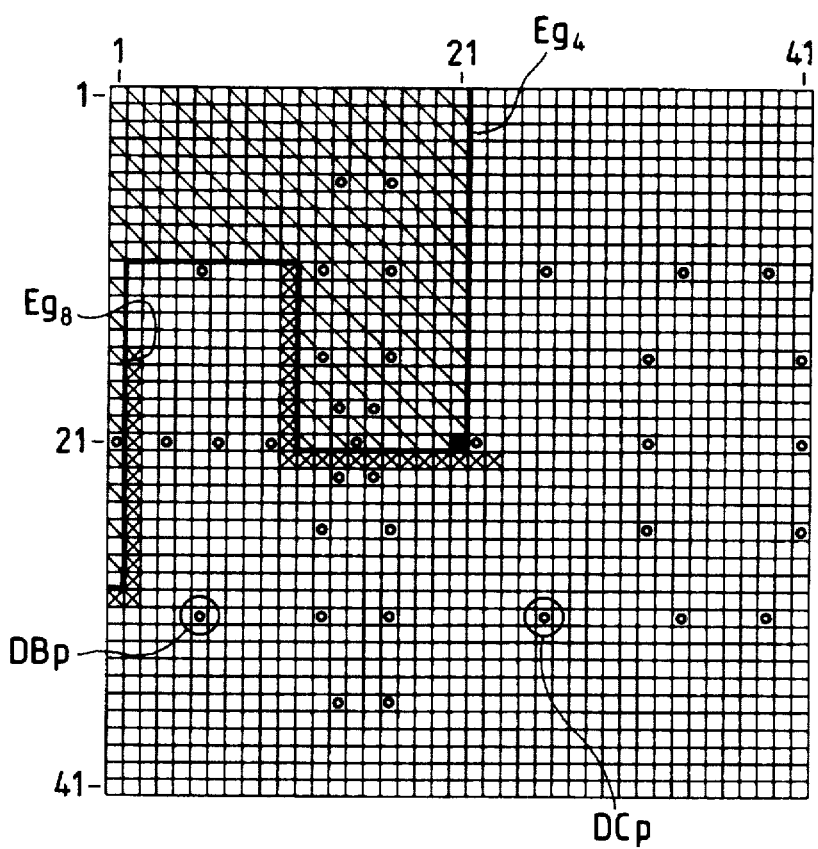
Figure 59:
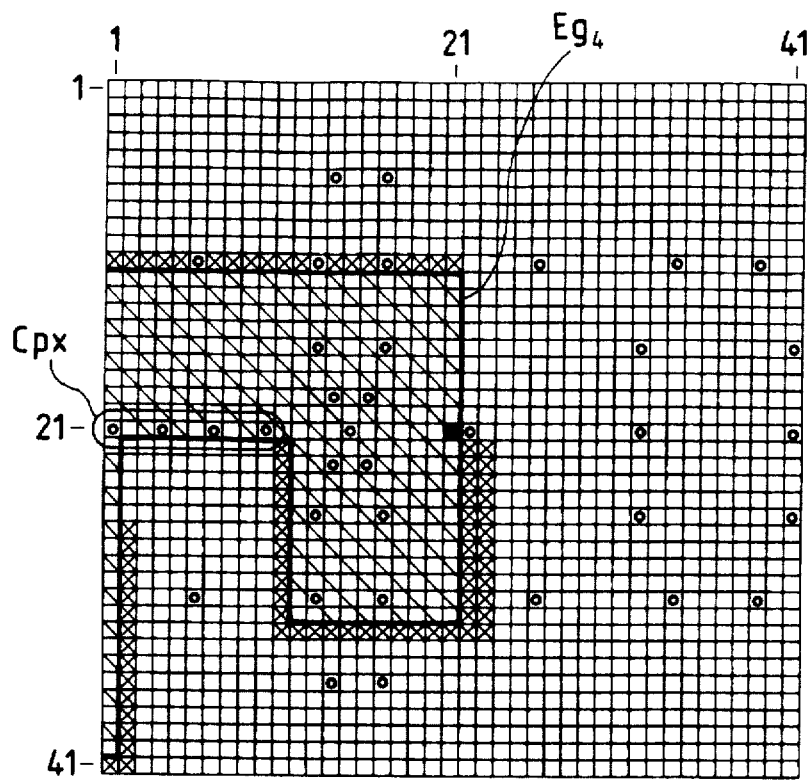
Figure 60:
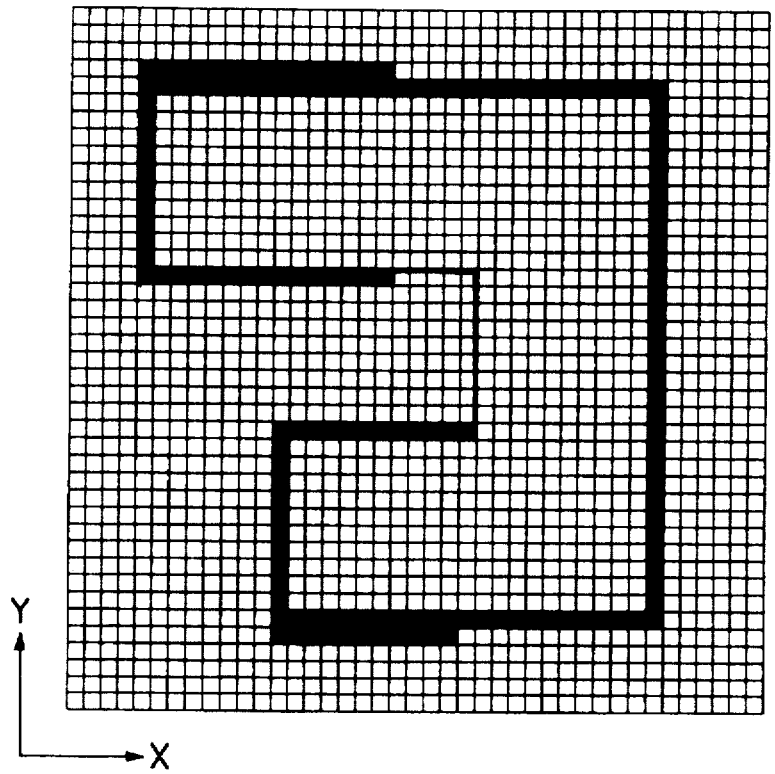
Figure 61:
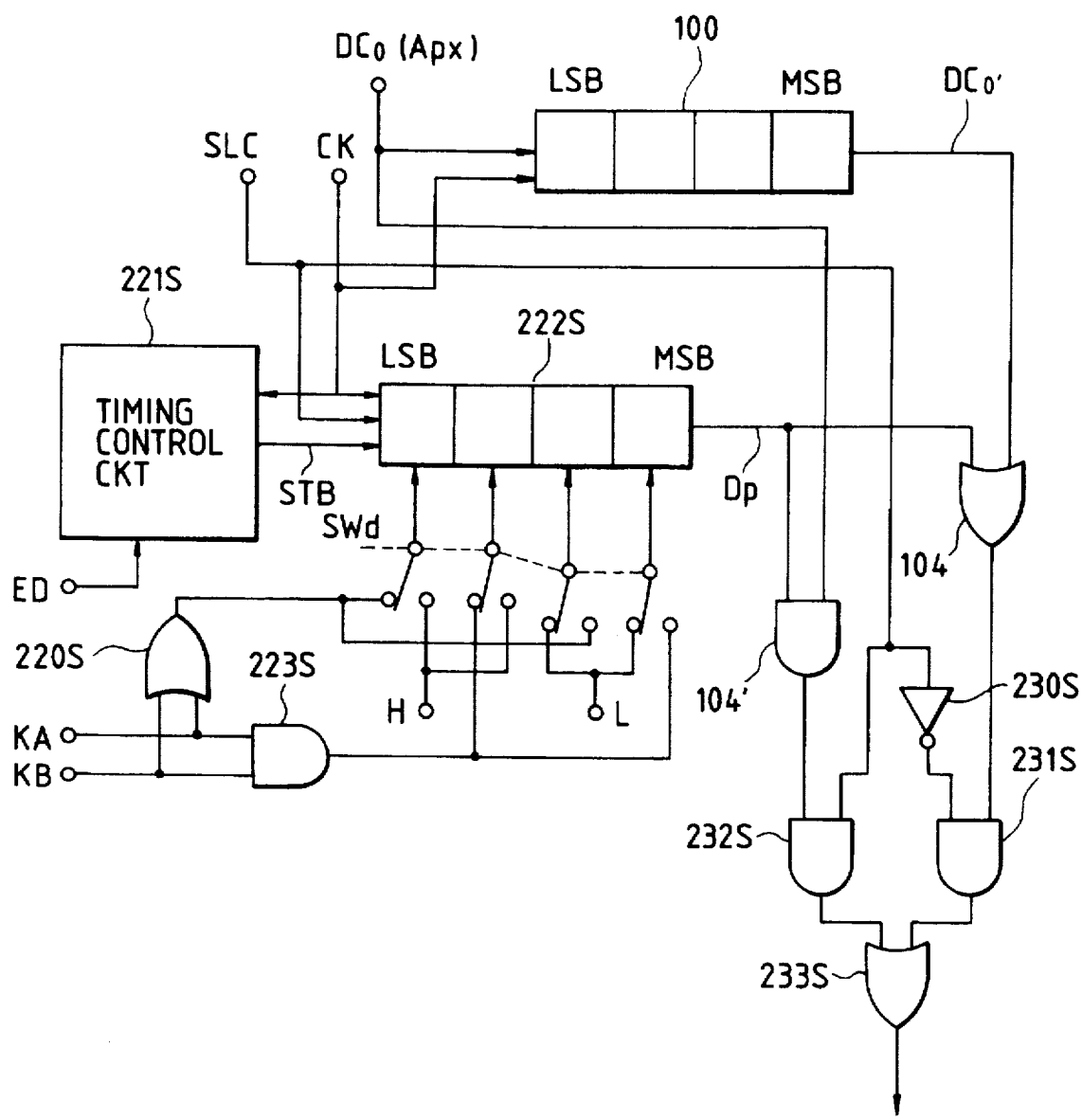
Figure 62A:
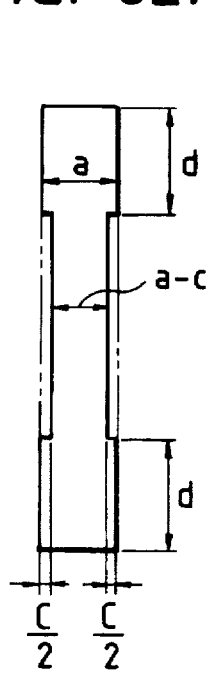
Figure 62B:
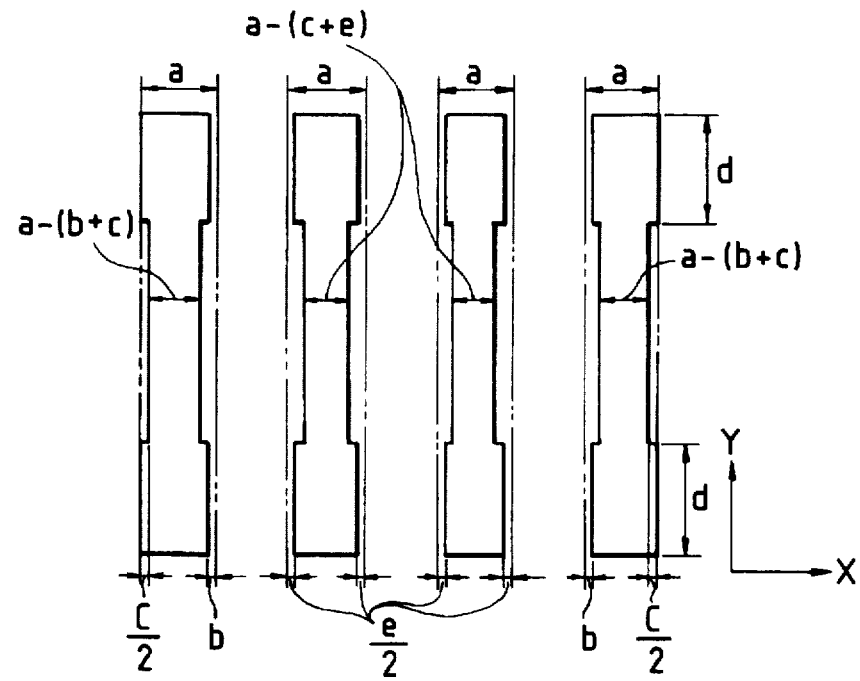
Figure 63:
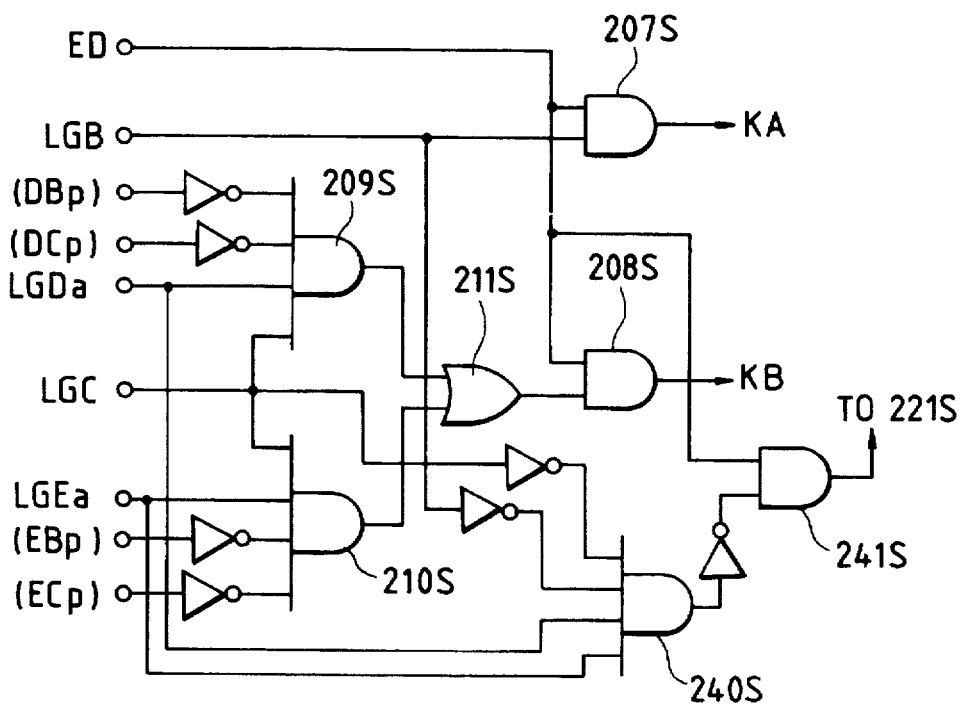
Figure 64A:
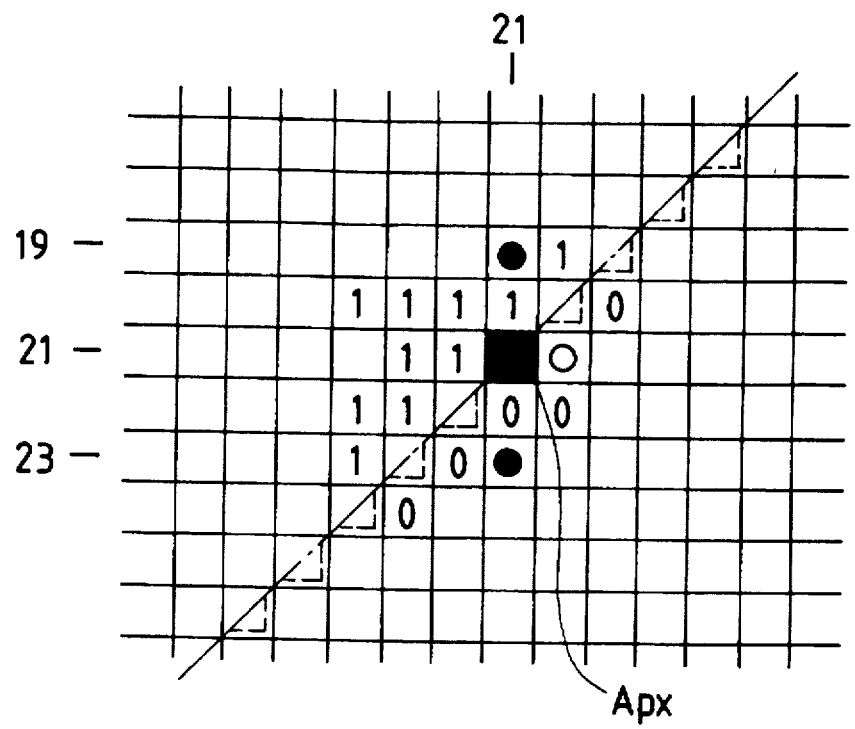
Figure 64B:
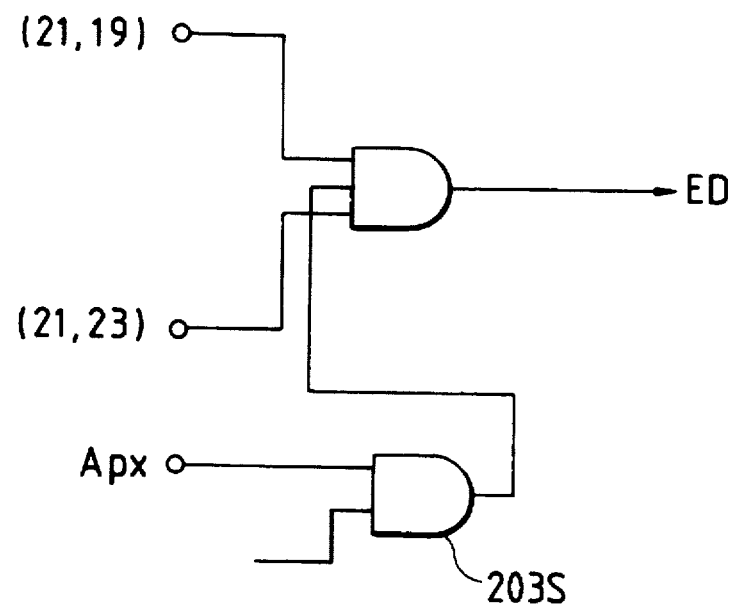

FIG. 46 is a diagram showing a circuit for adding correction bit data to design bit image data in accordance with the determination results;

FIG. 47 is a view showing the bit layout when the test element in FIG. 42 is rotated through 180°;

FIG. 48 is a view showing a design bit image pattern to be corrected;

FIG. 49 is a view showing a state of correction of an edge Eg3 of the pattern shown in FIG. 48;

FIG. 50 is a view showing another state of correction of the edge Eg3 of the pattern shown in FIG. 48;

FIG. 51 is a view showing a state of correction of an edge Eg1 of the pattern shown in FIG. 48;

FIG. 52 is a view showing a state of correction of an edge Eg6 of the pattern shown in FIG. 48;

FIG. 53 is a view showing a state of correction of an edge Eg2 of the pattern shown in FIG. 48;

FIG. 54 is a view showing another state of correction of the edge Eg2 of the pattern shown in FIG. 48;

FIG. 55 is a view showing a state of correction of an edge Eg7 of the pattern shown in FIG. 48;

FIG. 56 is a view showing a state of correction of an edge Eg8 of the pattern shown in FIG. 48;

FIG. 57 is a view showing another state of correction of the edge Eg8 of the pattern shown in FIG. 48;

FIG. 58 is a view showing a state of correction of an edge Eg4 of the pattern shown in FIG. 48;

FIG. 59 is a view showing another state of correction of the edge Eg4 of the pattern shown in FIG. 48;

FIG. 60 is a view showing the final pattern shape upon correction of the pattern shown in FIG. 48;

FIG. 61 is a block diagram showing a logic circuit added with a pattern correction algorithm according to the fourth embodiment;

FIGS. 62A and 62B are views showing pattern shapes obtained by pattern correction operations according to the fourth embodiment;

FIG. 63 is a block diagram showing a logic circuit for realizing a pattern correction algorithm according to the fifth embodiment;

FIGS. 64A and 64B are a view showing a state of pattern correction according to the sixth embodiment and a diagram of a logic circuit corresponding to this pattern correction, respectively; and FIGS. 65A, 65B, 65C, 66A, and 66B show states of pattern correction;

DESCRIPTION OF THE PREFERRED EMBODIMENTS

EMBODIMENT 1

Correction of reticle patterns mainly used in a phase shift method will be described below.

In this embodiment, determination of whether some of reticle patterns are corrected is made by adjacent pattern information.

If a pattern which satisfies a specific determination condition is present around a given pattern, the given pattern is determined as a periodic pattern, and its line width is not corrected. On the other hand, if any pattern which satisfies the specific determination condition is not present, the given pattern is determined as an isolated pattern, and its line width is corrected to be increased.

(1) Description of Principle of Correction Algorithm

Figure 3A:
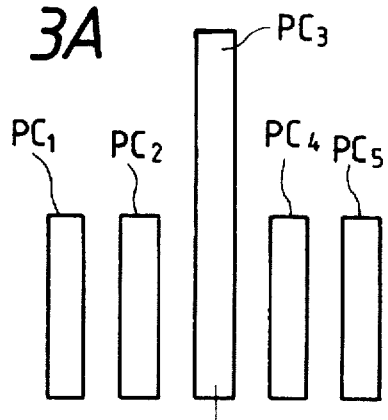
FIGS. 3A and 3B are views showing a state of a resist pattern when a design reticle pattern is exposed by a phase shift method.
Figure 3B:
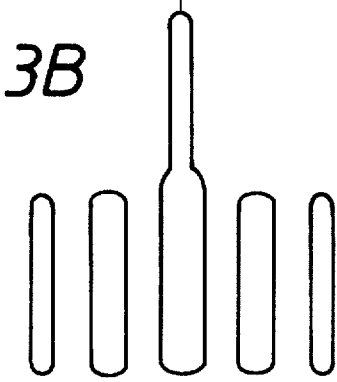

FIGS. 3A and 3B show a pattern shape used in a conventional phase shift method. More specifically, FIG. 3A shows a pattern shape based on design values on a reticle. This pattern shape consists of five lines and four spaces. In this case, five line portions (closed area) $PC_1$, $PC_2$, $PC_3$, $PC_4$, and $PC_5$ are transparent portions for exposure light, and the surrounding portion (background) serves as a light-shielding portion. The relationship between the transparent and light-shielding portions may be reversed to obtain the same effect.

Referring to FIG. 3A, of all the five line portions, the central line portion $PC_3$ has a length twice that of any other line portions. For this reason, part of the line portion $PC_3$ serves as an isolated portion having no periodic correlation with other line portions. The end line portions $PC_1$ and $PC_5$ may be regarded as partially isolated portions because the line portions $PC_2$ and $PC_4$ are located adjacent to the end portion portions $PC_1$ and $PC_5$ on only one side along the periodic direction. Note that the line width in FIG. 3A is defined as a value close to the resolving limit of the projection exposure apparatus.

The reticle pattern in the phase shift method is projected and exposed on a photosensitive substrate in a projection exposure apparatus having an illumination optical system having a σ value of about 0.2 to about 0.3. When the exposed substrate is developed, resist images shown in FIG. 3B are obtained. In the resist image corresponding to the central line portion $PC_3$, the width of the isolated portion as the distal end portion of the resist image is smaller than the design value, and at the same time the width of each of the resist images corresponding to the end line portions $PC_1$ and $PC_5$ is also smaller than the design value.

Figure 4A:
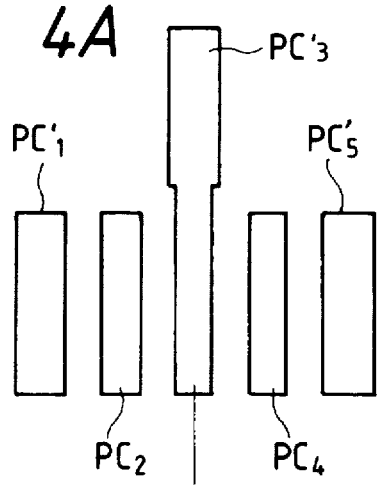
FIGS. 4A and 4B are views showing a state of a resist pattern when a corrected reticle pattern is exposed by a phase shift method.
Figure 4B:
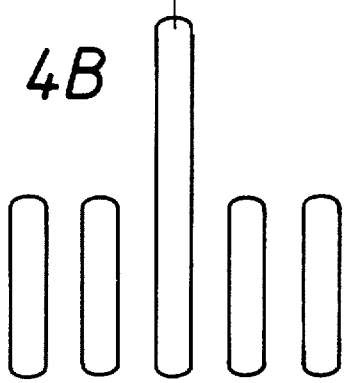

The pattern line widths of some of the line portions in the design reticle pattern shown in FIG. 3A are corrected so that the shapes and sizes of the final resist images are set to coincide with those of the design line portions, as shown in FIG. 4B. Referring to FIG. 4A, the line width of only the isolated portion (having no periodicity) of the central line portion $PC_3$, is increased by a predetermined amount, as indicated by a line portion $PC_3'$. The line widths of the two end portions $PC_1$ and $PC_5$ are entirely increased, as indicated by line portions $PC_1'$ and $PC_5'$ in FIG. 4A. Note that only the edge of each of the line portions $PC_1$ and $PC_5$, which corresponds to the absence of a corresponding one of the adjacent line portions $PC_2$ and $PC_4$, is thickened. No correction is made on the line portions $PC_2$ and $PC_4$.

(2) Determination Logic of Pattern to be Corrected

Figure 5:
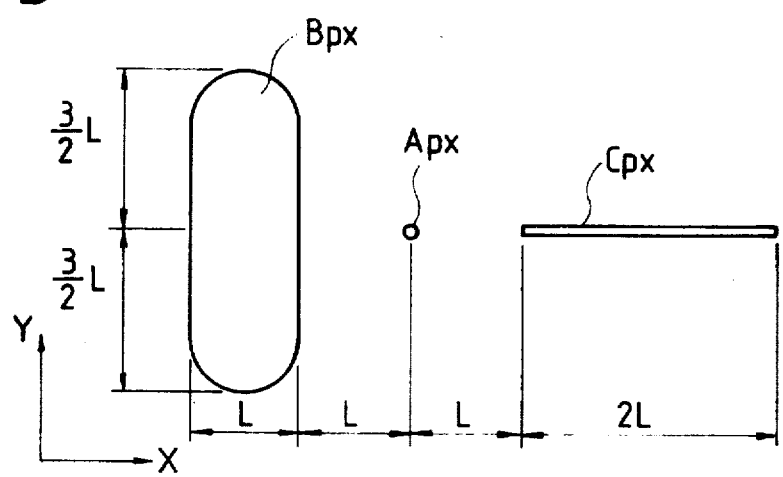
FIG. 5 is a view showing the shape of a test element (template) for pattern correction.

A test element shown in FIG. 5 is prepared to automatically perform such pattern correction. This test element is a kind of template to be used to scan, e.g., a binary bit image of the design pattern shown in FIG. 3A to determine whether a target pattern edge is corrected. Referring to FIG. 5, a pixel point $A_{px}$ is a point on a target reticle pattern, and a linear region $C_{px}$ and a wing-like (e.g., a rectangular or elliptical shape) region $B_{px}$ serve as test element portions for determining whether the pattern portion of the point $A_{px}$ is corrected.

The wing-like test element portion $B_{px}$ is located spaced apart from the target point $A_{px}$ by a distance L in the −X direction, and has a width corresponding to a distance L in the X direction and a length of 3L. The linear test element portion $C_{px}$ is spaced apart from the target point $A_{px}$ by the distance L in the +X direction and has a length of 2L in the X direction. Note that the center of the wing-like test element portion $B_{px}$ in the Y direction coincides with the Y-coordinates of the target point $A_{px}$ and the linear test element portion $C_{px}$. When a pattern edge extending in the Y direction is located at the target point $A_{px}$, these test element portions $B_{px}$ and $C_{px}$ are used to detect whether inverted portions (boundaries between logic values "0" and "1") of bit images of different pattern edges are included in the test element portions $B_{px}$ and $C_{px}$. For this reason, the test element portions $B_{px}$ and $C_{px}$ do not check all pixels (bits) within the corresponding regions, but may check only selected discrete points within the corresponding regions. The value of the distance L shown in FIG. 5 is defined as the value (i.e., the value on the reticle side) of about the resolving limit of the projection optical system of the projection exposure apparatus. When the phase shift method is used, the value of the distance L is defined as the value of the resolving limit on the reticle, which is obtained by the phase shift method.

The template as the test element shown in FIG. 5 scans a two-dimensional bit image of a pattern in the +X direction, i.e., in a direction to start scanning the image with the linear test element portion $C_{px}$ as a leading portion. In practice, however, since it is difficult to scan the template on the bit image, the bit image is scanned every pixel in units of lines in the X direction. Every time line scan of the bit image is completed, the bit image is shifted by one pixel in the Y direction, and scan is then started in the X direction again. By repeating the above scan operations, the bit line image can be scanned.

(3) Basic Operation of Determination Logic

The principle of the pattern correction determination algorithm using the test element template shown in FIG. 5 will be described with reference to FIGS. 6A to 6F. The patterns shown in FIGS. 6A, 6B, 6C, 6D, 6E, and 6F are the same as that shown in FIG. 3A, and the widths of the line and space portions are substantially the resolving limit.

Figure 6A:
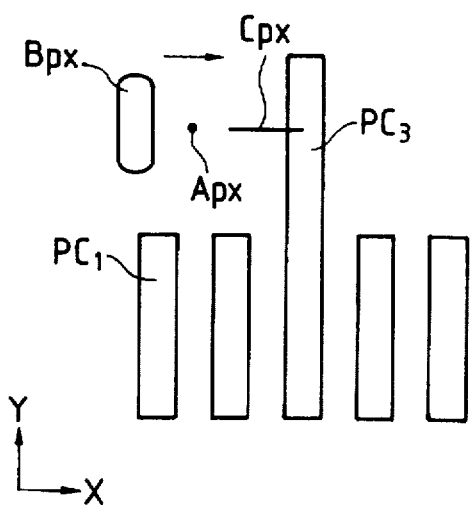
FIGS. 6A, 6B, 6C, 6D, 6E, and 6F are views for explaining the principle of correction for the same reticle pattern shown in FIG. 3A and 3B.

FIG. 6A shows a state in which the target point $A_{px}$ is located at a background position in a two-dimensional bit image data. The target point $A_{px}$, and the test element portions $B_{px}$ and $C_{px}$ are relatively scanned in the +X direction (right direction), as indicated by an arrow. Since the target point $A_{px}$ is located in the background, no correction is performed.

Figure 6B:
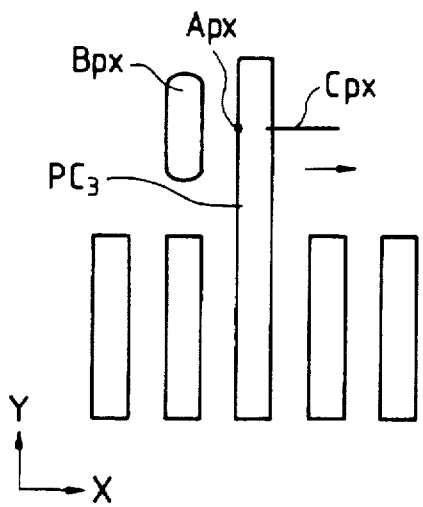

FIG. 6B shows a state in which the target point $A_{px}$ is changed from the background to the line portion $PC_3$ of the pattern during the scan. When the target point $A_{px}$ is moved from the background to the pattern portion, as described above, i.e., when the bit data of the target point $A_{px}$ is changed from logic value "0" to logic value "1" in the bit image data, all data of the test bits set in the wing-like test element portion $B_{px}$ are checked first. If all the data within the test element portion $B_{px}$ are set at logic "0" (background), the edge position at the target point $A_{px}$ is tentatively determined as an isolated edge position. Upon determination of the test element portion $B_{px}$, when the position of the target point $A_{px}$ is tentatively determined as an isolated position, all data in the linear test element portion $C_{px}$ are checked. At this time, unless all the data within the test element portion $C_{px}$ are set at logic "1" (pattern), the edge portion of the target point $A_{px}$ is finally determined to be an isolated edge portion.

Judging from the above operations, if all the bit data within the wing-like test element portion $B_{px}$ are set at logic "0" and some of the data within the linear test element portion $C_{px}$ are set at logic "0", the edge portion of the target point $A_{px}$ is determined as an isolated edge portion. As a result, the edge at the target point $A_{px}$ is determined as an isolated pattern in FIG. 6B. When the edge at the target point $A_{px}$ is determined as an isolated edge, the pattern area of the edge is expanded in a direction opposite to the scan direction. That is, logic "0" is inverted into logic "1". At this time, the pattern expansion width is determined to be about 5 to 10% of the resolving limit L.

Figure 6C:
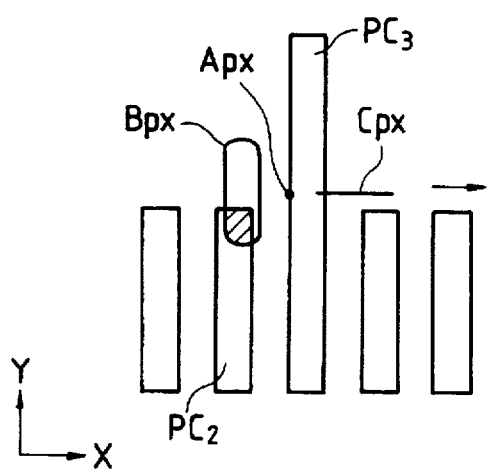

FIG. 6C shows a state in which the target point $A_{px}$ coincides with an edge portion changed to logic "1" (pattern) in the line portion $PC_3$ of the bit image data. As indicated by a hatched portion, since the test element portion $B_{px}$ includes part of the line portion $PC_2$, the edge position at the target point $A_{px}$ is not determined as an isolated pattern. Therefore, the pattern size is not changed at this edge portion.

Figure 6D:
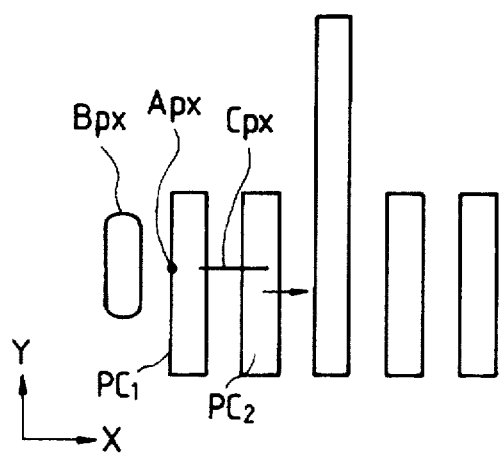

Referring to FIG. 6D, the target point $A_{px}$ is located at the left edge of the left line portion $PC_1$. At this time, all data within the test element portion $B_{px}$ are set at logic "0" (background), and data within the test element portion $C_{px}$ are set at logic "0" and logic "1" in a mixed manner. The edge portion at the target point $A_{px}$ is determined as an isolated point, and the pattern shape is changed.

Figure 6E:
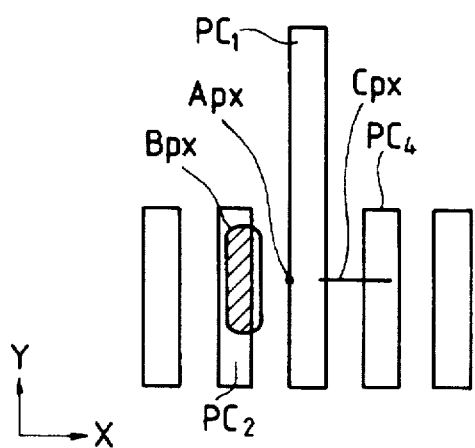

Referring to FIG. 6E, since part (logic "1") of the line portion $PC_2$ is included in the test element portion $B_{px}$, the left edge portion of the line portion $PC_1$ at which the target point $A_{px}$ is located is not determined as an isolated pattern.

As described above, the target point $A_{px}$ has been scanned in the +X direction using various Y-coordinates. Pattern correction is determined only when the bit image data is changed from logic "0" to logic "1" during the scan of the target point $A_{px}$ in the +X direction.

Figure 6F:
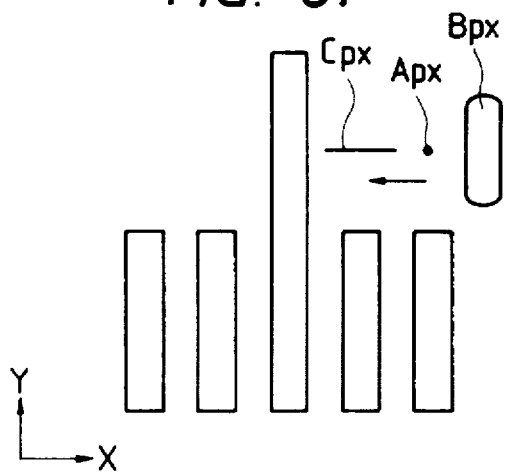

In this case, the reticle pattern (data) is thickened in only the −X direction (i.e., in a direction opposite to the scan direction), and the central position of the reticle pattern is changed. As shown in FIG. 6F, the positional relationship between the target point $A_{px}$ and the test element portions $B_{px}$ and $C_{px}$ is changed to also perform scan in the −X direction.

FIG. 6F shows scan in the −X direction. The test element portions $B_{px}$ and $C_{px}$ are rotated about the target point $A_{px}$ through 180° as compared with the positional relationship in each of FIGS. 6A to 6E.

When scan in the −X direction is performed, as shown in FIG. 6F, immediately after the scan in the +X direction is performed, as shown in FIGS. 6A to 6E, the left edge in the pattern data is corrected during the scan in the +X direction. For this reason, when the corrected data is scanned in the −X direction again, as shown in FIG. 6F, determination is made for data different from the original design data. Therefore, the pattern supposed to be symmetrical about the design center in the X direction may become a pattern asymmetrical about the design center by correction.

In order to prevent this, memory devices for storing original data (initial design data) and corrected data may be provided. At this time, the corrected data memory also stores the copied initial data. The target point $A_{px}$ is scanned using the initial data in both the +X and −X directions, while correction (addition of bit data) is performed in the corrected data memory.

With the above arrangement, correction can be performed using the same data (initial data) in both the scan operations in the +X and −X directions.

When pattern correction is performed using the above means, the pattern in FIG. 3A can be corrected, as shown in FIG. 4A.

In the above description, the scan directions of the target points $A_{px}$ are given as the ±X directions. However, the scan directions may be ±Y directions or arbitrary directions.

Since normal reticle patterns include most of edges extending in the X and Y directions, scan of the target point $A_{px}$ is preferably performed in four directions, i.e., the ±X and ±Y directions.

The positional relationship between the target point $A_{px}$ and the test element portions $B_{px}$ and $C_{px}$ is a rotational relationship in which the test element portion $C_{px}$ is moved ahead of the target point $A_{px}$ in each scan direction.

In four direction scan, data to be scanned is always initial data, and corrected data is preferably stored in a corrected data memory.

Figure 7A:
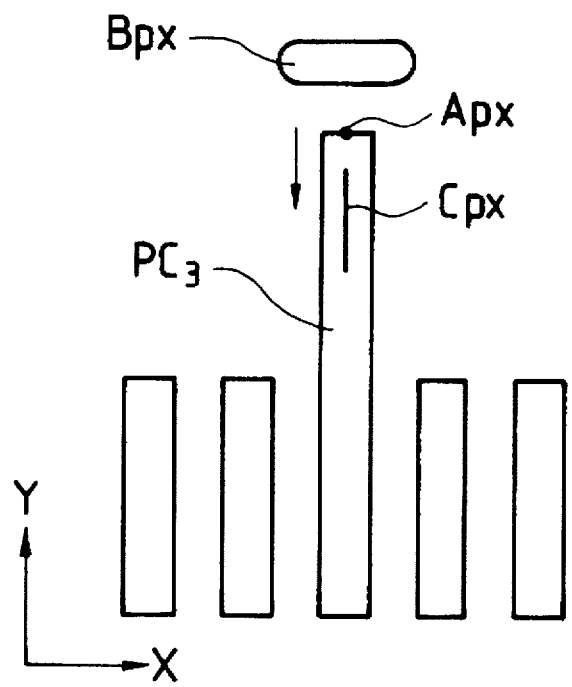
FIGS. 7A and 7B are views for explaining the principle of correction for a reticle pattern.
Figure 7B:
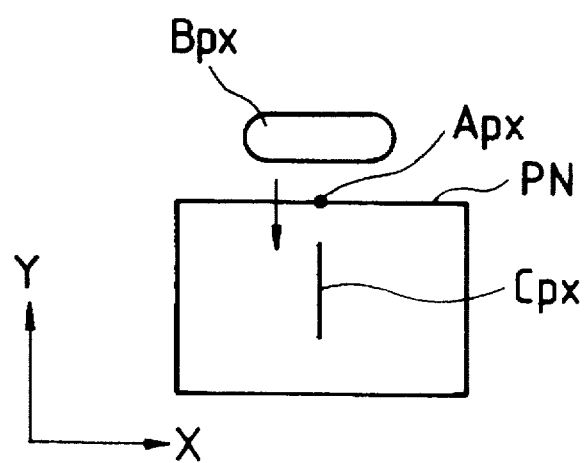

The function of the linear test element portion $C_{px}$ will be further described with reference to FIGS. 7A and 7B. FIG. 7A shows a state in which the test element template is scanned on the same pattern as in FIG. 3A in the −Y direction. In this state, the target $A_{px}$ coincides with the edge of an end portion of the central line portion $PC_3$. As described with reference to FIG. 3, when the phase shift method is used, the line width of the line pattern is changed in accordance with whether the target line is isolated from adjacent patterns. In this case, the length of the pattern is rarely changed. For this reason, when the target point $A_{px}$ is located at an end portion of the pattern in a longitudinal direction, as shown in FIG. 7A, the edge portion at the target point $A_{px}$ is not corrected. More generally, when the target point $A_{px}$ is located at an edge position, and all the test bits within the linear test element portion $C_{px}$ are set at logic "1", a large pattern PN extends on the test element portion $C_{px}$ side when viewed from the target bit $A_{px}$, see in FIG. 7B. In this manner, when any edge is present within the distance of 3L from the target point $A_{px}$ in the scan direction and all data within the test element portion $C_{px}$ are set at logic "1", the linear test element portion $C_{px}$ inhibits correction of the edge portion where the target point $A_{px}$ is located. If the pattern edge shown in FIG. 7A is not preferable, the test using the linear test element portion $C_{px}$ is not performed, but the determination is performed using only the wing-like test element portion $B_{px}$, thereby performing correction.

(4) Overall Arrangement of Reticle (Mask) Manufacturing System

Figure 8:
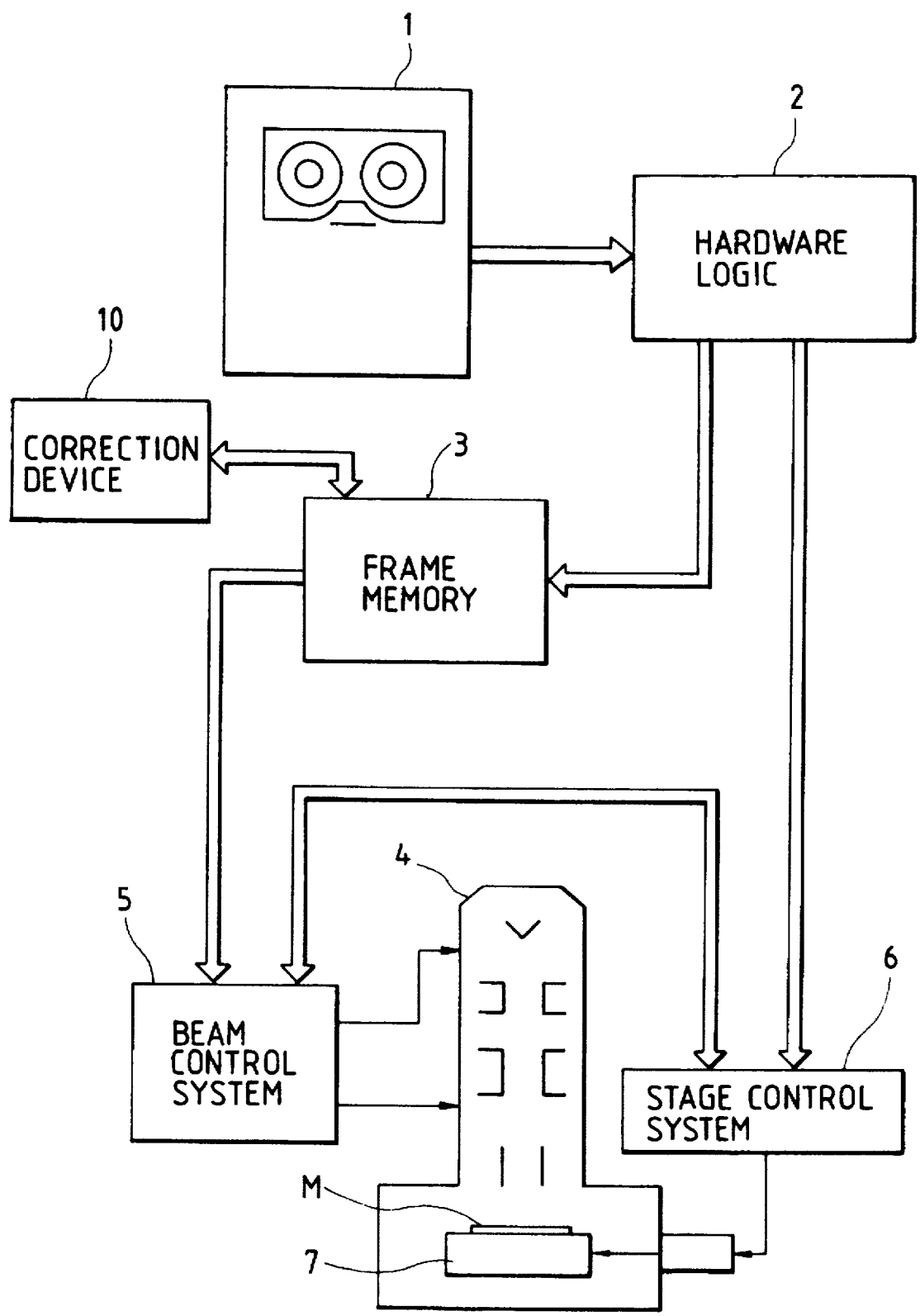
FIG. 8 is a block diagram showing an overall arrangement of a mask manufacturing system.

FIG. 8 is a block diagram illustrating a mask (reticle) manufacturing system according to this embodiment of the present invention. A mask used in a reduction projection exposure apparatus (e.g., a stepper) is generally called a reticle. A pattern enlarged by a reciprocal multiple of a reduction factor is formed on the reticle. In the manufacture of the reticle, CAD information (design data) of a pattern to be formed is read out from a magnetic tape by a tape reader (MTR) 1. The readout information is converted into a binary image by a bit image development hardware logic (developing means) 2. The bit image information is stored in a frame memory 3. In this case, the image of the entire surface of the reticle is not converted at once but is converted in units of local regions (e.g., every 5-mm² area). The size of this local region corresponds to the size of a substrate M which can exposed by one exposure cycle upon beam scan of an electron beam (EB) exposure device 4. When exposure of one local region is completed, a stage 7 for holding the photosensitive substrate M is precisely fed by a predetermined amount by a stage control system 6 so that the adjacent local region enters into the exposure area. At the same time, the frame memory 3 stores a bit image corresponding to the pattern of the adjacent local region.

A beam control system 5 switches an electron beam spot to illuminate a predetermined point (pixel) on the substrate M at high speed in accordance with bit image data from the frame memory 3 during beam scan. Pattern depiction on the substrate M with an electron beam can be performed in accordance with one of several practical schemes such as raster scan, vector scan, and scan with a variable rectangular beam. In any scheme, CAD information of a pattern is developed as a bit image in the frame memory 3. In this embodiment, a correction device (hardware and software) 10 is added to perform desired correction of the bit image developed in the frame memory 3.

Figure 9:
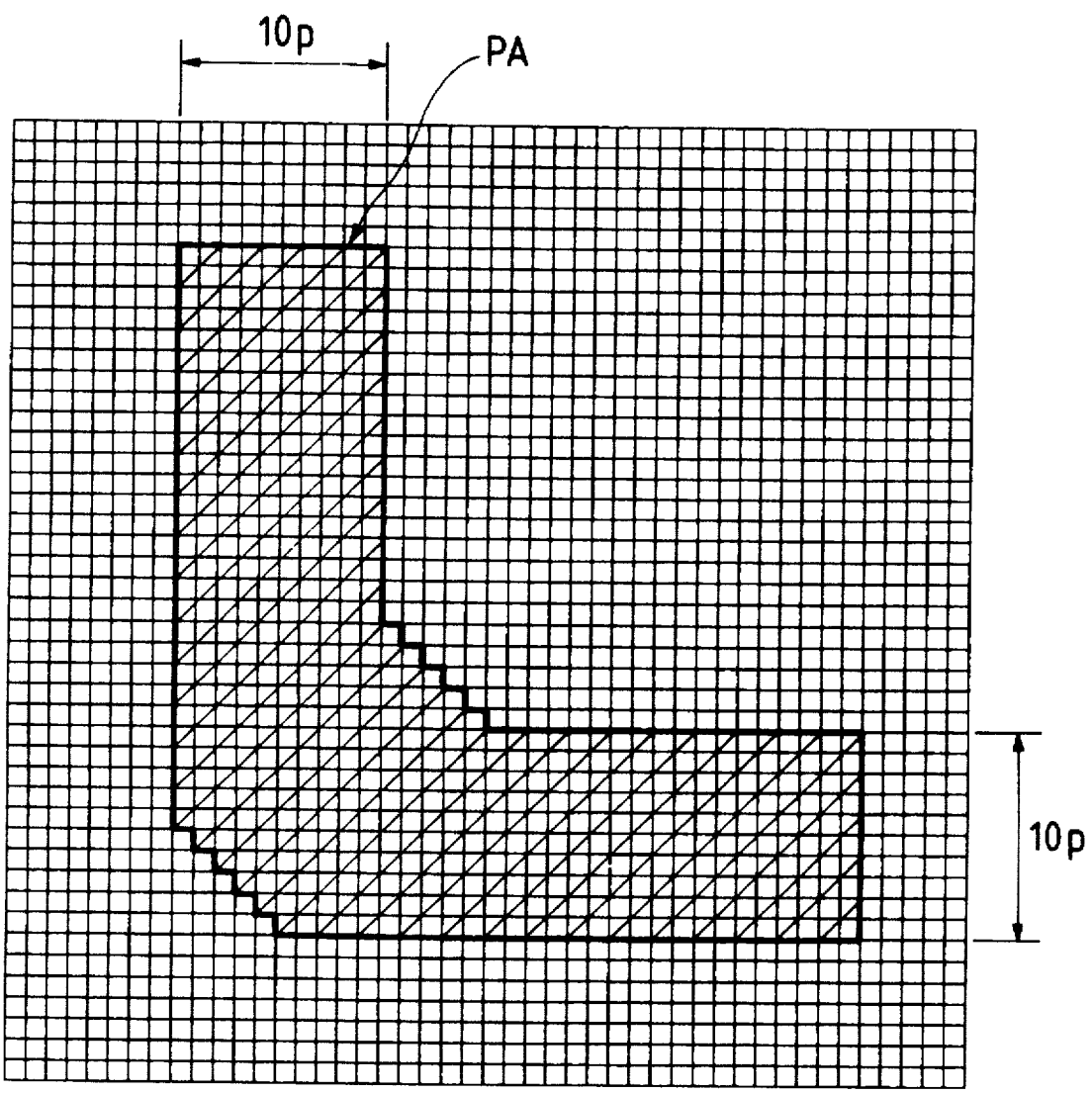
FIG. 9 is a view showing a pattern developed into a bit image.

FIG. 9 shows a bit image of a pattern (chevron) developed in the frame memory 3. Each square in FIG. 9 represents one pixel (one bit). For example, 50,000×50,000 pixels are prepared for one field. When each exposure area of the EB exposure device 4 is defined as 5 mm², one pixel in the frame memory 3 corresponds to an area of 0.2 μm² on the substrate M. When this substrate M is mounted as a reticle on a ⅕ reduction stepper, one pixel corresponds to 0.04 μm² on the wafer. This corresponds to 2 μm² on the reticle, which corresponds to 10 pixels in the bit image. Referring to FIG. 9, the minimum line width portion of an L-shaped pattern represents 10 pixels (10).

Most of the pattern elements on a reticle are generally constituted by edges parallel to pixel matrix directions (X and Y directions) in the bit image. The number of edges inclined at 45° (135°) is small. Referring to FIG. 9, a pattern element PA is made of a chrome light-shielding layer on the reticle, and logic values "1" are stored 10 in the pixels of the light-shielding layer, and logic values "0" are stored in the pixels constituting the remaining transparent portion. When the chrome layer is deposited on the surface of the substrate M and an electron beam positive resist is applied thereon, the beam control system 5 disables illumination of the beam spot at a position of a pixel having a value of "1" in the frame memory 3. The beam control system 5 enables illumination of the beam spot at a position of a pixel having a value of "0" in the frame memory 3.

(5) Arrangement of Pattern Correction Device

Figure 10:
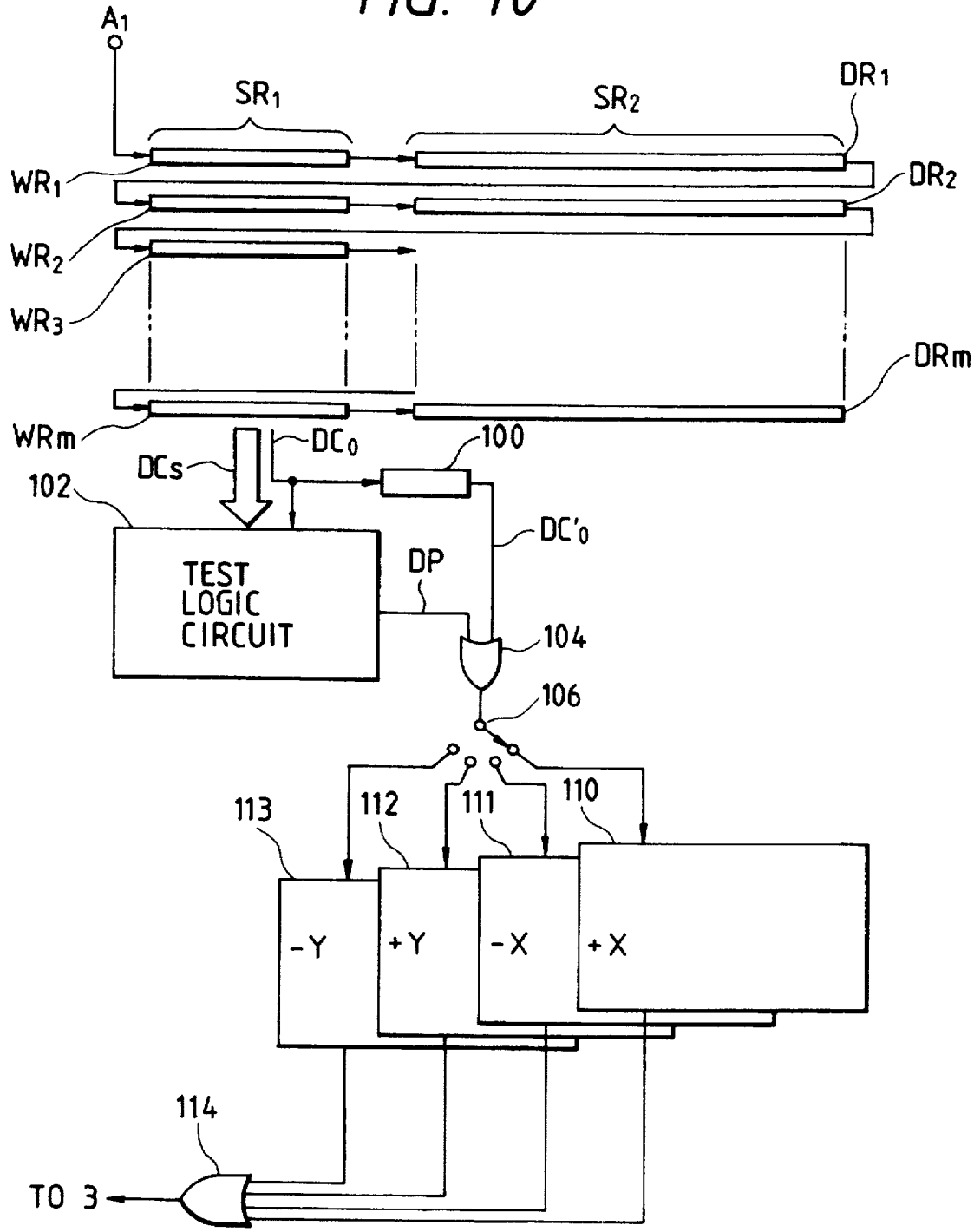
FIG. 10 is a block diagram showing a schematic arrangement of a correction device.
Figure 11:
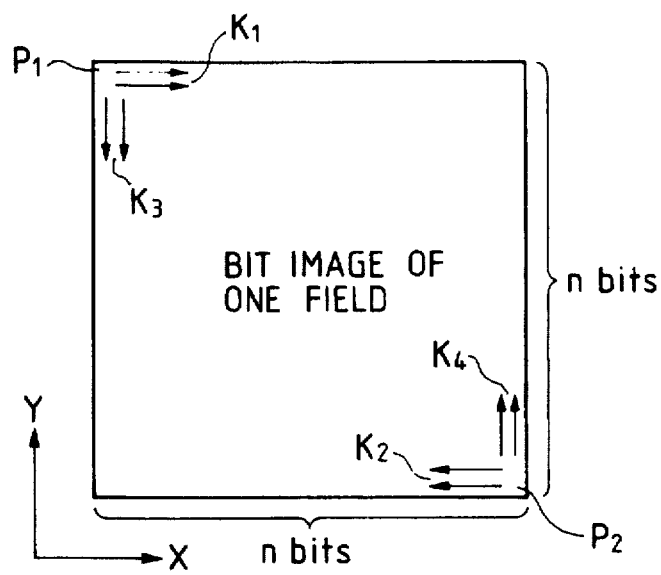
FIG. 11 is a view for explaining a scan direction of a bit image of one field in a frame memory.

FIG. 10 is a block diagram showing a schematic arrangement of the correction device 10 in FIG. 8. A bit image of one field developed in the frame memory 3 is converted into "0" and "1" serial data, and this data is applied to a terminal A1. The bit image in the frame memory 3 is stored as shown in FIG. 11. For illustrative convenience, the horizontal direction is defined as the X direction, while the vertical direction is defined as the Y direction. A bit (pixel) at the upper left corner in the field is defined as $P_1$, and a bit at the lower right corner is defined as The number of pixels in each of the X and Y directions is n (e.g., 50,000 bits).

Serial read access of bit data from the memory 3 has the following four modes, although its detailed description will be made later. These four modes are: a mode (to be referred to a +X direction scan mode hereinafter) in which data of one line (n bits) from the bit $P_1$ as the start point in FIG. 11 is read out in the +X direction, as indicated by an arrow $K_1$, and lower lines (−Y direction) are sequentially read line by line; a mode (to be referred to as a −X direction scan mode hereinafter) in which data of one line (n bits) from the bit $P_2$ as the start point is read out in the −X direction as indicated by an arrow $K_2$, and upper lines (+Y direction) are read out line by line; a mode (to be referred to as a −Y direction scan mode hereinafter) in which data of one line (n bits) from the bit $P_1$ as the start point is read out in the −Y direction as indicated by an arrow $K_3$ and right lines (+X direction) are read out line by line; and a mode (to be referred to as a +Y direction scan mode hereinafter) in which data of one line (n bits) from the bit $P_2$ as the start point is read out in the +Y direction as indicated by an arrow $K_4$, and left lines are read out line by line.

In any mode, the bit serial data read out from the frame memory 3 is input to a first shift register WR1 of an extraction window shift register group SR1 through the terminal A1. Output data from this shift register WR1 is input to a first shift register DR1 of a next shift register group SR1. Output data from the shift register DR1 is input to a second shift register WR2 of the shift registers SR1. In this manner, the bit serial data from the frame memory 3 is sequentially shifted bit by bit through the shift registers WR1, DR1, WR2, DR2, ..., WRm, and DRm. The number bw of bits of each of the shift registers WR1 to WRm of the shift register group SR1 is set to be about 40 to 60. The number of bits of each of the shift registers DR1 to DRm of the shift register group SR2 is defined as n-bw. That is, the total number of bits of the shift registers WR1 and DR1 is set to be equal to the number n of bits of one line. Each of the numbers m of shift registers WRm and DRm respectively constituting the shift register groups SR1 and SR2 is set equal to the number bw of bits of each of the shift registers WR1 to WRm. When the number bw is set to be 40, m=40 is set. This can be achieved by setting the extraction window (bw×bw bits) of the shift register group SR1 to be a square. However, the extraction window need not be set to be a square.

Serial data DCo of the central bit (of the extraction window) corresponding to the target point $A_{px}$ is delayed by a predetermined number of bits by a shift register 100, and delayed serial data DCo' is input to an OR gate 104. On the other hand, serial data group DCs from a plurality of test bits in the extraction window is input to a test logic circuit 102. The test logic circuit 102 determines whether a pattern edge located at the target central bit position is corrected. If correction is required, correction data (either logic value "1" or "0") DP is output to the OR gate 104 in units of bits.

The OR gate 104 logically ORs the design original bit image data (DCo') and data (DP) for only a correction portion. The logically ORed result as serial data is output to any one of four frame memories 110, 111, 112, and 113 through a switch 106. The arrangements of the four frame memories 110 to 113 are the same as that shown in FIG. 11. The four frame memories 110 to 113 correspond to the four scan modes (+X, −X, +Y, and −Y) in a one-to-one correspondence. More specifically, the frame memory 110 is accessed by the same rule (arrow $K_1$ in FIG. 11) as the read access of the frame memory 3 in the +X direction scan mode. The frame memory 111 is accessed by the same rule (arrow $K_2$) as the read access of the frame memory 3 in the −X direction scan mode. The frame memory 112 is accessed by the same rule as that indicated by the arrow $K_4$ in FIG. 11 in the +Y direction scan mode. The frame memory 113 is accessed by the same rule as indicated by the arrow $K_3$ in FIG. 11 in the −Y direction scan mode.

The four scan modes cannot be simultaneously set. Bit serial data access of one field from the frame memory 3 is performed a total of four times. Scan must be performed four times for one field due to the characteristics of the test logic circuit 102. When the arrangement of the test logic circuit 102 is changed, two-dimensionally corrected data can be obtained by only one scan cycle.

Corrected bit image data stored in the four frame memories 110 to 113 in all scan directions are read out by the same rule (direction) under the same clock. The bit serial data is then subjected to logic ORing in an OR gate 114. The OR gate 114 returns the finally corrected bit image data (serial data) to the frame memory 3. The bit image based on the design data in the frame memory 3 is converted into a bit image through predetermined pattern correction.

Note that in practical reticle manufacture, a correction operation (i.e., MTR 1→developing means 2→frame memory 3→correction device 10→frame memory 3) is repeated every field, and the corrected bit image data obtained in units of fields are sequentially transferred from the frame memory 3 to another MTR, and the corrected bit image data in units of fields is read out from this MTR to the frame memory 3.

The block diagram in FIG. 10 is a schematic diagram. In practice, a processor and a clock generator for systematically controlling shift operations of the shift register groups SR1 and SR2, the test timings of the test logic circuit 102, or the addressing timings of the frame memories 3 and 110 to 113 are arranged.

Figure 12:
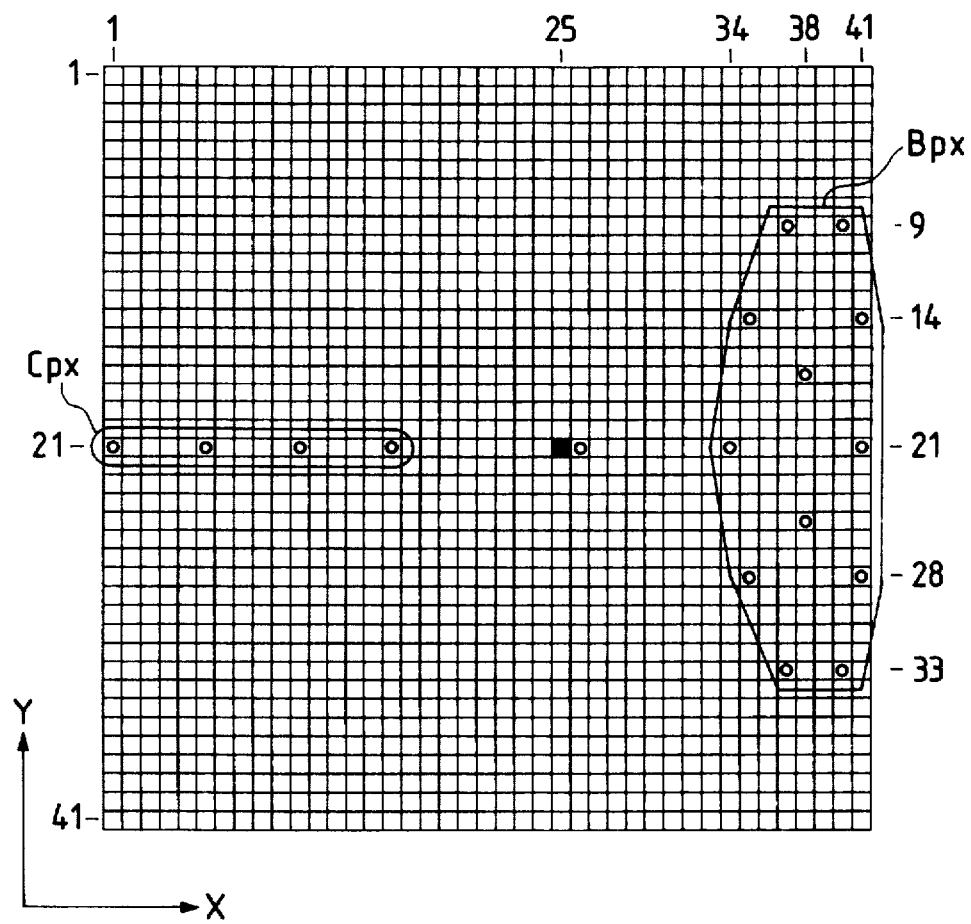
FIG. 12 is a view showing a bit arrangement of a test element set within an extraction window.

FIG. 12 shows a bit array of the extraction window obtained by the shift register group SR1. This two-dimensional array is constituted by 41 bits in the horizontal direction (shift direction) and 41 bits in the vertical direction. In order to specify bit positions in FIG. 12, the horizontal direction is defined as the X direction, and the vertical direction is defined as the Y direction, thereby representing coordinates as (x,y).

An almost central bit (25,21) represented by a mark ■ in this extraction window is a bit corresponding to the target point $A_{px}$. A logic value appearing in this bit (25,21) is extracted as the serial data DCo in FIG. 10. A bit (26,21) adjacent to the target bit (25,21) in the X direction is set to detect, together with the target bit, an edge extending in the Y direction and appearing in the extraction window.

The linear test element portion $C_{px}$ having a determination length of 16 pixels in the X direction is set at a position spaced apart from the target bit (25,21) by 8 pixels (bits) in the −X direction. That is, the linear test element portion $C_{px}$ consists of bits (1,21), (6,21), (11,21), and (16,21). The minimum line width of a target as a test object corresponds to a portion of 8 pixels in the X or Y direction within the test extraction window in FIG. 12.

The wing-like test element portion $B_{px}$ constituted by a total of 12 bits is set in a region spaced apart from the target bit by 8 pixels in the +X direction. These 12 bits are (34,21), (41,21), (37,9), (40,9), (35,14), (41,14), (38,17), (38,25), (35,28), (41,28), (37,33), and (40,33). The width of the wing-like test element portion $B_{px}$ corresponds to 8 pixels (minimum line width), and the length of the test element portion $B_{px}$ in the Y direction corresponds to 24 pixels. The length in the Y direction is about three times the minimum line width. This wing-like test element portion $B_{px}$ is symmetrical about the center line of Y=21 in the Y direction.

The linear and wing-like test element portions $C_{px}$ (4 bits) and $B_{px}$ (12 bits) are provided to test whether any patterns (regions having logic values of "1") are present therein, respectively. Bit information (16 bits) of each test element portion is output to the test logic circuit 102 as data DCs together with information of the target bit and information of the adjacent bit (26,21). The layout, shapes, and sizes of the test element portions (FIG. 12) for the target bit are set to correct the chrome pattern of a phase shift reticle.

Figure 13A:
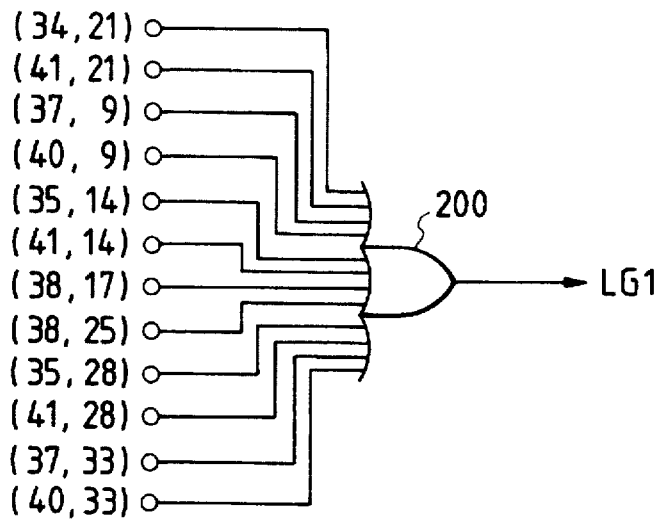
FIGS. 13A and 13B are diagrams of logic circuits for the respective test element portions.
Figure 13B:
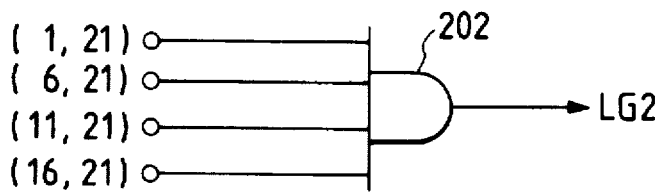

FIGS. 13A and 13B show logic circuits as equivalent circuits of the test element portions, respectively. These logic circuits are arranged in the test logic circuit 102 shown in FIG. 10. FIG. 13A shows an OR gate 200 for logically ORing 12-bit data constituting the wing-like test element portion $B_{px}$. FIG. 13B shows an AND gate 202 for logically ANDing 4-bit data constituting the linear test element portion $C_{px}$.

If all 12 bits input to the OR gate 200 are set at logic "0" (transparent portion), an output LG1 is set at logic "0", and the pattern edge located at the target bit is determined as an isolated edge when viewed from the right side in FIG. 12. Similarly, any one of four bits input to the AND gate 202 is set at logic "0", an output LG2 is set at logic "0", and the pattern edge located at the target bit is determined as an isolated edge when viewed from the right side in FIG. 12. The above logic circuits may be realized by a software program.

Figure 14:
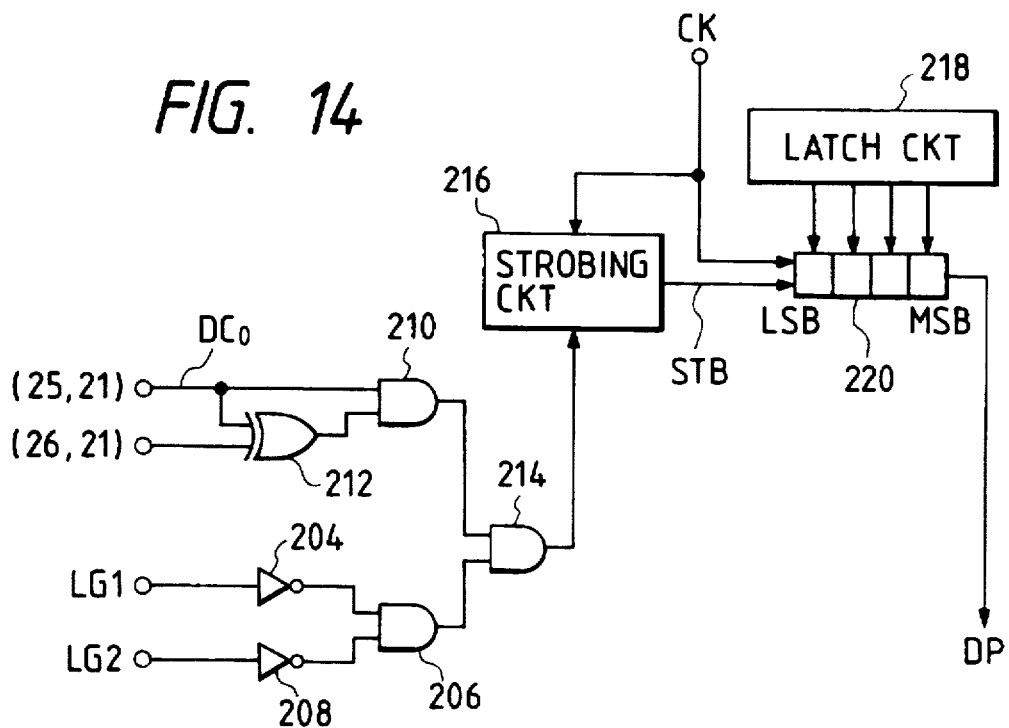
FIG. 14 is a block diagram of a circuit for generating correction bit data in units of pixels.

FIG. 14 shows a detailed arrangement of the test logic circuit 102. The output LG1 from the OR gate 200 shown in FIG. 13A is input to one input terminal of an AND gate 206 through an inverter 204. The output LG2 from the AND gate 202 in FIG. 13B is input to the other input terminal of the AND gate 206 through an inverter 208.

The data DCo from the target bit (25,21) is input to the first input terminals of an AND gate 210 and an exclusive OR (EX-OR) gate 212. The data from the bit (26,21) adjacent to the target bit is input to the second input terminal of the EX-OR gate 212. An output from the EX-OR gate 212 is input to the second input terminal of the AND gate 210. Outputs from the two AND gates 206 and 210 are logically ANDed by an AND gate 214. An output from the AND gate 214 is supplied to a strobing circuit 216 for controlling whether the pattern edge (i.e., a portion having a logic value of "1") is expanded.

The strobing circuit 216 receives a clock pulse CK for controlling each bit shift operation of each shift register shown in FIG. 10 and outputs a strobe pulse STB synchronized with the timing of the clock pulse CK to a preset shift register 220 in accordance with the value of the output from the AND gate 214. The shift register 220 is a 4-bit shift register in this embodiment because an expansion amount of the edge is limited to a maximum of four pixels. The shift register 220 shifts the data bit by bit from the LSB to the MSB of the data in response to the clock pulses CK. Data output from the MSB is output to the OR gate 104 (FIG. 10) as bit data DP to be corrected.

A bit pattern (4 bits) to be set in the shift register 220 is loaded from a host processor to a latch circuit 218. Only when the strobe pulse STB is generated by the strobing circuit 216, the data stored in the latch circuit 218 is preset in the shift register 220. The shift register 220 performs a shift operation from the LSB to the MSB in response to the clock pulse CK regardless of the presence/absence of the preset data. For this reason, when the four clock pulses are input upon presetting of the bit pattern data, the input data is output from the MSB. The data DP kept at logic "0" is output unless the next bit pattern data is preset in the shift register 220.

In this embodiment, edge correction bit data DP is serially output from the 4-bit shift register 220 in response to the clock pulses CK. For this reason, the delay shift register 100 shown in FIG. 10 also comprises a 4-bit shift register.

(6) Description of Pattern Correction Operation

Figure 15:
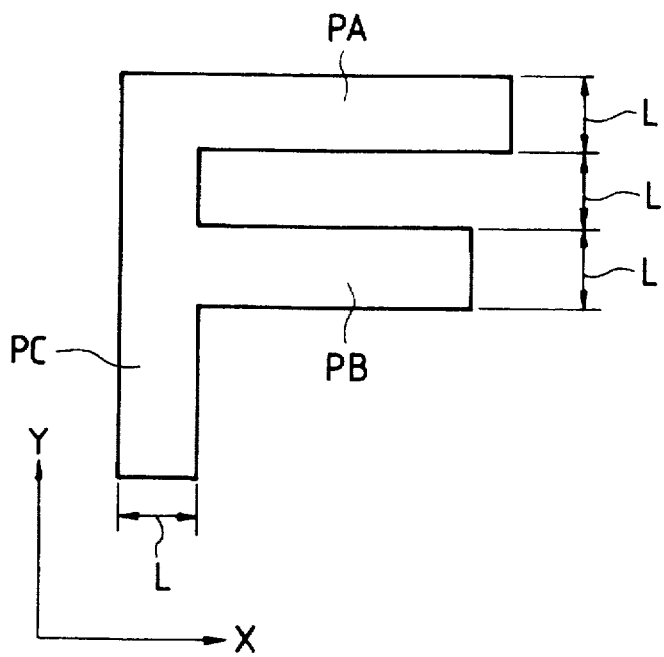
FIG. 15 is a view showing a design pattern.

A practical operation of the circuit arrangement shown in FIGS. 10 to 14 will be described below. For descriptive convenience, assume that a chrome pattern (letter F) shown in FIG. 15 is stored as a bit image in the frame memory 3. The pattern in FIG. 15 consists of three linear pattern portions PA, PB, and PC. The width of the pattern and space portions is set to about the minimum line width obtained as a projected image using this reticle. That is, the line pattern width is constituted by 10 pixels.

As described with reference to FIG. 11, the bit data read modes of the frame memory 3 have four directions, respectively. For this reason, the pattern (FIG. 15) passing through the extraction window shown in FIG. 12 changes its directions, as indicated in FIGS. 16A, 16B, 16C, and 16D. Referring to FIGS. 16A to 16D, the X-Y coordinate system represents a coordinate system of the extraction window. Patterns always flow in the extraction window in the +X direction (i.e., the right direction in FIG. 12) regardless of the directions of the patterns. When a one-line (n bits) portion flows, the pattern is shifted by one pixel in the −Y direction (lower direction in FIG. 12) for reading the next line.

Figure 16A:
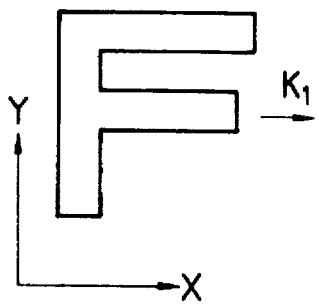
FIGS. 16A, 16B, 16C, and 16D are views for explaining a relationship between the pattern and relative scan directions.
Figure 16B:
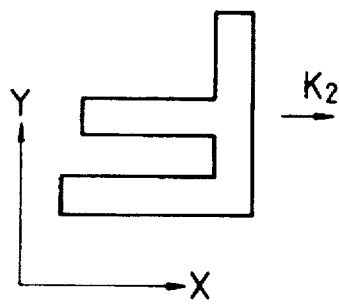
Figure 16C:
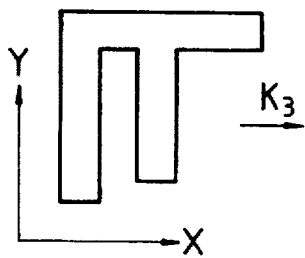
Figure 16D:
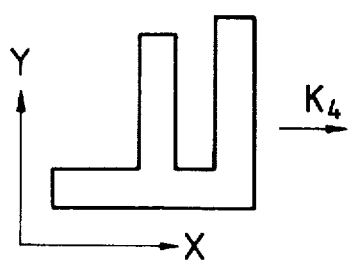

Arrows $K_1$, $K_2$, $K_3$, and $K_4$ in FIGS. 16A, 16B, 16C, and 16D correspond to the arrows in FIG. 11. That is, FIG. 16A shows +X direction scan, FIG. 16B shows −X direction scan, FIG. 16C shows −Y direction scan, and FIG. 16D shows +Y direction scan.

For example, when the +X direction scan is performed, as shown in FIG. 16A, the switch 106 in FIG. 10 is selected to be connected to the frame memory 110. The bit data are sequentially read out from the frame memory 3 in response to the clock pulses CK in a direction indicated by the arrow $K_1$ in FIG. 11, and the readout data are supplied to the shift register groups SR1 and SR2 in FIG. 10. At this time, if a pattern edge which satisfies that the target bit (25,21) within the extraction window is set at logic "1" and the adjacent bit (26,21) is set at logic "0" does not appear, an output from the AND gate 210 in FIG. 14 is set at logic "0". An output from the AND gate 214 is set at logic "0" accordingly. In this case, the strobing circuit 216 does not output the strobe pulse STB. Therefore, the MSB of the shift register 220 continuously outputs "0".

Figure 17:
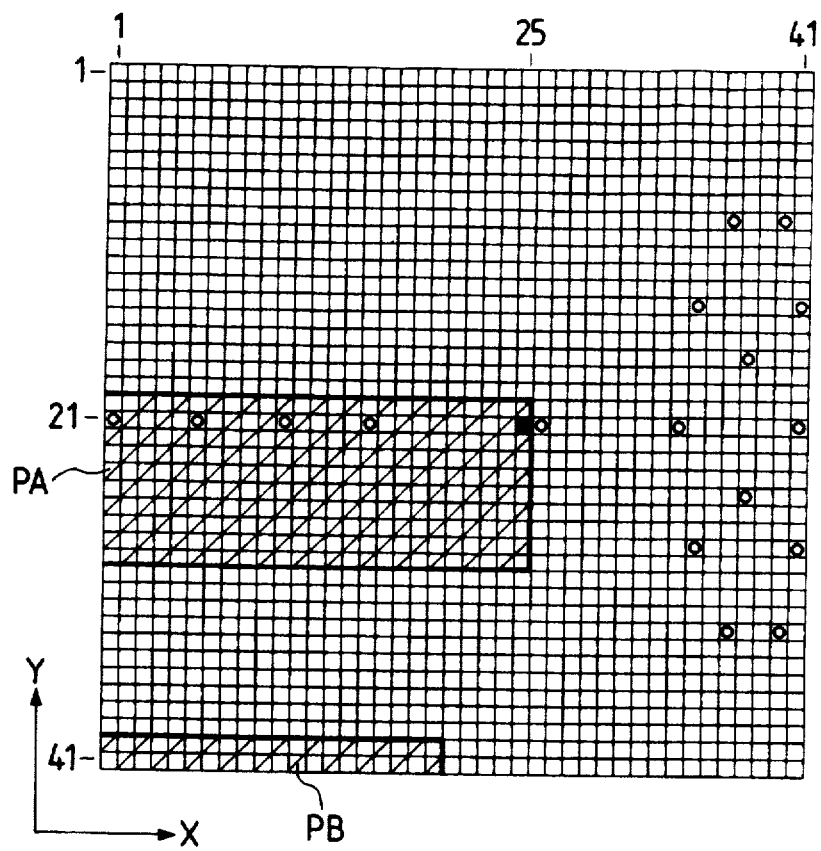
FIG. 17 is a view showing a state in which an edge of part of the pattern in FIG. 15 is located at a target bit.

When the shift operation progresses and part of the pattern shown in FIG. 16A, e.g., an edge of the distal end of the linear pattern portion PA, is located at the position shown in FIG. 17, an output from the AND gate 210 goes to logic "1". At this time, since the four bits (1,21), (6,21), (11,21), and (16,21) constituting the linear test element portion $C_{px}$ are present on the pattern portion PA, the output LG2 from the AND gate 202 in FIG. 13B goes to logic "1". However, this output is inverted by the inverter 208 in FIG. 14, so that an output from the AND gate 206 is set at logic "0". Note that since all 12 bits constituting the wing-like test element portion $B_{px}$ are present in the transparent portion, the output LG1 from the OR gate 200 is set at logic "0", so that an output from the inverter 204 is set at logic "1".

The output from the AND gate 214 is set at logic "0" for the edge constituting the end portion of the linear pattern portion shown in FIG. 17. In this case, the strobing circuit 216 does not output the strobe pulse STB, and pattern correction is not performed.

Figure 18:
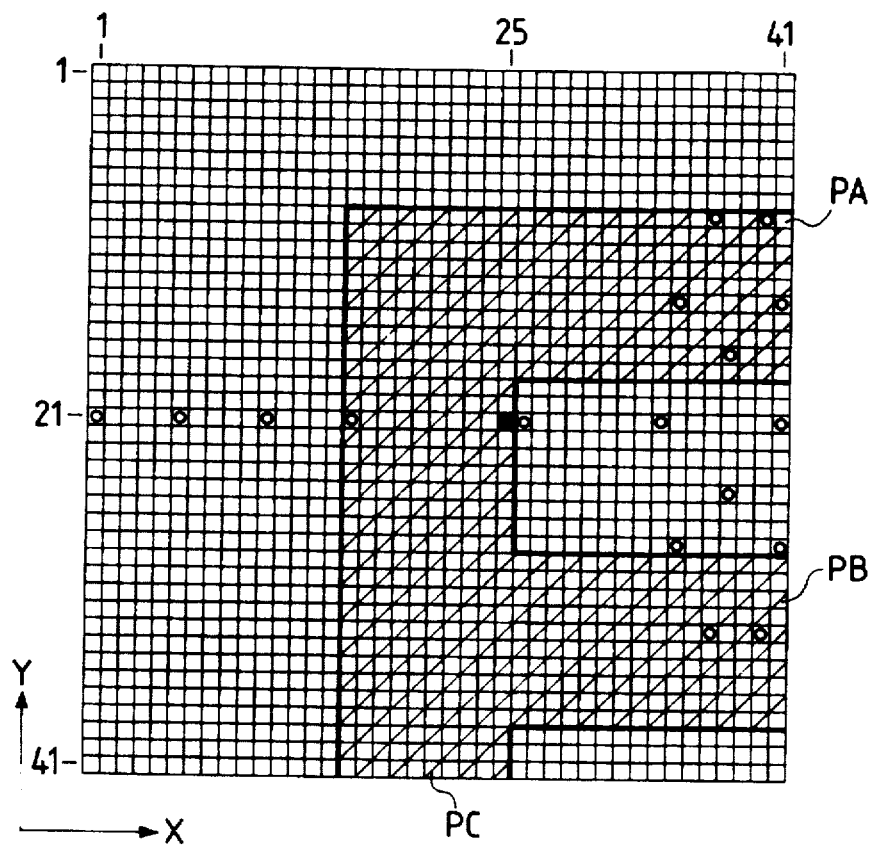
FIG. 18 is a view showing a state in which another edge of part of the pattern in FIG. 15 is located at the target bit.

As shown in FIG. 18, when the right edge of the linear pattern portion PC is detected by the target bit (i.e., when the output from the AND gate 210 is set at logic "1"), some of the 12 bits of the wing-like test element portion are present in the pattern portions PA and PB, so that the output LG1 from the OR gate 200 in FIG. 13A is set at logic "1", and an output from the inverter 204 is set at logic "0". An output from the AND gate 214 is set at logic "0" regardless of the four bit states of the linear test element portion. Therefore, no edge correction is performed in FIG. 18.

Figure 19:
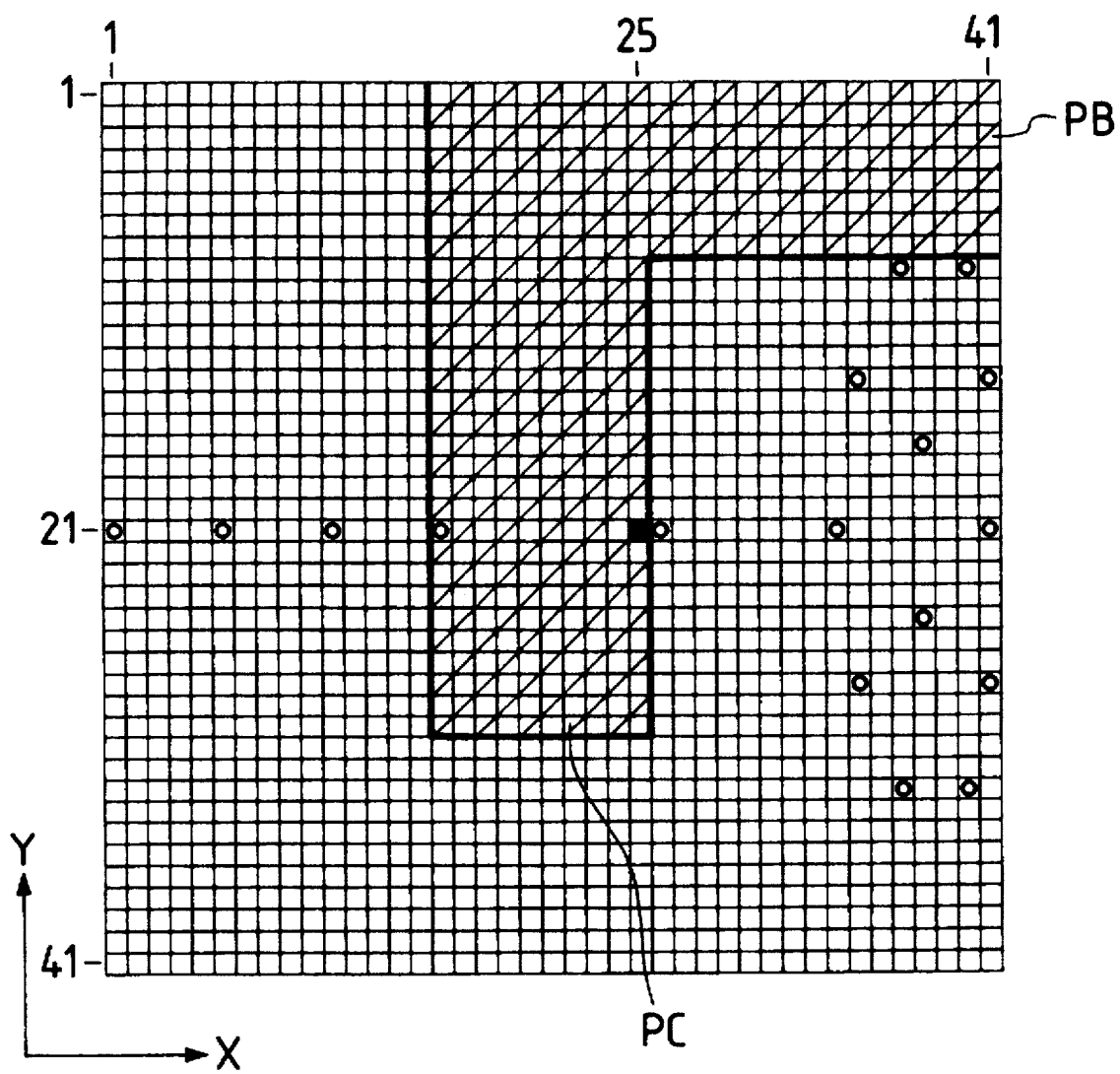
FIG. 19 is a view showing a state in which still another edge of part of the pattern in FIG. 15 is located at the target bit.

As shown in FIG. 19, the pattern portion PB falls outside the area constituted by the 12 bits of the wing-like test element portion and at the same time the right edge of the linear pattern portion PC is detected by the target bit. In this case, an output from the edge detection AND gate 210 is set at logic "1", an output from the transparent portion detection inverter 204 is set at logic "1" by the position of the wing-like test element portion, and an output from the partial transparent portion detection inverter 208 is set at logic "1"

by the position of the linear test element portion. At this moment, the AND gate 214 outputs a signal of logic "1", and the strobing circuit 216 outputs the strobe pulse STB immediately before the next clock pulse CK. In response to this strobe pulse STB, the edge correction bit data is preset from the latch circuit 218 to the shift register 220. When edge correction is performed to expand the edge by one pixel, LSB="1" is set in the latch circuit 218, and the remaining three bits are set at logic "0". Therefore, data "1000" from the LSB side is preset in the shift register 220.

Upon presetting, the shift register 220 outputs the data from the MSB in response to the clock pulses CK. Until three clock pulses are input from presetting, the data DP (MSB) is kept at logic "0". In response to the third clock pulse, the data DP goes to logic "1". From the fourth clock pulse, the data DP goes to logic "0" again. However, as shown in FIG. 10, since the target bit data DCo is delayed by four pixels by the 4-bit shift register 100, the target bit data "1" in the state of FIG. 19 appears on the data DCo' in response to the fourth clock pulse upon presetting of the shift register 220. As a result, the edge portion of the pattern portion PC extending in the Y direction is expanded at the target bit position of FIG. 19 by one pixel in the X direction.

Figure 20A:
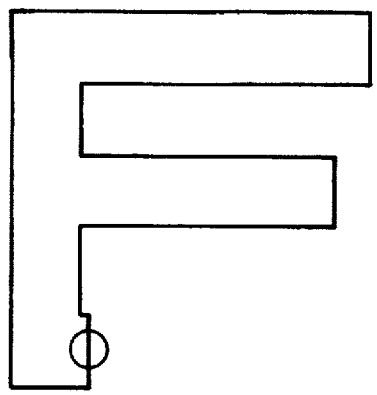
FIGS. 20A, 20B, 20C, 20D, and 20E are views showing correction results of edges of the pattern shown in FIG. 15.
Figure 20B:
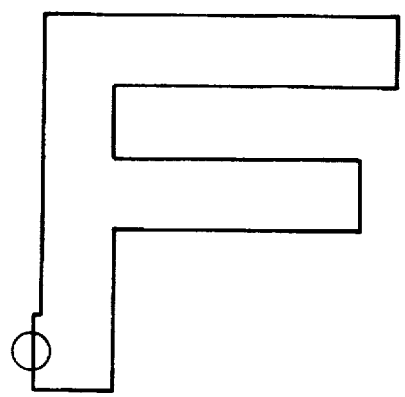
Figure 20C:
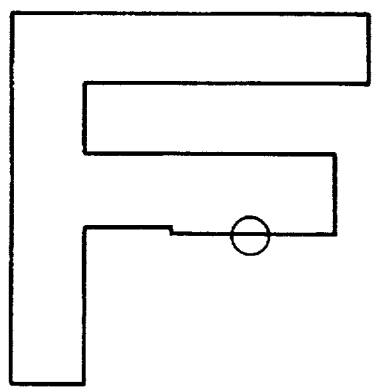
Figure 20D:
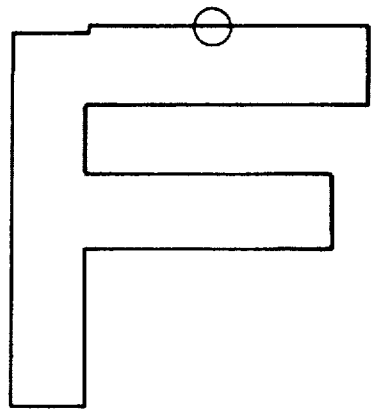
Figure 20E:
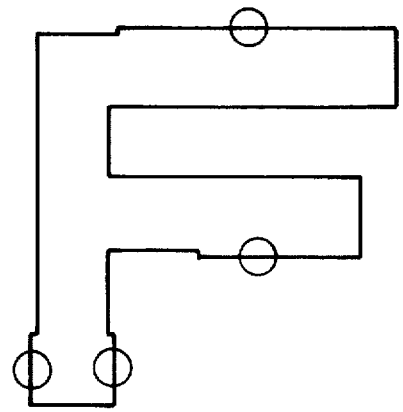

By the above +X direction scan, bit image data corrected as shown in FIG. 20A is stored in the frame memory 110. Similarly, by the −X direction scan, bit image data corrected as shown in FIG. 20B is stored in the frame memory 111. By the above −Y direction scan, bit image data corrected as shown in FIG. 20C is stored in the frame memory 112. Similarly, by the +Y direction scan, bit image data corrected as shown in FIG. 20D is stored in the frame memory 113. Encircled portions in the bit images in FIGS. 20A, 20B, 20C, and 20D are edge portions thickened by correction. The bit images in the four frame memories 110 to 113 are serially read out every identical pixel position. The readout image data are synthesized by the OR gate 114 in FIG. 10. The synthesized data is then re-stored in the frame memory 3. For this reason, the synthesized corrected image as shown in FIG. 20E is stored in the frame memory 3.

This embodiment particularly exemplifies phase shift reticle pattern correction. Good results can be obtained when the expansion amount (correction amount) of the line width falls within the range of about 5% to about 10% of the line width value of the resolving limit.

EMBODIMENT 2

(1) Circuit Arrangement of Modification of Determination Logic

A second embodiment will be described below wherein a plurality of pairs of linear and wing-like test element portions set within an extraction window are provided, and a scan operation for reading out a design bit image from a frame memory 3 is performed once. In order to reduce the number of scan operations to one, the size of the extraction window is changed, and at the same time, the layout of the test elements is changed, as shown in FIG. 21. More specifically, the size of the extraction window is set to be 45×45 bits, as shown in FIG. 21, and a central bit (23,23) is defined as a target bit. The line width of the resolving limit which can be projected on the wafer in accordance with a phase shift technique is defined as 8 pixels on the bit image. A linear test element portion B1 constituted by 4 bits and a wing-like test element portion B2 constituted by 10 bits have the same functions as in FIG. 12. In this embodiment, the pair of linear and wing-like test element portions are rotated about the target bit through every 90° to obtain three additional pairs of test element portions. More specifically, a pair of linear test element portion C1 and wing-like test element portion C2, a pair of linear test element portion D1 and wing-like test element portion D2, and a pair of linear test element portion E1 and wing-like test element portion E2 are additionally provided. Referring to FIG. 21, test bits (circles) within each test element portion are specified by coordinate values when the bit of the upper left corner is defined as (1,1), and test logic circuits are arranged as shown in FIGS. 22 and 23 in the same manner as in FIGS. 13A and 13B.

Figure 22:
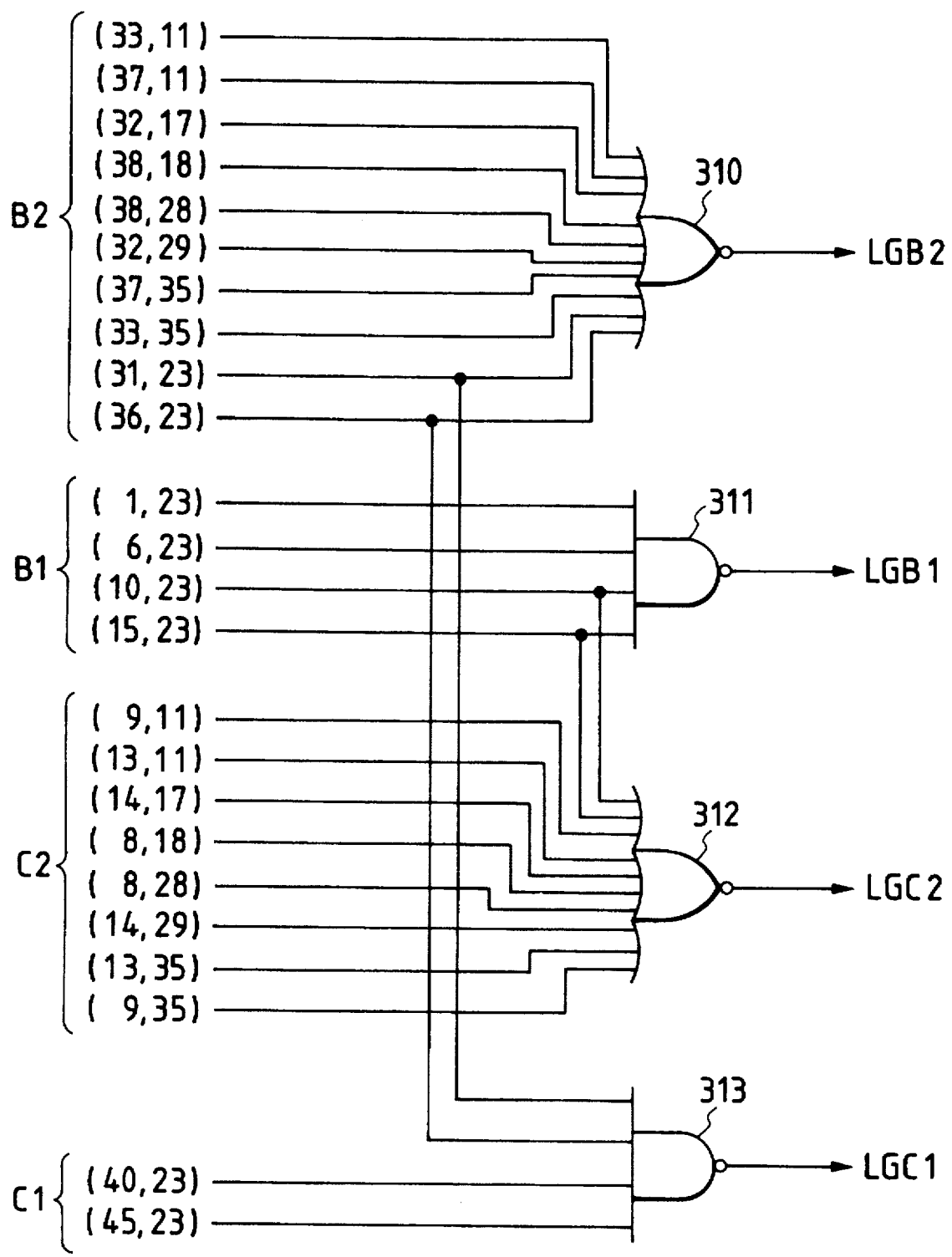
FIG. 22 shows logic circuits corresponding to the test element portions in the second embodiment.
Figure 23:
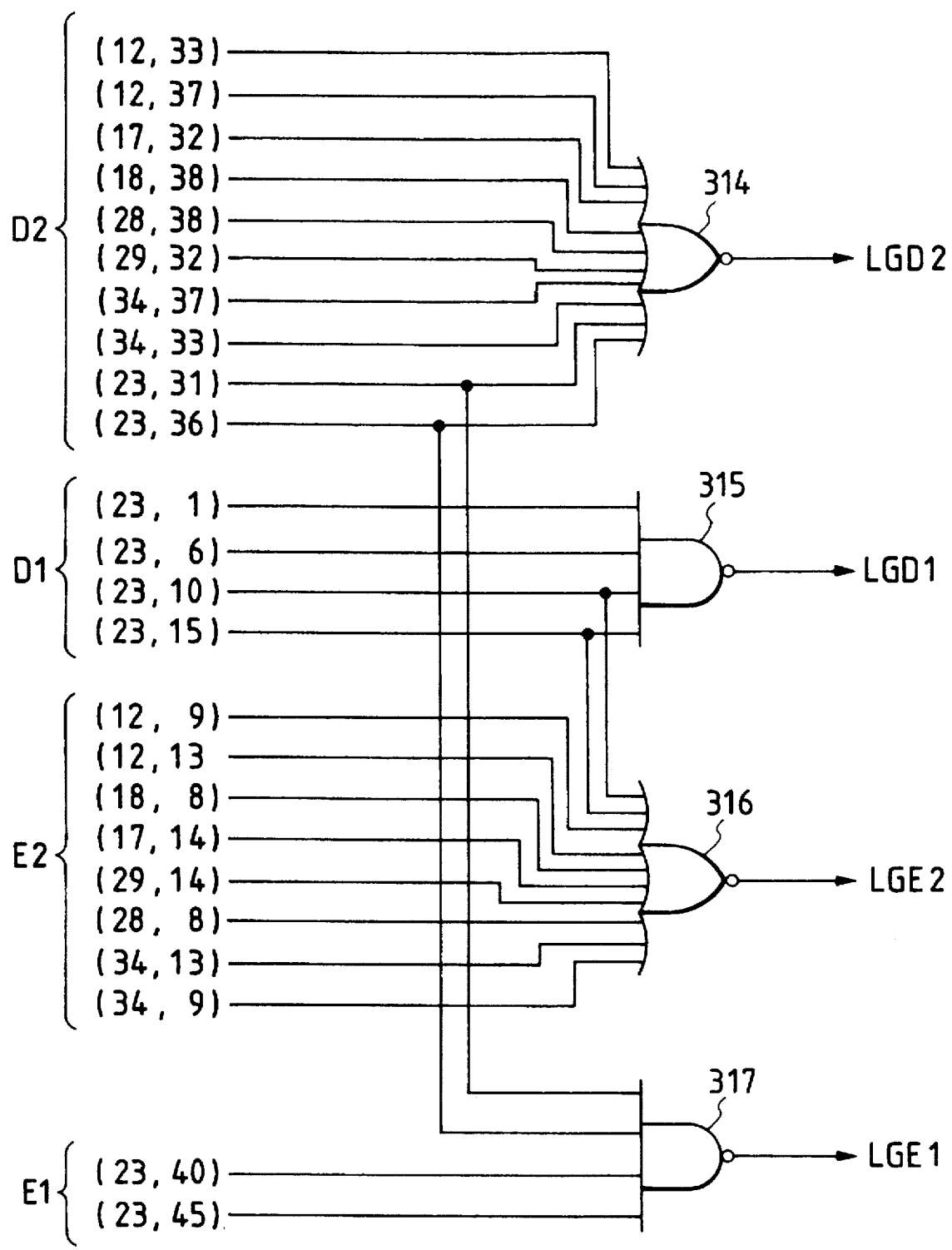
FIG. 23 shows other logic circuits corresponding to the test element portions in the second embodiment.

Referring to FIG. 22, the wing-like test element portion B2 is constituted by a 10-bit input NOR gate 310. When a pattern portion ("1") is not included in a region constituted by these 10 test bits, an output LGB2 from the NOR gate 310 is set at logic "1". The linear test element portion B2 is constituted by a 4-bit input NAND gate 311. When one of the four test bits is included in a transparent portion ("0"), an output LGB1 from the NAND gate 311 is set at logic "1". Similarly, the linear test element portion C1 is constituted by a NAND gate 313, and the wing-like test element portion C2 is constituted by a NOR gate 312. Referring to FIG. 23, the two wing-like test element portions D2 and E2 are constituted by NOR gates 314 and 316, respectively. The two linear test element portions D1 and E1 are constituted by NAND gates 315 and 317, respectively.

Referring to FIG. 21, four bits (24,23), (23,24), (22,23), and (23,22) adjacent to the target bit (23,23) in the X and Y directions are set. The presence/absence of an edge and the directivity of a change in edge are detected by the four adjacent bits and the target bit.

(2) Principle of Operation of Determination Logic

Figure 24:
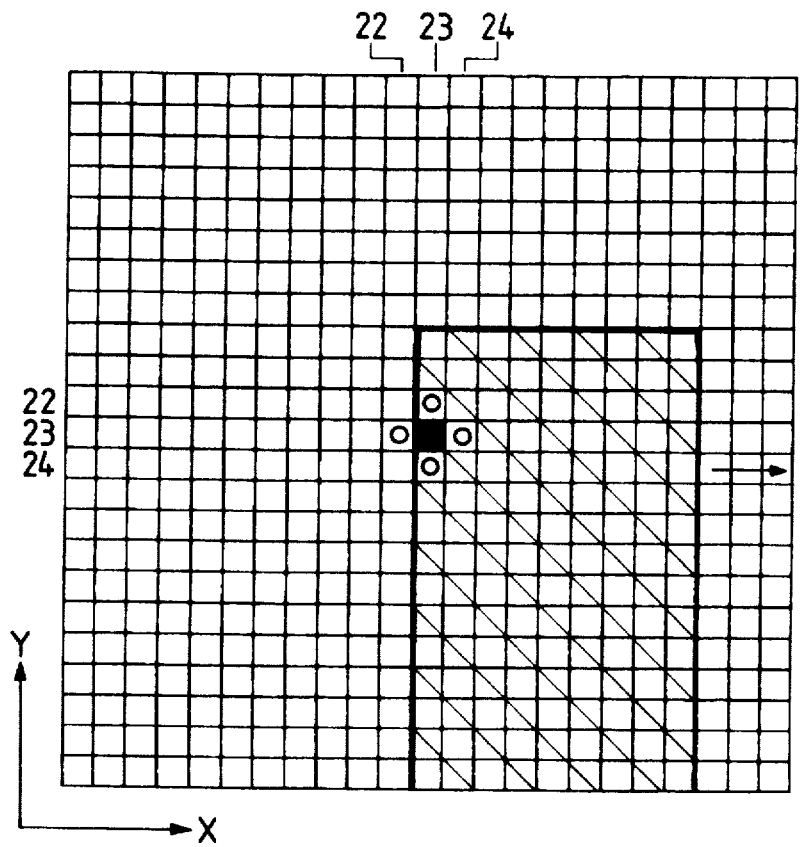
FIG. 24 is a view showing a state in edge direction detection according to the second embodiment.

Detection of directivity of a change in edge and an edge correction algorithm will be described with reference to FIGS. 24, 25, and 26. FIG. 24 shows a state wherein the left edge of a pattern portion (hatched portion) appearing within the extraction window is located on the target bit. As is apparent from the arrangement of FIG. 10, this pattern flows bit by bit within the extraction window in a direction as indicated by an arrow. The state in FIG. 24 is detected by the target bit (23,23) and its left bit (22,23). When the edge at the target bit is determined as an isolated edge by the linear and wing-like test element portions C1 and C2 (i.e., LGC1= "1" and LGC2="1"), a predetermined number of bits of logic "1" are added as correction bit data from the moment at which the pattern is shifted to the left by one bit in response to the next clock pulse CK.

Figure 25:
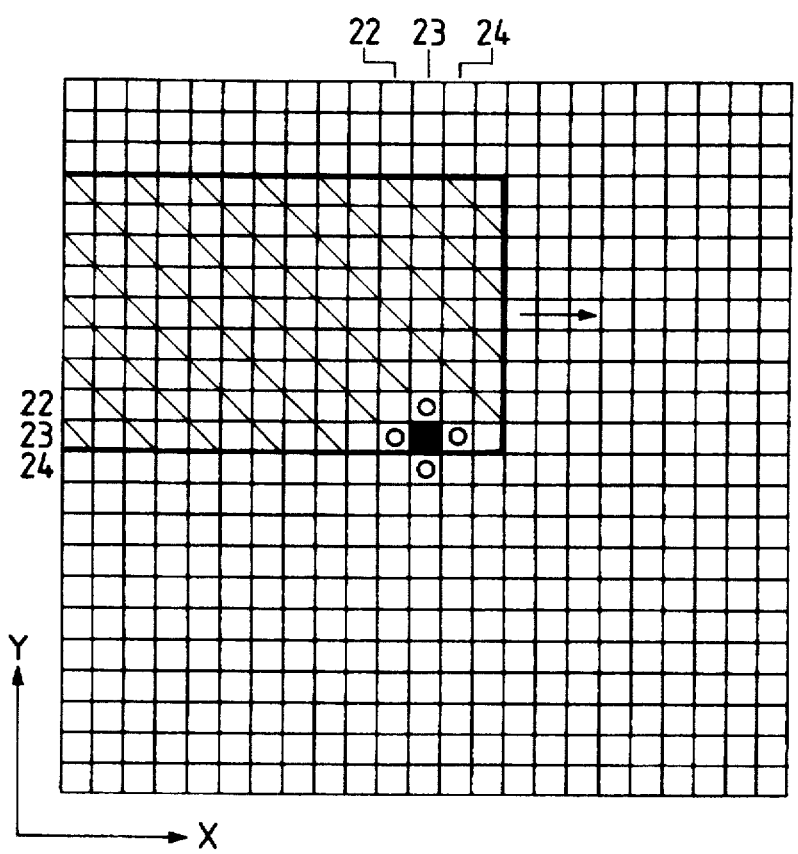
FIG. 25 is a view showing another state in edge direction detection according to the second embodiment.

A state in which a line pattern extending in the X direction as shown in FIG. 25 flows in the X direction while the X direction lower edge of the line pattern is located on the target bit will be taken into consideration. This state is detected such that the bit (23,24) below the target bit by one bit is set at logic "0", and the target bit is set at logic "1". Whether the edge portion is to be corrected or not is determined by whether both an output LGD1 from the linear test element portion D1 and an output LGD2 from the wing-like test element portion D2 are set at logic "1". If this edge portion is to be corrected, addition of the correction bit data ("1") must be performed for a pixel located below the target bit. More specifically, correction bit data must be added to all bits (n+1), 2(n+1), . . . , h(n+1) (where h is a positive integer) ahead of the target bit since one line of the field consists of n bits. The positive integer h corresponds to a Y direction expansion amount of the edge extending within the extraction window in the X direction. In this case, in the process wherein serial data DCo is serially supplied to the h n-bit shift registers, the correction data "1" are respectively added to the bits (n+1), 2(n+1), . . . .

Figure 26:
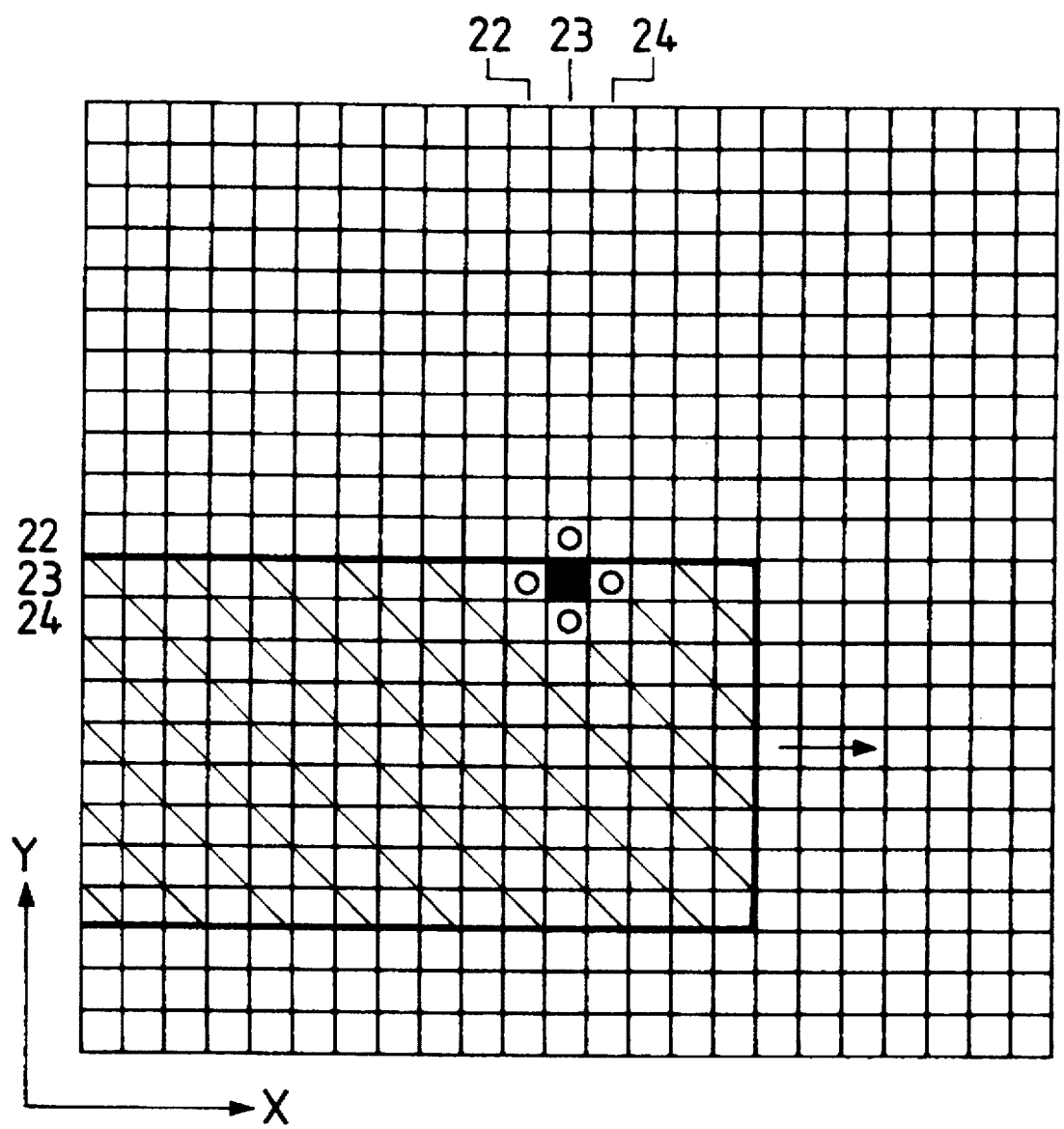
FIG. 26 is a view showing still another state in edge direction detection according to the second embodiment.

Finally, a state in which the upper edge of the line pattern extending in the X direction is located on the target bit, as shown in FIG. 26, is taken into consideration. This state is detected since the bit (23,22) immediately above the target bit is set at logic "0", and the target bit is set at logic "1". Whether this edge portion is to be corrected is determined by whether both an output LGE1 from the linear test element portion E2 and an output LGE2 from the wing-like test element portion E2 are set at logic "1". If this edge portion is to be corrected, correction data "1" must be added to the pixel above the target bit. In the process for extracting serial data from the h-bit pixel positions upward from the target bit and serially supplying the extracted serial data in the h n-bit shift registers, the correction data "1" is added every (n+1) bits.

(3) Circuit Arrangement of Pattern Correction Logic

Figure 27:
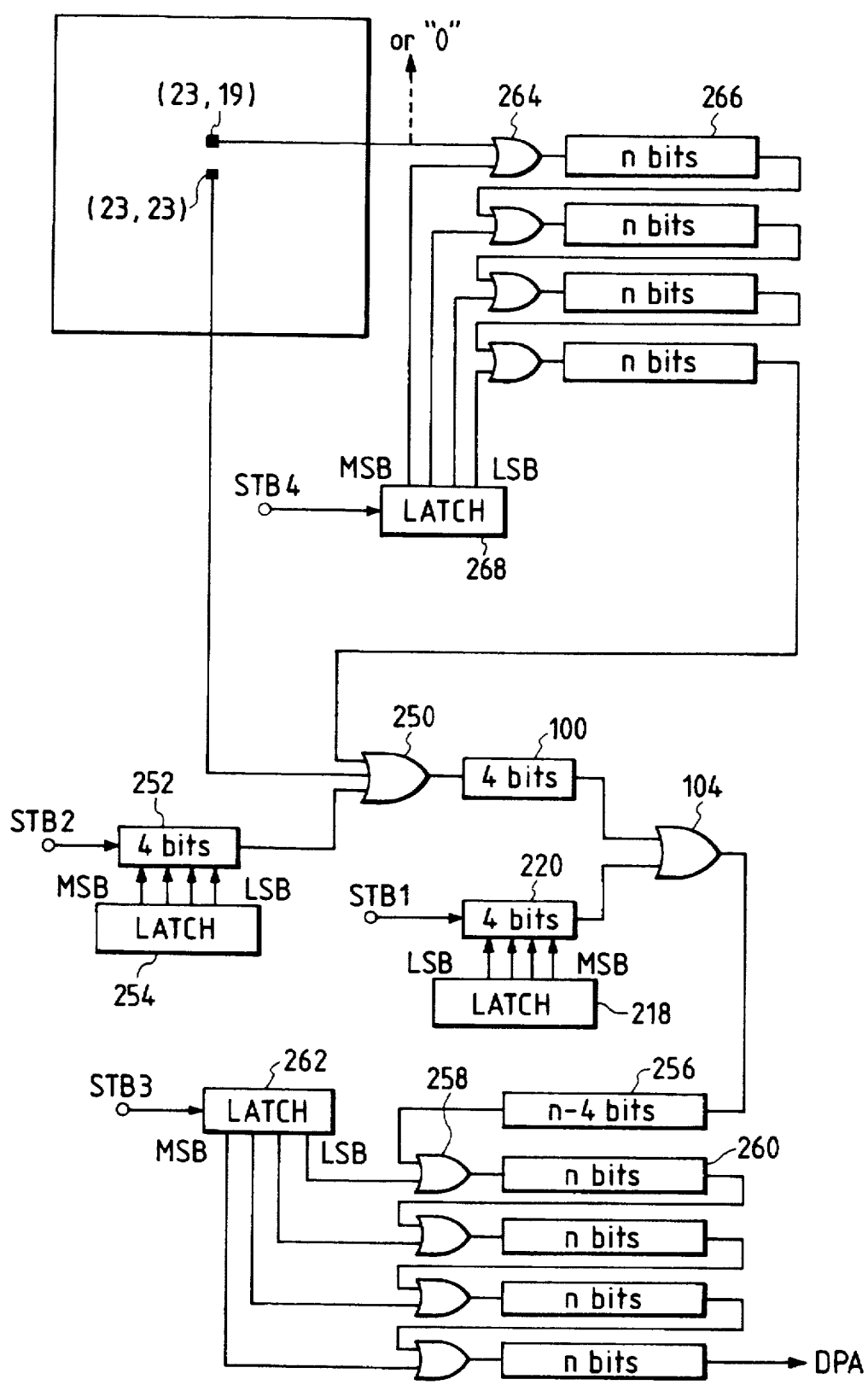
FIG. 27 is a block diagram showing a hardware circuit for a correction scheme according to the second embodiment.

FIG. 27 is a block diagram showing hardware for realizing the above algorithm. Referring to FIG. 27, an OR gate 104, 4-bit shift registers 100 and 220, and a latch circuit 218 are identical to those shown in FIG. 14. In this embodiment, serial bit data from the target bit (23,23) is input to a delay shift register 100 through a 3-input OR gate 250. A shift register 252 and a latch circuit 254 are arranged to expand this edge to the left within the extraction window (to perform correction in FIG. 24) when the target bit is located at the edge extending in the Y direction. The shift register 252 shifts the 4-bit data set in the latch circuit 254 in a direction from the MSB to the LSB in units of bits in response to clock pulses CK. A shift output is applied as one input to the OR gate 250. A strobe pulse STB2 is output in synchronism with the clock pulse CK when the left edge shown in FIG. 24 is determined to be expanded to the left within the extraction window. The data from the latch 254 is preset in the shift register 252 in response to the strobe pulse STB2. In response to the clock pulse CK generated next to the strobe pulse STB2, correction data having a maximum of 4 bits are sequentially output to the OR gate 250. After this, data of logic "0" is always output from the shift register 252. For example, the edge extending in the Y direction is to be expanded to the left by 2 bits within the extraction window, the latch circuit 254 stores data "0011" viewed from the MSB.

Four sets each consisting of an (n-4)-bit shift register 256 for receiving serial bit data from the OR gate 104, an OR gate 258, and an n-bit shift register 260 are arranged to further expand the lower pattern edge extending in the X direction within the extraction window, as shown in FIG. 25. The shift register 256 constitutes n bits (one line) together with the 4-bit shift register 100. An output from the shift register 256 is supplied to one input terminal of the 2-input OR gate 258, and output data from the OR gate 258 is input to the n-bit shift register 260. Similarly, a delay operation for a total of four lines is performed. Each of four bits of the data from a 4-bit latch circuit 262 is supplied to the other input terminal of a corresponding one of the four OR gates 258. Assume that the target bit (23,23) is located as shown in FIG. 25. Output data from the first OR gate 258 corresponding to a bit located immediately below and to the left of the target bit within the extraction window. Output data from the second OR gate 258 corresponds to a bit located immediately to the left of the target bit and below the target bit by two bits. Output data from the third OR gate 258 corresponds to a bit located immediately to the left of the target bit and below the target bit by three bits. Output data from the fourth OR gate 258 corresponds to a bit located immediately to the left of the target bit and below the target bit by four bits.

Only when a one-bit shift operation is performed in response to the next clock pulse CK, the correction bit data are respectively supplied to the inputs of the four OR gates 258 through the latch circuit 262. Upon reception of a strobe pulse STB3, the latch circuit 262 supplies the latched correction data to the four OR gates 258. All the bits of the correction data are set at logic "0" when the one-bit shift operations of the shift registers 256 and 260 are completed by the clock pulse generated next to the strobe pulse STB3. When the LSB of the latch circuit 262 is to be input to the first OR gate 258, and the edge (FIG. 25) extending in the X direction within the extraction window is to be expanded downward by two bits, data "0011" viewed from the MSB is stored in the latch circuit 262.

Finally corrected serial bit data DPA is output from the fourth shift register 260 and is stored in another area in the above-mentioned frame memory 3.

Finally, four sets each consisting of an OR gate 264 for extracting serial bit data from the bit (23,19) located above the target bit (23,23) by four bits within the extraction window to expand the pattern edge shown in FIG. 26 and an n-bit shift register 266 connected in series with the OR gate 264 are arranged. Of the four OR gates 264, three outputs from the OR gates except for the first OR gate correspond to three bits (23,20), (23,21), and (23,22) located below the bit (23,19) by one bit, two bits, and three bits, respectively. When the pattern edge shown in FIG. 26 is determined to be expanded upward, correction data is supplied from a 4-bit latch circuit 268 to the respective inputs of the four OR gates 264. The latch circuit 268 outputs correction data to the four OR gates 264 in response to a strobe pulse STB4. All the bits of the correction data are returned to the previous logic states when one-bit shifting is completed in response to the next clock pulse CK. When the LSB of the latch circuit 268 is to be output to the fourth OR gate 264 and the pattern edge at the target bit in FIG. 26 is to be expanded upward by two bits, data "0011" viewed from the MSB of the latch circuit 268 is stored in the latch circuit 268. The serial bit data supplied to the fourth n-bit shift register 266 are synthesized by the OR gate 250.

In FIG. 27, the strobe pulse STB1 supplied to the 4-bit shift register 220 is substantially identical to the strobe pulse STB shown in FIG. 14. The serial bit data passing through the four n-bit shift registers 266 are extracted from the bit (23,19) located above the target bit by four bits in FIG. 27, but this extraction need not be performed. That is, data in place of the data of the bit (23,19) to always output data of "0" may be applied to the first OR gate of the four OR gates 264. In this case, the serial bit data supplied to the OR gate 250 through the four shift registers 266 can be only correction bit data for the pattern edge.

The four strobe pulses STB1, STB2, STB3, and STB4 shown in FIG. 27 can be generated by four sets each basically comprising the EX-OR gate 212, the AND gates 206, 210, and 214, and the strobing circuit 216 in FIG. 14.

The second embodiment of the present invention has been described above. As is apparent from the above description, the second embodiment has higher productivity than the first embodiment. In either embodiment, the linear and wing-like test element portions are set in two regions symmetrically spaced apart from the target pixel by about the line width of the resolving limit, as shown in FIG. 12 or 21, thereby correcting the width of the pattern serving as the phase shift reticle light-shielding portion. However, the width of the transparent portion may be corrected.

Modification of EMBODIMENT 1 or 2

When a resist image of a line having an isolated portion is to be formed on a substrate applied with a negative resist in accordance with the phase shift method, the corresponding reticle has a line portion as a transparent portion (logic "0") and a surrounding portion as a light-shielding portion (logic "1"). In this case, the width of the isolated portion of the line is undesirably decreased. In order to correct this, the isolated portion of the transparent line on the reticle must be thickened. In the circuit of each embodiment described above, in order to increase the line width of the transparent portion (logic "0"), when serial bit data is to be loaded from the frame memory 3 to the extraction window shift register group SR1 in the correction device 10, an inverter (NOT) may be inserted at the position of the terminal A1 in FIG. 10, and at the same time an inverter (NOT) may be inserted to receive an output from the OR gate 114 or the output DPA in FIG. 27.

In each embodiment described above, the width of the isolated portion of the line pattern is increased. However, a portion other than the isolated portion may be thinned by a predetermined amount to obtain the same effect described above. In this case, the test element shown in FIG. 12 or 21 can be used without any modifications. When the target pixel is located at the edge of a given pattern, and boundaries are present between the transparent and light-shielding portions within the linear and wing-like test element portions, the edge is thinned inward from the edge position of the target pixel by a predetermined number of pixels. That is, an algorithm for forcibly inverting the portion having the logic value "1" in the design to a portion of logic "0".

In addition, by slightly modifying each embodiment described above, it is possible to automatically generate a subspace or auxiliary pattern around the isolated pattern so as to emphasize the outline. The transparent subspace pattern is located around the isolated pattern so as to sandwich the adjacent light-shielding portion with the isolated pattern, thereby obtaining a smaller size than the resolving limit. In order to add this subspace pattern, several bits (on the LSB side) of the correction data set in each of the latch circuits 218, 254, 262, and 268 described in FIGS. 14 and 27 are always set at "0", and data of "1", the number of which corresponds to the number of pixels corresponding to the size of the subspace pattern, may be arranged on the MSB side.

The above correction need not be performed for all the pattern data in one reticle, but for some specific pattern data.

The pattern data stored in the apparatus of the present invention need not be all data for portions subjected to correction. Only partial data blocks may be stored. After the above portions are corrected, the corrected data may be stored in an auxiliary device. Only data of the next block may be read out, and the readout data may be processed.

A real practical reticle pattern is obtained by repeatedly using a plurality of pattern elements having identical shapes and sizes. Pattern correction of the same pattern elements may be performed once, and the corrected pattern data may be repeatedly used.

In the above embodiments, pattern correction is performed by the hardware logic (FIGS. 10, 13A, 13B, and 14). However, a software algorithm having the same function as the hardware logic may be used to perform pattern correction.

EMBODIMENT 3

A reticle pattern correction method effective upon combination with the SHRINC method, the patent application of which was filed by the present inventor, will be described below. Before a description of the reticle pattern correction method, the arrangement of a projection exposure apparatus employing the SHRINC method will be described first.

(1) Principle of SHRINC Method

Figure 28:
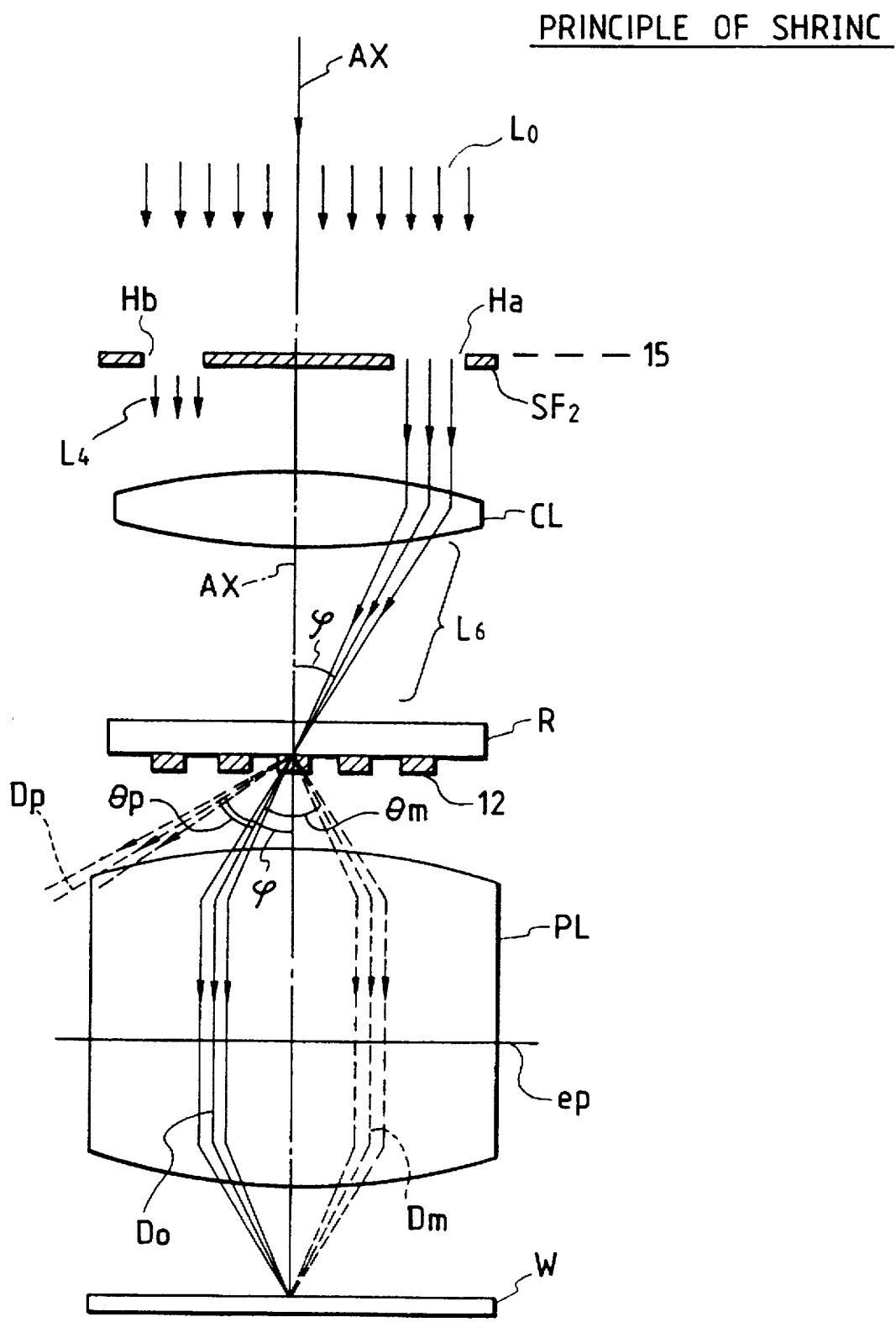
FIG. 28 is a view for explaining the principle of a SHRINC method employed in a projection exposure apparatus which may be used as in the third embodiment.

A projection exposure apparatus employing the SHRINC method is arranged in principle, as shown in FIG. 28. The reference numerals as in FIG. 1 or 2 denote the same parts in FIG. 28. Referring to FIG. 28, illumination light $L_0$ illuminates patterns 12 of a reticle R through a spatial filter $SF_2$ having four openings and a condenser lens CL. In this case, the spatial filter $SF_2$ is located at or near an illumination system pupil plane 15. Opening transmission portions Ha (and Hb) of the spatial filter $SF_2$ are shifted from an optical axis AX of the illumination or projection optical system in accordance with a degree of micropatterning of the patterns 12 on the reticle R and a periodic direction. The illumination light $L_0$ is limited to local illumination light $L_6$ (and $L_4$) having its center shifted from the optical axis AX of the illumination or projection optical system within or near the illumination pupil plane 15. The position of the illumination light $L_6$ within or near the illumination system pupil plane 15 determines the angle of direction of the light $L_6$ incident on the reticle R. In the SHRINC method, it is possible to arbitrarily control the incident angle φ and incident direction of the light $L_6$ incident on the reticle R by changing the transmission position (positions of the openings Ha and Hb) of the illumination light $L_6$ within or near the illumination system pupil plane 15. The reticle patterns 12 depicted on the reticle (mask) R typically contain a large number of periodic patterns. Therefore, a 0th-order diffracted light component D0, (±) 1st-order diffracted light components Dp, Dm and other higher-order diffracted light components are generated in directions corresponding to degrees of fineness of the patterns from the reticle patterns 12 illuminated with the light $L_6$. The illumination luminous fluxes (central line or principal ray) are incident on the reticle R at an inclined angle. Hence, the diffracted light component of the respective orders are also generated from the reticle patterns 12 with an inclination (angular deviation) as compared with the vertical illumination. The illumination light L6 shown in FIG. 28 is incident on the reticle R with an inclination φ to the optical axis.

The illumination light L6 is diffracted by the reticle patterns 12, thereby generating a 0th-order diffracted light component Do traveling in a direction with the inclination φ to the optical axis AX, a (+) 1st-order diffracted light component Dp with an inclination θp to the 0th-order diffracted light component and a (−) 1st-order diffracted light component Dm traveling with an inclination θm to the 0th-order diffracted light component Do. The illumination light L6 is, however, incident on the reticle patterns at the inclined angle φ to the optical axis AX of the projection optical system PL both sides of which are telecentric. For this reason, the 0th-order diffracted light component Do also travels in the direction inclined at the angle φ to the optical axis AX of the projection optical system.

Hence, the (+) 1st-order diffracted light component Dp travels in a direction of (θp+φ) to the optical axis AX, while the (−) 1st-order diffracted light component Dm travels in a direction of (θm−φ) to the optical axis AX.

The diffracted angles θp, θm are expressed as:

$$\sin(\theta p+\phi)-\sin\phi=\lambda/P \quad (2)$$

$$\sin(\theta m-\phi)+\sin\phi=\lambda/P \quad (3)$$

where it is assumed that both of the (+) 1st-order diffracted light component Dp and (−) 1st-order diffracted light component Dm pass through a pupil surface (the Fourier transform surface of the reticle patterns) ep of the projection optical system PL.

When the diffracted angle increases with finer reticle patterns 12, the (+) 1st-order diffracted light component Dp traveling in the direction inclined at the angle of (θp+φ) at first becomes incapable of passing the pupil surface ep of the projection optical system PL. Namely, there is developed a relation such as sin (θp+φ)>$NA_R$. A beam of illumination light $L_6$ is incident with an inclination to the optical axis AX, and hence the (−) 1st-order diffracted light component Dm is capable of incidence on the projection optical system PL even at the diffracted angle of this time. Namely, there is developed a relation such as sin (θm−φ)<$NA_R$.

Produced consequently on the wafer W are interference fringes by two luminous fluxes of the 0th-order diffracted light component Do and the (−) 1st-order diffracted light component Dm. The interference fringes are perceived as an image of the reticle patterns 12. A contrast of approximately 90% is obtained when the reticle patterns 12 have a line-and-space of 1:1, and forming of the image of the reticle patterns 12 can be effected on a resist layer applied over the wafer W. The best image quality is obtained when the incident angle φ is adjusted half of the diffraction angle θm (θp).

A resolving limit is given by:

$$\sin(\theta m - \phi) = NA_R \qquad (4)$$

Hence, a reticle-side pitch of the transferable minimum pattern is given by:

$$NA_R + \sin\phi = \lambda/P$$

$$P = \lambda/(NA_R + \sin\phi) \qquad (5)$$

Now, supposing that sin φ is set to approximately 0.5× $NA_R$ as one example, the transferable minimum pitch of the pattern on the reticle is given by:

$$P = \lambda/(NA_R + 0.5NA_R) \qquad (6)$$
$$= 2\lambda/3NA_R$$

On the other hand, in the case of a known projection exposure apparatus (as shown in FIG. 1) in which a distribution of illumination light on the Fourier transform surface 15 of the illumination optical system falls within a circular range (or rectangular range) about the optical axis AX, the resolving limit is expressed by sin θm=λ/P≈$NA_R$. The minimum pitch is given by P≈λ/$NA_R$ as mentioned at equation (1). It can be therefore understood that the projection type exposure apparatus using SHRINC method attains a higher resolving power than in the known exposure apparatus.

The following is an elucidation about why a focal depth becomes large on the basis of the SHRINC method, which forms patterns on the wafer by use of the 0th-order diffracted light component and one of the 1st-order diffracted light component while the reticle patterns are irradiated with the exposure light in a specific incident direction at a specific incident angle.

As illustrated in FIG. 1, when the wafer W is coincident with the focal position (the best image forming surface) of the projection optical system PL, all the individual diffracted light components emerging from one point of the reticle patterns 12 and reaching one point on the wafer W, even if they pass through any part of the projection optical system PL, have an equal length of light path. For this reason, even when the 0th-order diffracted light component penetrates substantially the center (in the vicinity of the optical axis AX) of the pupil surface ep of the projection optical system PL, the 0th-order diffracted light component and other diffracted light components are equal in terms of lengths of their light paths, and a mutual wave front aberration is zero. When the wafer W is in a defocus state (the wafer W does not coincide with the focal position of the projection optical system PL), and, the lengths of the high-order diffracted light components obliquely falling thereon are short in front of the focal point (far from the projection optical system PL) as compared with the 0th-order diffracted light component passing in the vicinity of the optical axis. Whereas in rear of the focal point (closer to the projection optical system PL), the lengths increase. A difference therebetween corresponds to a difference between the incident angles of each diffraction light reaching to the wafer. Hence, the 0th-order, 1st-order, . . . diffracted light components mutually form the wavefront aberration, resulting in reduced sharpness in front and in rear of the focal point.

The wavefront aberration caused by the defocus described above is defined as a quantity given by $\Delta F r^2/2$, where $\Delta F$ is the amount of deviation between the focal plane and the wafer W, and r (r=sin θw) is the sine of an incident angle θw of the individual diffracted light component. At this time, r represents a distance from the optical axis AX on the pupil surface ep. In the conventional known projection type exposure apparatus (FIG. 1), the 0th-order diffracted light component Do passes in the vicinity of the optical axis AX, and hence r (0th-order)=0. On the other hand, in the (±) 1st-order diffracted light components Dp, Dm, r (1st-order)=M λ/P (M is the magnification of the projection optical system).

Therefore, the wavefront aberration due to defocusing of the 0th-order diffracted light component Do and the (±) 1st-order diffracted light components Dp, Dm is given by:

$$\Delta F \cdot M^2 (\lambda/p)^2/2$$

On the other hand, in the projection type exposure apparatus using SHRINC method as illustrated in FIG. 28, the 0th-order diffracted light component Do is generated in the direction inclined at the angle φ to the optical axis AX. Thus, the distance of the 0th-order diffracted light component from the optical axis AX on the pupil surface ep is expressed such as r (0th-order)=M·sin φ.

Further, the distance of the (−) 1st-order diffracted light component Dm from the optical axis on the pupil surface ep is expressed such as r (−) 1st-order=M·sin φ(θm−φ). At this time, if sinφ=sin (θm−φ), namely θm=2, a relative wavefront aberration due to defocusing of the 0th-order diffracted light component Do and the (−) 1st-order diffracted light component Dm becomes zero. Even when the wafer W deviates slightly in the optical-axis direction from the position of the focal plane, it follows that the unsharp image of the patterns 12 does not become larger than in the prior art. Namely, the focal depth is increased. As shown in the formula (3), sin (θm−φ)+sin φ=λ/P, and hence it is possible to remarkably increase the focal depth on condition that the incident angle φ of the illumination luminous flux L6 to the reticle R is made to have a relation such as sin φ=λ/2P with respect to the patterns having the pitch P.

Herein, according to above principle, in the actual apparatus, two luminous fluxes L6, L4 are incident on the reticle R having one dimensional line and space patterns at the inclined angle φ in symmetry with respect to the optical axis of the projection optical system or the illumination optical system as shown in FIG. 28. Generated from the patterns 28 are the 0th-order diffracted light component Do, a (−) 1st-order light component Dm and a (+) 1st-order light component Dp.

The incident angle φ is prescribed by a numerical aperture NA of the projection optical system as well as by the reticle patterns 12. As expressed in the formula (5), this incident angle is selectively set to an angle corresponding to the diffraction angle for the minimum pitch value of the reticle pattern. The incident direction is desirably set to a pitch direction of the line and space patterns formed on the reticle R.

(2) Configuration of SHRINCed Stepper

The SHRINC method using a one-dimensional line and space pattern has been described in FIG. 28. In practice, a two-dimensional (i.e., an x-y plane) line and space pattern is formed on a reticle. An optimal arrangement of a projection exposure apparatus (stepper) for projecting and exposing a reticle pattern will be described with reference to FIGS. 29 to 33D.

Figure 29:
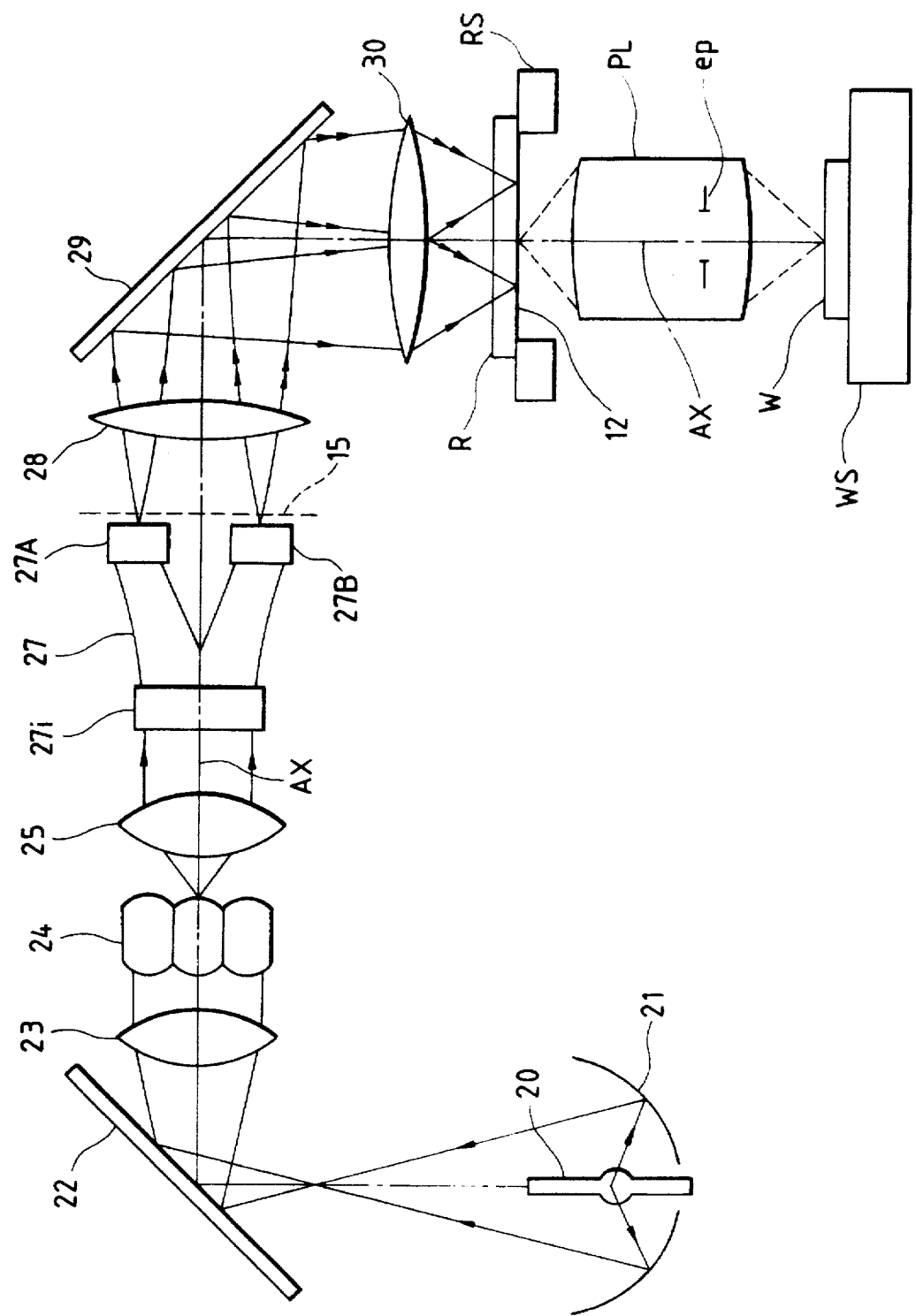
FIG. 29 is a view showing an arrangement of a projection exposure apparatus used in the third embodiment.

Referring to FIG. 29, light generated by a light source 20 is reflected by an elliptical mirror 21 and a reflecting mirror 22 and is then incident on a fly-eye lens 24 through a lens system 23. Light emerging from the fly-eye lens 24 is incident on a beam splitter or fiber bundle 27 through a relay lens 25. The fiber bundle 27 splits light received from an incident portion 27i into a plurality of beams. The plurality of beams emerge from a plurality of exit portions 27A and 27B. The exit surfaces of the exit portions 27A and 27B are located on or near a Fourier transform plane (i.e., the pupil plane of the illumination optical system) 15 defined by a composite system consisting of lens systems 28 and 30 and a reflecting mirror 29 with respect to the surface of the patterns 12 of the reticle R. Although only two exit portions 27A and 27B are illustrated, four exit portions are formed in practice.

A distance between an optical axis AX and the central position of each of the exit portions 27A and 27B is determined by the incident angle of the illumination light on the reticle R. The plurality of beams emerging from the exit portions 27A and 27B illuminate the reticle R at predetermined incident angles through the lens system 28, the reflecting mirror 29, and the lens system 30. The reticle R is placed on a reticle stage RS. Light diffracted by each pattern 12 of the reticle R is focused on a wafer W through a projection optical system PL, thereby transferring an image of each pattern 12. The wafer W is placed on a wafer stage WS which is two-dimensionally movable within a plane perpendicular to the optical axis AX, so that the transfer area of the pattern 12 can be sequentially moved. Note that the illumination optical system of the exposure apparatus includes a shutter for controlling an amount of light incident on the reticle R and a photometer.

The exit portions 27A and 27B in FIG. 29 correspond to the openings Ha and Hb of the spatial filter $SF_2$ in FIG. 28.

The light source 20 comprises a bright line lamp (e.g., a mercury lamp) or a laser source.

In the above arrangement, the light source 20 is conjugate with the exit surface (plane substantially conjugate with the pupil plane 15 of the illumination optical system) of the fly-eye lens 24, the exit surface (pupil plane 15) of the fiber bundle 27, and a pupil plane ep of the projection optical system PL. At the same time, the incident surface of the fly-eye lens 24, the incident surface of the fiber bundle 27, the pattern surface of the reticle R, and the transfer surface of the wafer W are conjugate with each other.

Another fly-eye lens maybe added on the reticle R side farther away from the fiber bundle 27, i.e., near the exit surfaces of the exit portions 27A and 27B to achieve more uniform illumination. In this case, the fly-eye lens may be a single fly-eye lens or constituted by a plurality of fly-eye lens groups respectively arranged at the exit ends. A wavelength selection element (e.g., an interference filter) may be added in the illumination optical system in accordance with correction states of chromatic aberration of the projection optical system PL and the elements 21 to 30 of the illumination optical system.

When the reticle R is illuminated using the above apparatus, the beams emerging from the exit portions 27A and 27B of the fiber bundle 27 are incident on the reticle R at the predetermined incident angles. For this reason, of the (±) 1st-order diffracted light components generated by the patterns of the reticle, the (+) or (−) 1st-order diffracted light component and the 0th-order diffracted light component, i.e., a total of two light components, can pass through the pupil plane ep of the projection optical system. Finer patterns having smaller pitches can be resolved. In the SHRINC method, it is important to illuminate the reticle pattern at the incident direction and angle corresponding to the pitch and direction of pitch of the periodic pattern on the reticle. For this reason, the exit portions 27A and 27B are preferably moved within the pupil plane 15, as shown in FIGS. 30 and 31.

Figure 30:
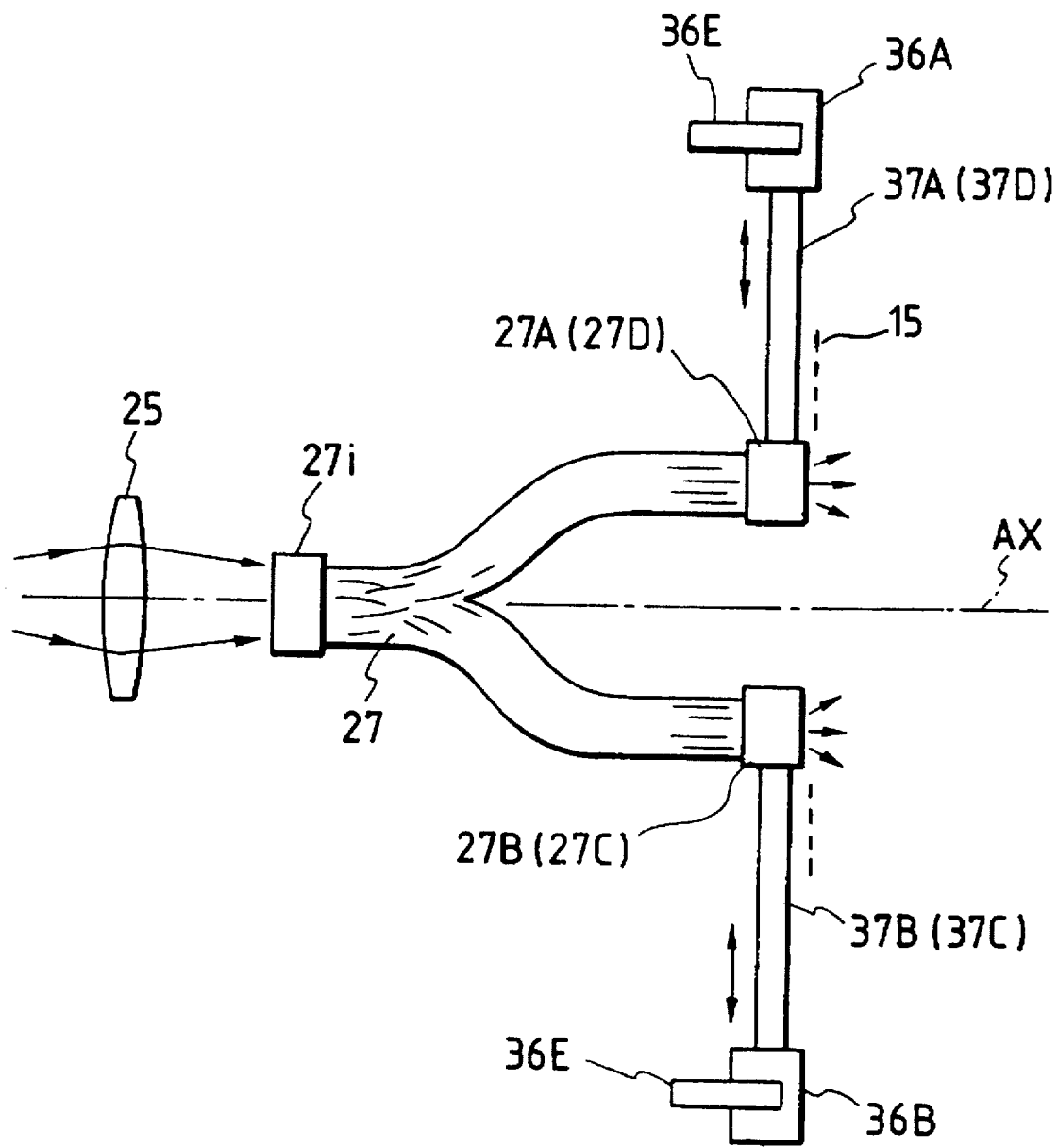
FIG. 30 is a view showing part of an illumination optical system of the apparatus shown in FIG. 29.
Figure 31:
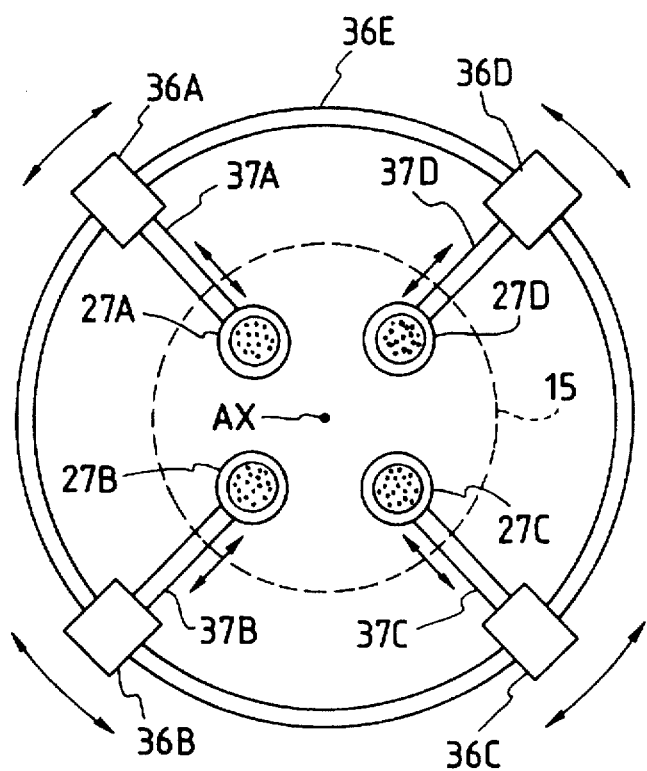
FIG. 31 is a view showing the arrangement of FIG. 30 when viewed from the optical axis.

In FIG. 30, the configurations towards the light source from the relay lens 25 and towards the reticle from the lens system 28 are the same as those shown in FIG. 29. The illumination light emerging from the light source and penetrating the relay lens 25 is incident via an incident portion 27i on the optical fiber bundle 27 while being adjusted to a predetermined numerical aperture (NA). The illumination luminous fluxes incident via the incident portion 27i on the optical fiber bundle 27 are split into four luminous fluxes and exit from four pieces of exit portions 27A, 27B, 27C, 27D. The four exit portions 27A–27D are provided in positions eccentric from the optical axis AX on the Fourier transform plane (pupil plane of the illumination optical system) 15.

At this time, lenses (e.g., field lenses) may be located before the exit portions 27A–27D respectively.

As discussed above, the incident angles of the illumination light falling on the reticle R are determined by the positions (eccentric from the optical axis AX) of the exit portions 27A–27D within the plane perpendicular to the optical axis AX. For this reason, the exit portions 27A–27D are independently movable with the aid of movable members 36A–36D for adjusting the positions of the exit portions 27A–27D within the Fourier transform plane.

Next, an embodiment of the movable structure of the fiber exit portions will be explained with reference to FIG. 31. FIG. 31 is a plan view taken substantially in the optical-axis direction.

Employed herein are of fiber exit portions 27A, 27B, 27C, 27D as a means for creating an arbitrary light quantity distribution on the Fourier transform plane 15. The respective fiber exit portions are in discrete positions eccentric from the optical axis AX and are disposed at substantially equal distances from the optical axis AX. Turning to FIGS. 30 and 31, the fiber exit portions 27A, 27B, 27C, 27D are extendible and retractable in the direction perpendicular to the optical axis AX by means of drive elements such as motors and gears which are incorporated into the movable members 36A, 36B, 36C, 36D through support bars 37A, 37B, 37C, 37D. The movable members 36A, 36B, 36C, 36D themselves are also movable in the circumferential direction about the optical axis AX along a fixed annular guide 36E. Therefore, the individual fiber exit portions 27A–27D are independently movable in the plane perpendicular to the optical axis. movable to arbitrary positions (so as not to overlap with each other). The respective positions (within the plane perpendicular to the optical axis AX) of the fiber exit portions 27A–27D shown in FIGS. 30 and 31 are changed preferably in accordance with the reticle patterns to be exposed. Exit surfaces of the exit portions may be formed with the light scattering members such as diffusion plates and with aperture spots for regulating the apertures.

Figure 32:
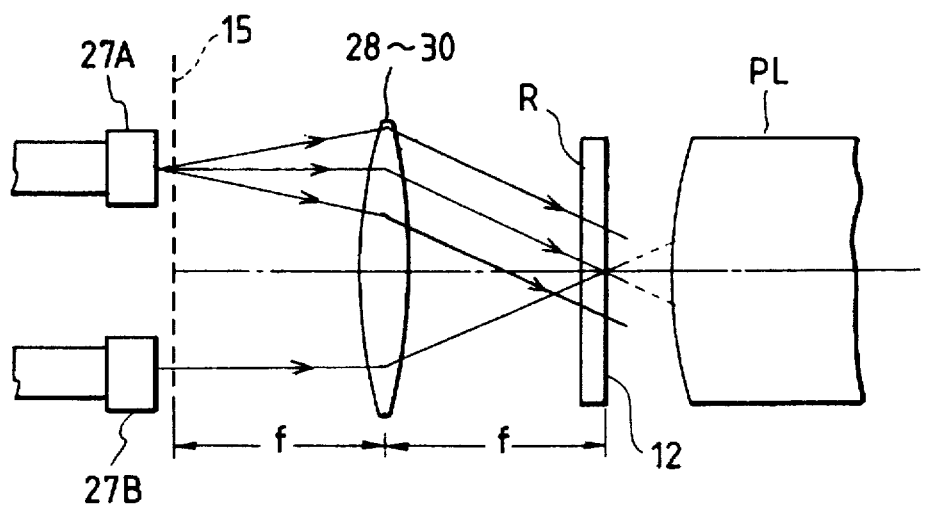
FIG. 32 is a schematic view showing optical paths of part of the illumination optical system of the apparatus shown in FIG. 29.

By exemplifying a case where the optical fibers are used herein as a luminous flux transform member, there will be next explained a concrete example of determining the position, (gravity position of the light quantity distribution created by one luminous flux incident on the Fourier transform plane). The explanation will be given with reference to FIG. 32 and FIGS. 33A through 33D. FIG. 32 is a diagram schematically illustrating a portion from the exit portions 27A, 27B to the reticle patterns 12. The exit surfaces coincide with the Fourier transform plane 15. For simplicity, FIG. 32 shows elements in FIG. 29 for bringing the exit surfaces, into the Fourier transform relation as a single lens (28–30). Further, it is assumed that f shown in FIG. 32 is the focal length of that single lens (28–30), and Fourier transform plane 15 is located at the front focal plane while the reticle pattern surface 12 is located at the rear focal plane.

Figure 33A:
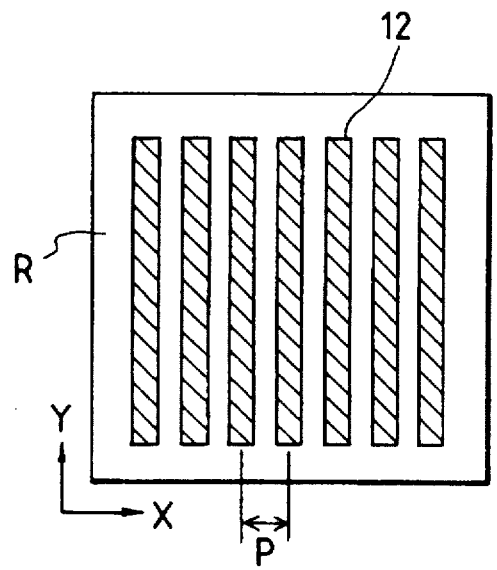
FIGS. 33A to 33D show pattern shapes on reticles and optimal secondary source positions on Fourier transform planes of the illumination optical system.
Figure 33C:
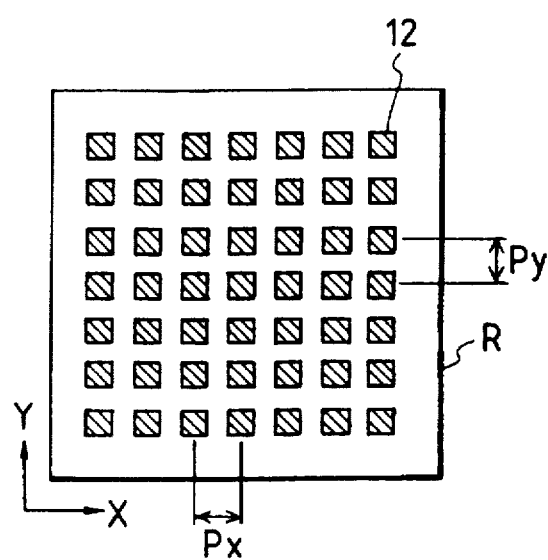
Figure 33B:
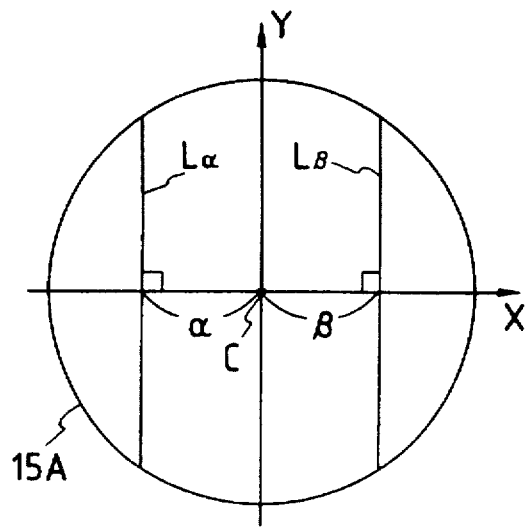
Figure 33D:
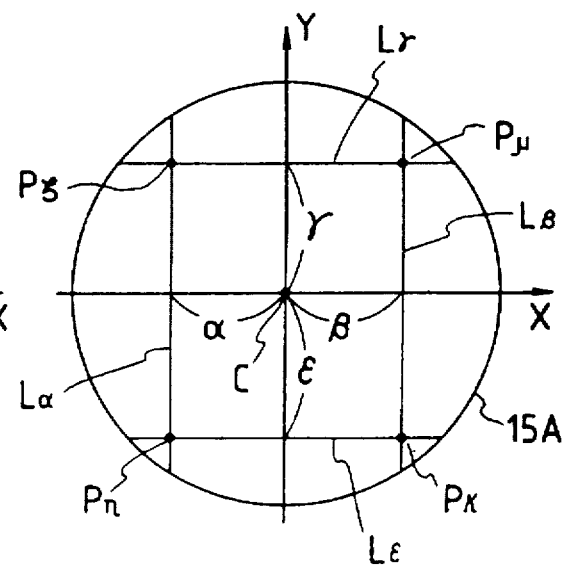

FIGS. 33A and 33C are diagrams each showing an example of some patterns formed in the reticle patterns 12. FIG. 33B illustrates the location of central position (the optimum position) of a peak value of the light quantity distribution on the Fourier transform plane 15 (or the pupil plane ep of the projection optical system PL) which is optimal to the reticle patterns of FIG. 33A. FIG. 33D is a diagram illustrating the location of central positions (gravity positions of the light quantity distribution created by each of four luminous fluxes incident on the Fourier transform plane) of the exit portions 27A–27D, which is optimal to the reticle patterns of FIG. 33C. FIG. 33A depicts so-called one-dimensional line-and-space pattern wherein the transmissive portions and light shielding portions (hatched) are arranged with equal widths to assume a striped configuration in the direction Y and also regularly arranged at pitch P in the direction X. Referring to FIG. 33B, at least two exit portions are used fundamentally. The central position of one exit portion of the fiber bundle 27 is, as illustrated in FIG. 33B, in an arbitrary position on a line segment Lα, and the central position of another one exit portion of the fiber bundle 27 is in an arbitrary position on a line segment Lβ, where the line segments Lα, Lβ are presumed within the Fourier transform plane 15 along the Y-direction. FIG. 33B is a diagram showing a circular area 15A of the Fourier transform plane 15 associated with the pattern surface of the reticle R, which is viewed substantially in the optical-axis direction AX. Coordinate systems X, Y within the Fourier transform area 15A are identical with those in FIG. 33A, wherein the reticle patterns 12 are observed in the same direction. Now, the distances α, β from the center C through which the optical axis AX passes to the respective line segments Lα, Lβ have a relation such as α=β. These distances are equal such as: α=β=f·(½)·(λ/P), where λ is the exposure wavelength and f is the focal length shown in FIG. 32. When the distances α, β are expressed as f·sin φ, sin φ=λ/2P. This is identical with the numerical value explained in FIG. 28. Hence, the plurality of exit portions are provided, and the respective central positions of the individual exit portions are on the line segments Lα, Lβ. On this assumption, it follows that the two diffracted light components i.e., the 0th-order diffracted light component generated from the illumination light coming from the respective exit portions and any one of the (±) 1st-order diffracted light components pass through the position having almost equal distances from the optical axis AX on the pupil plane ep of the projection optical system with respect to the line-and-space patterns shown in FIG. 33A. Therefore, as discussed above, the focal depth with respect to the line-and-space patterns (FIG. 33A) can be maximized, and the high resolving power is also obtainable. Note that one exit portion (secondary illuminant plane) of the fiber bundle 27 to be formed on each of the line segments Lα, Lβ may suffice if a positional deviation concomitant with the defocus of the wafer W is ignored. In practice, however, it is preferable in FIG. 33B that the central points of the two exit portions are respectively arranged on lines Lα and Lβ to be symmetrical about a point C through which the optical axis AX passes.

Next, FIG. 33C shows a case where the reticle patterns 12 are so-called two-dimensional periodic patterns wherein Px is the X-directional (lateral) pitch of the patterns, and Py is the Y-directional (vertical) pitch thereof. FIG. 33D is a diagram illustrating the optimum position of the four exit portions 27A–27D in the Fourier transform area 15A, corresponding to the pattern of FIG. 33D. The translational rotational relationship between FIGS. 33C and 33D is the same as that of FIGS. 33A and 33B. Referring to FIG. 33C, when the illumination light falls on the two-dimensional patterns, the diffracted light components are generated in the two-dimensional directions corresponding to periodicity (X:Px Y:Py) of the patterns. Even in the two-dimensional patterns shown in FIG. 33C if the 0th-order diffracted light component and any one of the (±) 1st-order diffracted light components pass the pupil plane ep of the projection optical system PL so as to have almost equal distances from the optical axis AX on the pupil plane ep, the focal depth can be maximized. In the patterns of FIG. 33C, the X-directional pitch is Px. Therefore, as shown in FIG. 33D, if the centers of the respective exit portions are on the line segments Lα, Lβ defined such as α=β=f·(½)·(λ/Px), the focal depth can be maximized with respect to the X-directional elements of the patterns. Similarly, if the centers of the respective exit portions are on line segments Lγ, Lε defined such as γ=ε=f·(½)·(λ/Py), the focal depth can be maximized with respect to the Y-directional elements of the patterns.

When the illumination luminous fluxes corresponding to the exit portions 27A–27D disposed in the respective positions shown in FIGS. 33B and 33D are incident on the reticle patterns 12, the 0th-order diffracted light component Do and any one of a (+) 1st-order diffracted light component Dp and a (−) 1st-order diffracted light component. Dm pass through the light paths having the equal distances from optical axis AX on the pupil plane ep of the projection optical system PL. Consequently, as stated in conjunction with FIG. 28, it is possible to realize a projection type exposure apparatus with a high resolving power and a large focal depth. Only two examples of the reticle patterns 12 shown in FIGS. 33A and 33B have been considered so far. With other patterns as well, however, attention is paid to the periodicity (degree of fineness) thereof. The respective exit portions 27A–27D may be disposed in such positions that two luminous fluxes i.e., the 0th-order diffracted light component and any one of the (+) 1st-order diffracted light component and the (−) 1st-order diffracted light component travel through the light paths having the substantially equal distances from the optical axis AX on the pupil plane ep of the projection optical system PL. Provided in the pattern examples of FIGS. 33A and 33C are the patterns having a ratio (duty ratio), 1:1, of the line portion to the space portions. Consequently, (+) 1st-order diffracted light components become intense in the diffracted light generated. For this reason, the emphasis is placed on the positional relation between one of the (±) 1st-order diffracted light components and the 0th-order diffracted light component. In the case of being different from the duty ratio of 1:1, however, the positional relation between other diffracted light components, e.g., one of (+) 2nd-order diffracted light components and the 0th-order diffracted light component may be set to give the substantially equal distances from the optical axis AX on the projection optical system.

If the reticle patterns 12, as seen in FIG. 33D, contain two-dimensional periodic patterns, when paying the attention to one specific 0th-order diffracted light component, there probably exist higher-order diffracted light components than the 1st-order light components which are distributed in the X-direction and in the Y-direction about the 0th-order diffracted light component on the pupil plane ep of the projection optical system PL. Supposing that the image of the two-dimensional patterns is formed well with respect to one specific 0th-order diffracted light component, the position of the specific 0th-order diffracted light component may be adjusted so that three light components i.e., one of the higher-order (or 1st-order) diffracted light components distributed in the X-direction, one of the higher-order (or 1st-order) diffracted light components distributed in the Y-direction, and one specific 0th-order diffracted light component are distributed at substantially equal distances from the optial axis AX on the pupil plane ep of the projection optical system PL. For instance, the central position of the exit portions 27A–27D in FIG. 33D is arranged to coincide with any one of points P$\xi$, P$\eta$, P$\kappa$, P$\mu$. The points P$\xi$, P$\eta$, P$\kappa$, P$\mu$ are all intersections of the line segment L$\alpha$ or L$\beta$ (the optimum position to the X-directional periodicity, i.e., the position in which the 0th-order diffracted light component and one of the (±) 1st-order diffracted light components in the X-direction have substantially equal distances from the optical axis AX (point C) on the pupil plane ep of the projection optical system PL) and line segments L$\gamma$, L$\epsilon$ (the optimum positions to the Y=direction periodicity). Therefore, those positions are the light source central positions optimal to either the pattern pitch direction X or the pattern pitch direction Y.

Presumed in the above-described arrangement are the patterns as two-dimensional patterns having the two-dimensional directivities at the same place on the reticle. The aforementioned method is applicable to a case where a plurality of patterns having different directivities exist in different positions in the same reticle patterns.

Where the patterns on the reticle have the plurality of directivities and degrees of fineness, the optimum position of the secondary illuminant image (exit portions 27A–27D), as explained earlier, corresponds to the respective directivities and degrees of fineness the patterns. Alternatively, however the secondary illuminant image may be in the averaged position of the respective optimum positions. This averaged position may also undergo load averaging in which a weight corresponding to the significance and degree of fineness of the pattern is added.

AS described above, when the position of the illumination light (i.e., the positions of the exit portions 27A to 27D) within the pupil plane 15 of the illumination optical system is determined, the maximum depth of focus can be obtained for each of the various reticle patterns. The pitches and directions of generally used reticle patterns are common in several types of semiconductor integrated circuits. For example, reticles patterns corresponding to the integration densities such as 1 Mbit, 4 Mbits, and 16 Mbits are prepared for memory elements. Some of these reticle patterns are common to each other. Reticle patterns are also classified in accordance with access time and word structures. However, the pattern pitch of memory elements manufactured in one production line (including the projection exposure apparatus) within a given period of time (e.g., about several months to about one year) is almost predetermined regardless of the above types at present. In practice, the exit patterns 27A to 27D need not be moved in correspondence with the respective reticle patterns to optimize the illumination system. No problems are posed even if the positions of the exit portions 27A to 27D are fixed to optimize the average depth of focus for at least some pitches and directions of all the reticle patterns used within the above given period of time. In this case, since optimal illumination conditions for all the reticle patterns are slightly different from each other, the actual depths of focus are degraded with respect to the optimal depth of focus. However, these actual depths of focus have large values and do not pose any practical problem.

The illumination beams from the exit portions 27A to 27D are preferably incident symmetrically about the optical axis AX because lateral shifts (so-called telecentric shifts) of the reticle pattern images projected on the wafer W can be prevented even if a small defocus amount is present on the wafer W.

(3) Deformation of Resist Pattern by SHRINC Method

When the periodic patterns 12 on the reticle R are illuminated and are exposed through the projection optical system PL in accordance with the SHRINC method, relatively inner portions of each periodic pattern 12 can be exposed to obtain good pattern images having accurate design sizes. However, an end portion of the periodic pattern (i.e., an end portion of a pattern element of the periodic pattern in a direction perpendicular to the periodic direction) is exposed to result in deformation (e.g., tapered deformation or thinning) of a resist pattern. Both side portions of a periodic pattern (i.e., both sides of periodic pattern elements in the periodic direction) are exposed to result in thin resist patterns each having a smaller line width than the design value.

Figure 34A:
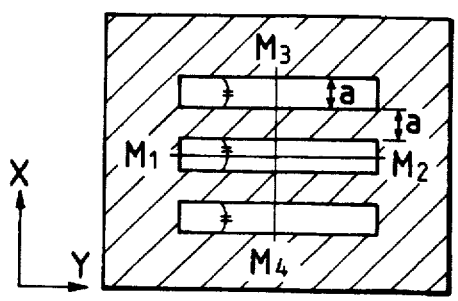
FIGS. 34A, 34B, 34C, 34D, 34E, 34F, 34G, and 34H are views showing a relationship between a pattern on a reticle, an intensity distribution of a projected image, and a resist image.
Figure 34E:
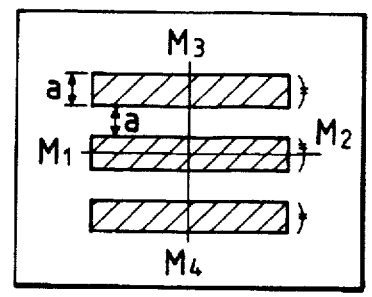
Figure 34B:
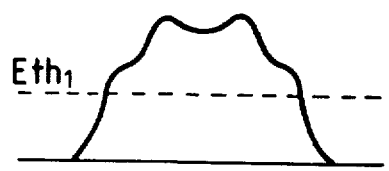
Figure 34F:
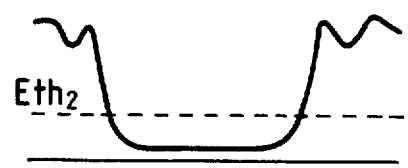
Figure 34C:
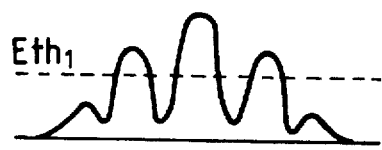
Figure 34G:
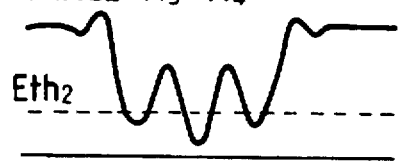

FIGS. 34A to 34H show deformation of the periodic patterns. FIG. 34A shows a one-dimensional periodic pattern consisting of three slit-like transparent pattern elements formed in a light-shielding portion (hatched portion). FIG. 34E shows a one-dimensional periodic pattern consisting of three slit-like light-shielding pattern elements (hatched portions) formed in a transparent layer. The patterns shown in FIGS. 34A and 34E are formed to have values (i.e., values obtained by multiplying the projection magnification) obtained by converting the preferable resist image sizes upon exposure and transfer of the patterns on the wafers into values on the reticle side. These converted values of the preferable resist images on the reticle side are called "design values" hereinafter. Each of the patterns shown in FIGS. 34A and 34E is a line-and-space pattern consisting of pattern elements arranged at a pitch 2a in a duty ratio of 1:1. FIGS. 34B and 34F show light amount distributions (optical images) on the wafer surfaces along the lines M1–M2 of the patterns shown in FIGS. 34A and 34E, respectively. FIGS. 34C and 34G show optical images on the surface of the wafer along the lines M3–M4 of the patterns shown in FIGS. 34A and 34E, respectively. A broken line Eth1 in each of FIGS. 34B and 34C represents an exposure amount required to perfectly leave the negative resist. A broken line Eth2 in each of FIGS. 34F and 34G represents an exposure amount required to perfectly leave a positive resist.

Figure 34D:
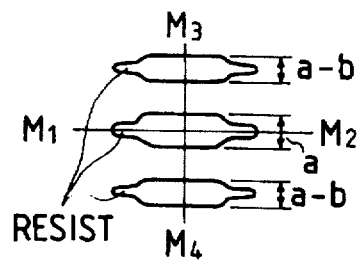
Figure 34H:
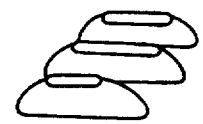

FIG. 34D is a plan view of a negative resist image obtained by exposing the pattern shown in FIG. 34A on a negative resist film, and FIG. 34H is a perspective view of a positive resist image obtained by exposing the pattern shown in FIG. 34E on a positive resist film. In this case, the illumination condition is optimized for the patterns shown in FIGS. 34A and 34E. A line width a is about a resolving limit of a micropattern transferred onto a wafer by using the projection exposure apparatus (FIGS. 29 to 32) employing the SHRINC method. For example, when a line pattern is to be formed using the negative resist, the light amount at the end portion of the pattern in the longitudinal direction decreases, as shown in FIG. 34B. For this reason, the resultant negative resist image is tapered at end portions in the longitudinal direction, as shown in FIG. 34D.

In addition, as shown in FIG. 34C, since the light intensities of the end pattern elements of the three pattern elements shown in FIG. 34A decrease, the negative resist images of the end pattern elements have a smaller line width than that of the central pattern element by a predetermined amount b.

When a line pattern is to be formed using a positive resist, the optical image of the pattern in the longitudinal direction has large light amount distributions at end portions thereof, and a sufficient light-shielding effect at these portions cannot be obtained, as shown in FIG. 34F. For this reason, a "film decrease" (the "film decrease" is defined such that a positive resist portion which is not supposed to be removed is undesirably exposed, and the positive resist is excessively removed) occurs at each end portion of the positive resist image along its longitudinal direction, thereby undesirably forming a trapezoidal resist image. Since the two end light-shielding pattern elements of the three light-shielding pattern elements shown in FIG. 34E do not have a sufficient light-shielding effect, the line width of each end light-shielding pattern element is smaller than that of the central light-shielding pattern element. FIGS. 34A and 34E exemplify periodic patterns each consisting of three pattern elements. In an arbitrary periodic pattern, differences in size occur in an inner or central pattern element of the periodic pattern and between the inner pattern element and end pattern elements. In general, the line width of each end pattern element is smaller than that of the inner pattern element. This phenomenon occurs because other patterns are always present near the edge of each inner pattern element except for both end pattern elements of the periodic pattern (a distance from the edge falls within about the minimum pitch), and other patterns are not present near the both pattern elements (i.e., the pattern edges of both the end portions).

In order to prevent the above deformation, the following reticle can be formed. The line width of the end portion is set to be slightly larger than the design value so as to correct tapering and the film decrease, and the decrease in line width. The line width of an inner portion is slightly increased to correct the decrease in line width. This correction can be equivalent to the following correction. That is, the line width of the central portion is slightly reduced without changing the line width of each end portion. In addition, the line width is slightly reduced in a portion except for an isolated edge portion (i.e., an edge portion near which other pattern elements are present) without correcting the isolated edge portion, thereby obtaining the same effect as described above.

Tapering and the film decrease occur at an end portion of a linear isolated pattern. A decrease in line width also occurs in a central portion. This occurs in an isolated edge portion and particularly near an end portion because other patterns are present near the end portion.

When an isolated pattern is mixed with a periodic pattern, it is important to use a mask also corrected for the isolated pattern.

(4) Pattern Correction Algorithm in SHRINC Method

Figure 35A:
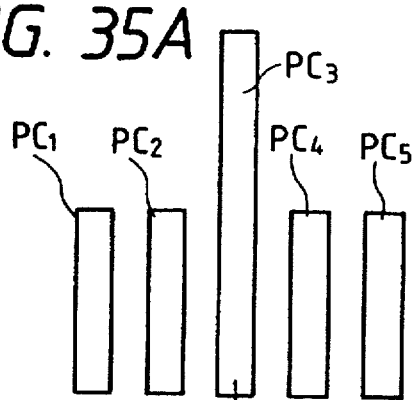
FIGS. 35A and 35B are views for explaining inconvenience occurring in exposure of a conventional reticle pattern in the apparatus shown in FIGS. 29 and 30.
Figure 35B:
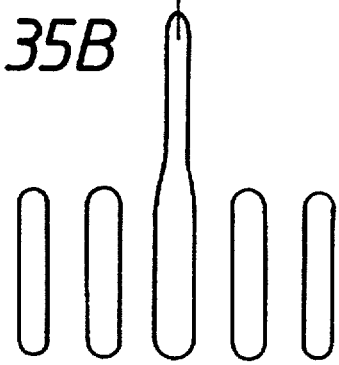

FIGS. 35A and 35B show conventional pattern shapes. FIG. 35A shows the pattern shape based on the design values on the reticle. This pattern consists of five lines and four spaces. Five line portions (closed regions) $PC_1$, $PC_2$, $PC_3$, $PC_4$, and $PC_5$ are transparent portions to exposure light, and the surrounding portion (background) serves as a light-shielding portion. The relationship between the transparent and light-shielding portions may be reversed to obtain the same effect.

Referring to FIG. 35A, the central line portion $PC_3$ of the five line portions has a length twice that of the remaining line portions. Part of the line portion $PC_3$ serves as an isolated portion which does not have any periodic correlation with other line portions. The two end line portions $PC_1$ and $PC_3$ may be regarded as isolated portions because only the line portions $PC_2$ and $PC_4$ are located adjacent to the inner sides of the end line portions $PC_1$ and $PC_5$. Note that the line width in FIG. 35A has a value close to the resolving limit of the projection exposure apparatus.

When this reticle pattern is projected and exposed on the photosensitive substrate by the projection exposure apparatus (FIGS. 29 to 32) employing the SHRINC method, and the exposed substrate is developed, resist images shown in FIG. 35B are obtained. The resist image corresponding to the central line portion $PC_3$, in FIG. 35B has a smaller line width than the design value at the isolated distal end portion. At the same time, the resist images respectively corresponding to the two end line portions $PC_1$ and $PC_5$ are thinned as a whole. In addition, the lengths of the five line portions are slightly shortened in the longitudinal direction.

Figure 36A:
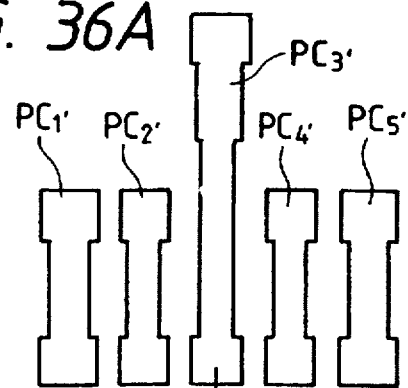
FIGS. 36A and 36B are views for explaining pattern correction to eliminate the inconvenience in FIGS. 35A and 35B.
Figure 36B:
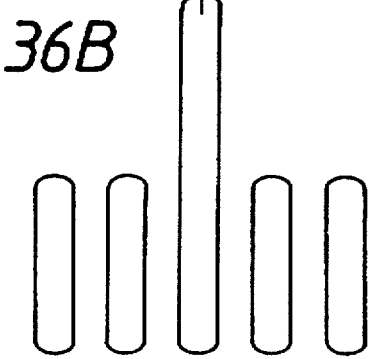

The pattern line widths and lengths of some of line portions of the design reticle pattern shown in FIG. 35A are corrected, as shown in FIG. 36A, and finally obtained resist images are matched with the shapes and sizes of the design reticle pattern, as shown in FIG. 36B.

Referring to FIG. 36A, the line width of line end portions except for the central portion having high periodicity associated with the correlation with the surrounding patterns is increased by a predetermined amount, and the line length in the longitudinal direction is also increased to obtain a line portion $PC_3'$. In this case, the expansion in the longitudinal direction of the line need not be performed. The line width of the two end line portions $PC_1$ and $PC_5$ is entirely increased, and end portions thereof are further thickened by a predetermined amount, as indicated by line portions $PC_1'$ and $PC_5'$. In this case, only the edges at which the adjacent line portions $PC_2$ and $PC_4$ are not present are thickened. The line width of both end portions of the line portions $PC_2$ and $PC_4$ is increased by a predetermined amount. The length of each of the line portions $PC_1'$, $PC_5'$, $PC_2'$, and $PC_4'$ has been increased by a predetermined amount in the longitudinal direction.

(5) Determination Logic of Pattern to be Corrected

Figure 37:
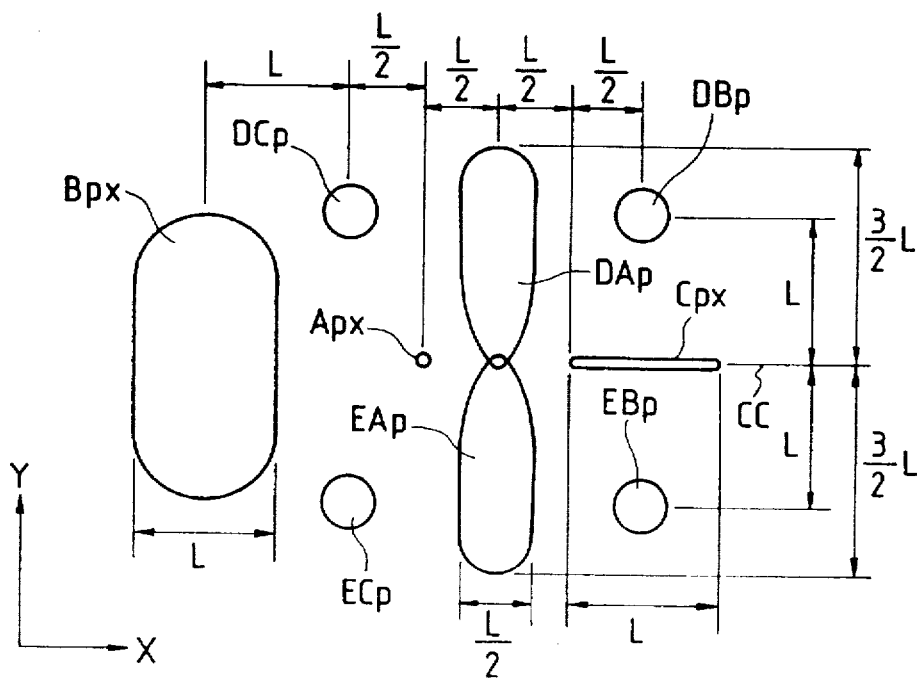
FIG. 37 is a view for explaining the shape of a pattern correction test element (determination template)

In order to automatically correct the pattern, a test element with two wing-like portions is prepared, as shown in FIG. 37. This test element is a kind of template for scanning a binary bit image of, e.g., the design pattern in FIG. 35A in units of pixels (bits) to determine whether a target pattern edge is corrected.

Referring to FIG. 37, a pixel point $A_{px}$ is a point on a target reticle pattern. A linear region $C_{px}$, a rectangular or elliptical region $B_{px}$, two wing-like regions $DA_p$, $EA_p$, and four circular regions $DB_p$, $DC_p$, $EB_p$, and $EC_p$ are test element portions for determining whether the pattern edge portion at the point $A_{px}$ is corrected. The test element template in FIG. 37 is scanned on the bit image in the right direction in FIG. 37 such that the linear test element portion $C_{px}$ is a leading test element portion with respect to the target point $A_{px}$. When the X-Y coordinate system is determined in FIG. 37, the linear test element portion $C_{px}$ is set on the same Y-coordinate as that of the target point $A_{px}$ and is spaced apart from the target point $A_{px}$ by a distance L in the +X direction. The length of the linear test element portion $C_{px}$ in the X direction is determined as the distance L. This distance L is determined in correspondence with the line width of the resolving limit obtained in the projection exposure apparatus (FIGS. 29 to 32). For example, the resolving limit on the wafer W is given as 0.4 μm and the reduction factor of the projection optical system PL is given as ⅕, the distance L corresponds to a size of about 2 μm on the reticle pattern.

The center of the elliptical test element portion $B_{px}$ is spaced apart from the target point $A_{px}$ by a distance of 3L/2 and has a width of about L in the X direction. The length of the test element portion $B_{px}$ in the Y direction is determined to be about 2L. The test element portion $B_{px}$ is symmetrical about a center line CC parallel to the X-axis passing through the target point $A_{px}$.

The two wing-like test element portions $DA_p$ and $EA_p$ having substantially the same size are symmetrical about the center line CC. The width of each portion $DA_p$ or $EA_p$ in the X direction is L/2, and its length is about 3L/2 in the Y direction. The two wing-like test element portions $DA_p$ and $EA_p$ partially overlap each other on the center line CC, and the overlapping position is set to be a distance of L/2 from the target point $A_{px}$ in the +X direction.

The center of each of the four circular test element portions $DB_p$, $DC_p$, $EB_p$, and $EC_p$ is set to be spaced apart from the center line CC by the distance L in a corresponding one of the ±Y directions. The center of each of the test element portions $DB_p$ and $EB_p$ is spaced apart from the target point $A_{px}$ by the distance of 3L/2 in the +X direction. The center of each of the test element portions $DC_p$ and $EC_p$ is spaced apart from the target point $A_{px}$ by the distance of L/2 in the −X direction. Each of the test element portions $DB_p$, $DC_p$, $EB_p$, and $EC_p$ can be included in a circle having a radius of about L/2 to L/4.

The test element portions $B_{px}$, $C_{px}$, $DA_p$, $DB_p$, $DC_p$, $EA_p$, $EB_p$, and $EC_p$ function to determine the states of the logic values "0" and "1" of bit image portions included therein when a pattern edge extending in the Y direction is located at the target point $A_{px}$. In this sense, each test element portion does not check all pixels (bits) within each region thereof, but may check discrete points within the region. The distance L is determined as the value (value on the reticle side) of the resolving limit of the projection optical system PL. When a resolving power is increased by the SHRINC method the distance L is determined to be almost equal to the limit of the line width value (value on the reticle side) obtained by the increased resolving power. Each of the circular test element portions $DB_p$, $DC_p$, $EB_p$, and $EC_p$ has an area (radius: L/2 to L/4), but may be constituted by one pixel at the central position.

The test element template shown in FIG. 37 is scanned on a two-dimensional bit image pattern in the +X direction, i.e., in a direction to set the linear test element portion $C_{px}$ as a leading test element portion. In practice, however, since it is difficult to scan the template on the bit image, the bit image is scanned every pixel in units of lines in the X direction. Every time line scan of the bit image is completed, the bit image is shifted by one pixel in the Y direction, and the scan is then started in the X direction again. By repeating the above scan operations, the bit line image can be scanned.

(6) Basic Operation of Determination Logic

Figure 38A:
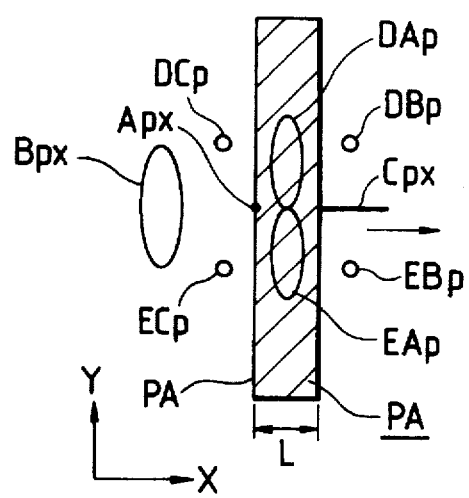
FIGS. 38A, 38B, 38C, and 38D are views for explaining the principle of correction of various patterns using the test element in FIG. 37.
Figure 38B:
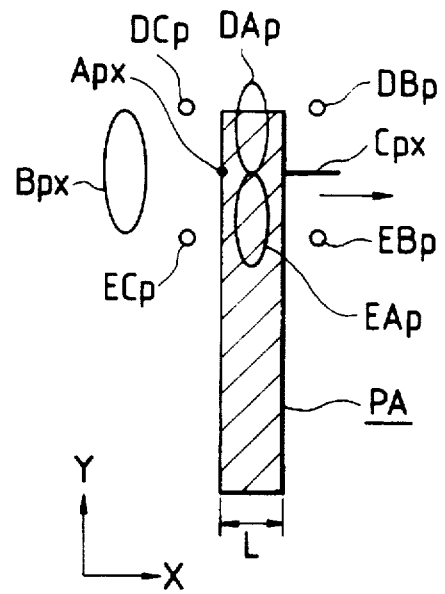

The principle of pattern correction determination algorithm using the test element template shown in FIG. 37 will be described with reference to FIGS. 38A to 39D. FIGS. 38A and 38B show a case in which an isolated line pattern PA (hatched portion) having a line width L corresponding to about the resolving limit and a length of about 6L is to be corrected. The line pattern PA serves as a light-shielding portion on the reticle and has logic value "1" on the bit image. The surrounding portion is a transparent portion (background) and has logic value "0".

FIG. 38A shows a state in which the target point $A_{px}$ performs scan in the +X direction indicated by an arrow in FIG. 38A and is located at a pattern edge of the pattern PA extending in the Y direction. At this time, since all test bits set in the elliptical test element portion $B_{px}$ are set at logic "0" (background), it is determined that the pattern edge at which the target point $A_{px}$ is located is an isolated edge. In this case, the pattern edge at the target point $A_{px}$ is expanded by a predetermined amount in a direction (−X direction) opposite to the scan direction. An expansion amount ΔL falls within the range of about 10% to about 15% of the size L (resolving limit) in exposure using the SHRINC method.

It is determined using the test element portions $DA_p$, $DB_p$, and $DC_p$, the test element portions $EA_p$, $EB_p$, and $EC_p$, and the linear test element portion $C_{px}$ whether an edge portion at the target point is a portion near an end portion of a long side of the pattern PA (this portion is referred to as a longitudinal end portion hereinafter). In FIG. 38A, all the test bits within the two wing-like test element portions $DA_p$ and $EA_p$ are set at logic "1" (pattern). Therefore, the edge portion of the target portion $A_{px}$ is not determined as the portion near the longitudinal end portion. Therefore, the correction amount (thickening amount) of the line width of the edge portion of the target point $A_{px}$ is given as ΔL.

As shown in FIG. 38B, assume that the target point $A_{px}$ is located at the edge portion of the pattern PA near the longitudinal end portion extending in the Y direction. In this case, all the test bits within the elliptical test element portion $B_{px}$ are set at logic "0" (background). The edge portion of the target point $A_{px}$ is determined as an isolated portion, and the line width of this edge portion is corrected to be thickened by ΔL.

In addition, logic "0" (background) and logic "1" (pattern) are mixed in the wing-like test element portion $DA_p$. In this case, since the edge portion of the target point $A_{px}$ may be a portion near the longitudinal end portion, bit data within the test element portions $DB_p$ and $DC_p$ are tested. Since all the bit data within the test element portions $DB_p$ and $DC_p$ are set at logic "0" (background), the edge portion of the target point $A_{px}$ may be the longitudinal end portion. For this reason, the bit data within the linear test element portion $C_{px}$ are tested. Since some (or all) of the bit data within the test element portion $C_{px}$ are set at logic "0" (background), the final determination of the edge portion of the target point $A_{px}$ is made as the portion near the longitudinal end portion. The line width of the edge portion of the target point $A_{px}$ is further increased by another ΔL (a total of 2·ΔL).

Figure 38C:
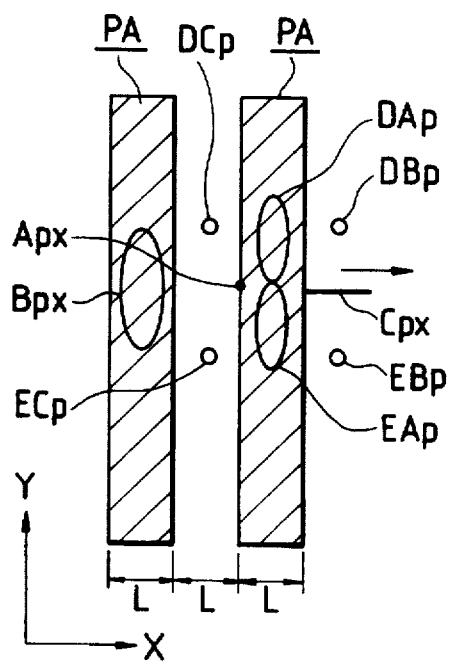
Figure 38D:
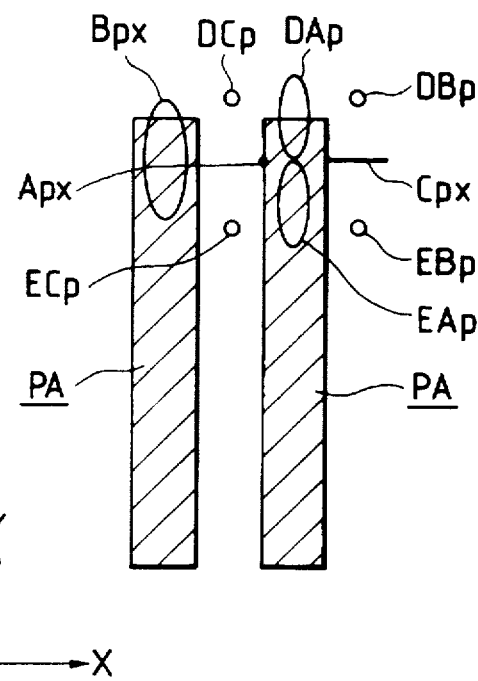

FIGS. 38C and 38D show a case in which two line patterns PA are set parallel to each other by the distance L. The length of each of the line patterns PA is 6L. As shown in FIG. 38C, when the target point $A_{px}$ is located at the left edge of the right pattern of the two line patterns PA, all bit data in the test element portion $B_{px}$ are set at logic "1", and it is determined that the edge portion of the target point $A_{px}$ is not an isolated edge portion. Simultaneously, since all bit data within the wing-like test element portions $DA_p$ and $EA_p$ are set at logic "1", it is determined that the edge portion of the target point $A_{px}$ is not a longitudinal end portion. Therefore, the line width of the pattern is not changed at the position of the target point $A_{px}$ in FIG. 38C.

When the target point $A_{px}$ is located, as shown in FIG. 38D, bit data within the test element portion $B_{px}$ are set at both logic "0" and logic "1". In this case, the edge portion of the target point $A_{px}$ is determined not to be an isolated edge portion. In this case, the wing-like test element portion $DA_p$ includes logic "0", all the test element portions $DB_p$ and $DC_p$ are set at logic "0", and the linear test element portion $C_{px}$ includes logic "0". Therefore, the edge portion of the target point $A_{px}$ is determined as a longitudinal end portion. In this case, the line width is increased by $\Delta L$.

Figure 39A:
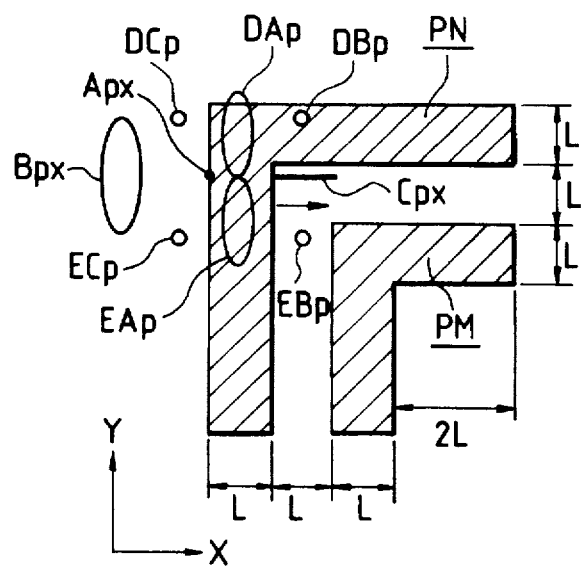
FIGS. 39A, 39B, 39C, and 39D are views for explaining the principle of various patterns using the test element in FIG. 37.
Figure 39B:
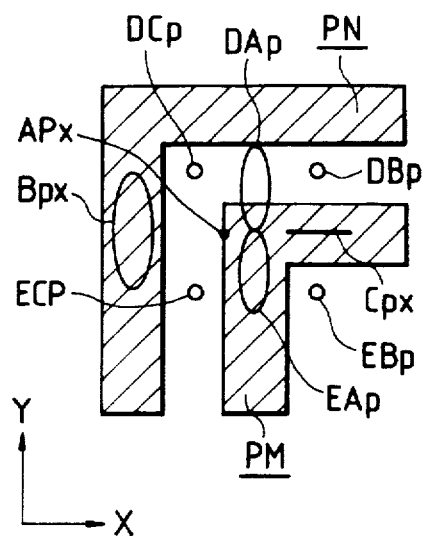

FIGS. 39A and 39B show two patterns PM and PN each having a 90° corner and having a width L. The patterns PM and PN are spaced apart from each other by the distance L. In FIG. 39A, since all bit data within the test element portion $B_{px}$ are set at logic "0", the edge of the target point $A_{px}$ is determined to be an isolated edge portion. This edge portion is expanded by $\Delta L$. At this time, the wing-like test element portion $DA_p$ includes logic "0", the bit data within the test element portions $DB_p$ and $DC_p$ are also tested. Since the test element portion $DB_p$ includes logic "1", the edge portion of the target point $A_{px}$ is determined finally not to be a longitudinal end portion. A total of correction amount (thickening amount of the line width) is $\Delta L$ (an amount for only the isolated edge portion).

In FIG. 39B, since the test element portion $B_{px}$ includes logic "1", the edge portion of the target point $A_{px}$ is determined not to be an isolated edge portion. In FIG. 39B as in FIG. 39A, the wing-like test element portion $DA_p$ includes logic "0", the test element portions $DB_p$ and $DC_p$ do not include "1" (i.e., all "0"s), and all the bit data within the linear test element portion $C_{px}$ are set at logic "1". The edge portion of the target point $A_{px}$ is determined not to be a longitudinal end portion of the pattern PM. Therefore, in FIG. 39B, since the edge portion of the target point $A_{px}$ is neither an isolated edge portion nor a longitudinal end portion, no correction of the line width is performed.

Figure 39C:
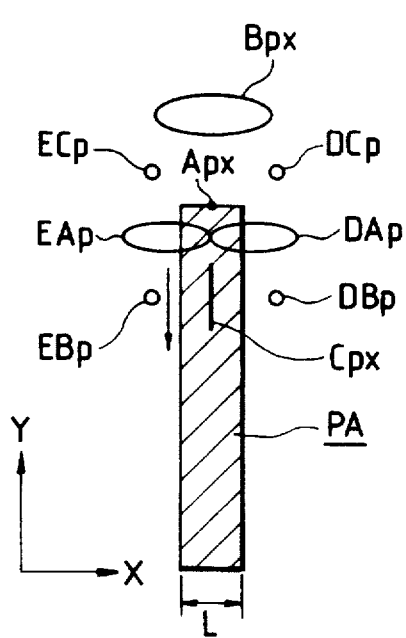
Figure 39D:
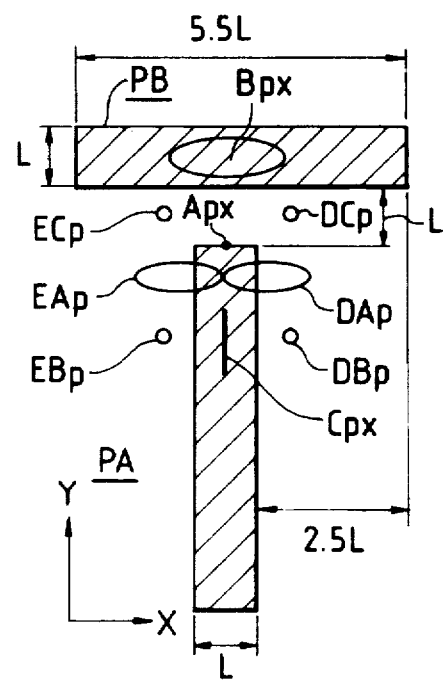

Unlike in the above cases, the test element template is rotated clockwise through 90° in FIGS. 39C and 39D, and at the same time the scan direction is the $-Y$ direction.

In FIG. 39C, the target point $A_{px}$ is located at an edge of the longitudinal end portion of one isolated line pattern PA. In this case, all the bit data within the test element portion $B_{px}$ are set at logic "0" (no logic "1"). The edge of the target point $A_{px}$ is temporarily determined as an isolated edge portion, and correction is performed by only $\Delta L$. At the same time, the test element portions $DA_p$ and $EA_p$ include logic "0"s. When the leading and trailing test element portions $DB_p$ and $DC_p$ along the scan direction with respect to the test element portion $DA_p$ are tested, they do not include logic "1"s. In addition, when the leading and trailing test element portions $EB_p$ and $EC_p$ in the scan direction with respect to the test element portion $EA_p$ are tested, they do not include logic "1"s. In addition, when the test element portion $CA_{px}$ is tested, all bit data within the test element portion $C_{px}$ are set at logic "0" (no logic "1"). Therefore, the edge of the target point $A_{px}$ is determined as an edge which defines the longitudinal direction of the line pattern PA. In this case, since this edge is not a longitudinal end portion of an edge which defines the line width, line width correction corresponding to this is not performed.

The line width (the length in this case) of the edge portion at the target point $A_{px}$ is expanded by $+\Delta L$ (an amount corresponding to the isolated edge portion) in the $+Y$ direction (i.e., a direction opposite to the $-Y$ scan direction), since this edge portion is determined as an isolated portion.

Assume that two line patterns PA and PB each having a width of L and a length of 6L are spaced apart from each other in a T-shaped manner. In this case, assume that the test element template is scanned in the $-Y$ direction, as shown in FIG. 39D and the target point reaches an edge of a longitudinal end portion of the pattern PA. At this time, since the test element portion $B_{px}$ includes logic "1", the edge of the target point is determined not to be an isolated edge. The states of the test element portions $C_{px}$, $DA_p$, $DB_p$, $DC_p$, $EA_p$, $EB_p$, and $EC_p$ are the same as those in FIG. 39C. Judging from the patterns PA and PB as a whole, the edge of the target point $A_{px}$ is determined not to be a longitudinal end, either. Therefore, the patterns are not corrected at the target point in FIG. 39D.

The above algorithm will be summarized as follows.
(A) Isolation Determination

The elliptical test element portion $B_{px}$ does not include logic "1".
(B) Longitudinal End Determination
① First Determination The test element portion $DA_p$ includes logic "0", the test element portions $DB_p$ and $DC_p$ do not include logic "1"s, and the test element portion $C_{px}$ includes logic "0".
② Second Determination The test element portion $EA_p$ includes logic "0", the test element portions $EB_p$ and $EC_p$ do not include logic "1"s, and the test element portion $C_{px}$ includes logic "0".

In the above longitudinal end determination, if at least one of the first determination ① and the second determination ② is established, an edge portion of the target point is determined as a portion near the longitudinal end. Note that the correction amount (expansion amount) need not be doubled even if both the first determination ① and the second determination ② are simultaneously established.

The above correction is performed by scanning the test element template shown in FIG. 37 in the $+X$, $-X$, $+Y$, and $-Y$ directions, and the correction results are shown in FIG. 40A to 40D. In this case, during scan in each direction, the test element template is set in a rotated position, and the linear test element portion $C_{px}$ serves as the leading test element portion in the scan direction.

Figure 40A:
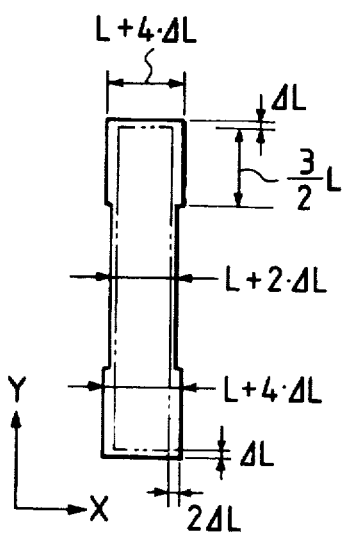
FIGS. 40A, 40B, 40C, and 40D are views showing the shapes of corrected patterns in FIGS. 38A, 38B, 38C and 38D, and 39A, 39B, 39C and 39D.

FIG. 40A shows the shape of the corrected isolated line pattern PA shown in FIGS. 38A, 38B, and 39C. Referring to FIG. 40A, the line width of the central portion of the pattern PA in the longitudinal direction is increased from L to $L+2\Delta L$, and the line width of the $3L/2$ long portion from the longitudinal end portion is increased from L to $L+4\Delta L$. In addition, the end edge along the longitudinal direction is corrected by $\Delta L$ in the longitudinal direction. As a result, the corrected pattern has an overall length of $6L+2\Delta L$.

Figure 40B:
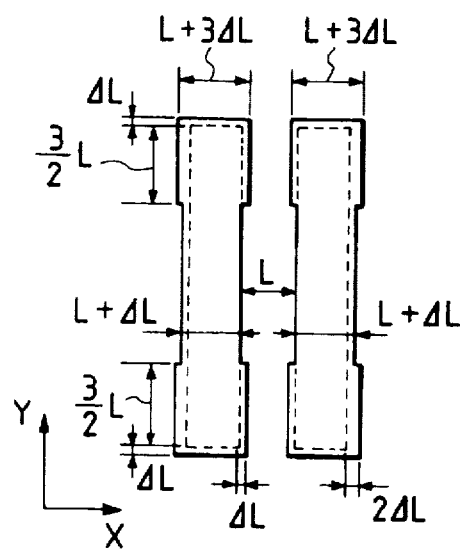

FIG. 40B shows the corrected shape of the two parallel line patterns PA shown in FIGS. 38C and 38D. As shown in FIG. 40B, the value of the distance L (space portion) between the two line patterns is preserved upon correction. Highly isolated edge portions of these two line patterns are emphasized and expanded. Each of these line patterns is extended to $6L+2\Delta L$. One of the two line patterns is taken into consideration. The line pattern is expanded asymmetrically in the X direction. However, when these two line patterns are regarded as a unit, symmetry of the line patterns is maintained in the X direction. For this reason, of the two line patterns, the left edge of the left line pattern is expanded by $\Delta L$ as a whole. A portion near the longitudinal end portion is further expanded by another $\Delta L$ (a total of $2\Delta L$). Therefore, in FIG. 40B, the line width of the longitudinal end portion is corrected to $L+3\Delta L$.

Figure 40C:
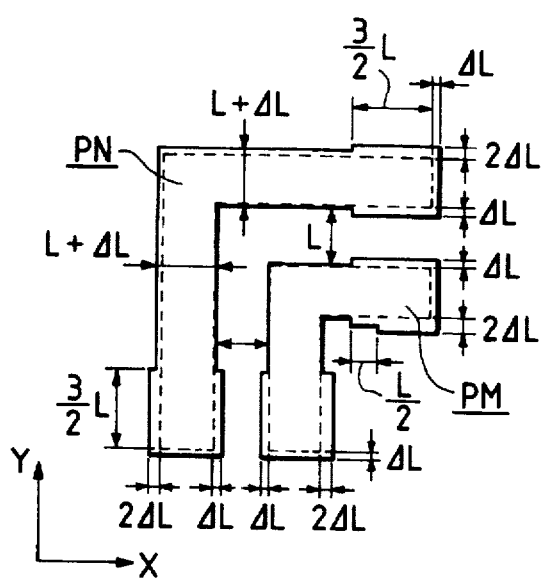

FIG. 40C shows the corrected shape of the two L-shaped patterns PN and PM shown in FIGS. 39A and 39B. Of all the edges defining the space portion (distance L) between the two patterns PN and PM, a portion except for a portion near the longitudinal end portion is not corrected. The inner opposite edge portions are expanded by ΔL near the longitudinal ends of the patterns PN and PM. The edges defining the longitudinal ends of the patterns PM and PM are also expanded by ΔL along their longitudinal direction. The edges on the left and upper sides of the pattern PN are expanded by ΔL throughout its overall length. A 3L/2 long portion of each edge on the longitudinal end side is further thickened by ΔL. Similarly, portions of the right and lower edges of the pattern PM are uniformly expanded by 2ΔL near the longitudinal end portions and are corrected as a step defined by ΔL and 2ΔL. When the pattern edge is to be expanded stepwise, ΔL expansion is performed by the length of L/2 along the edge direction in accordance with the condition of the test element template in FIG. 37. 2ΔL expansion is performed by L along the edge direction.

Figure 40D:
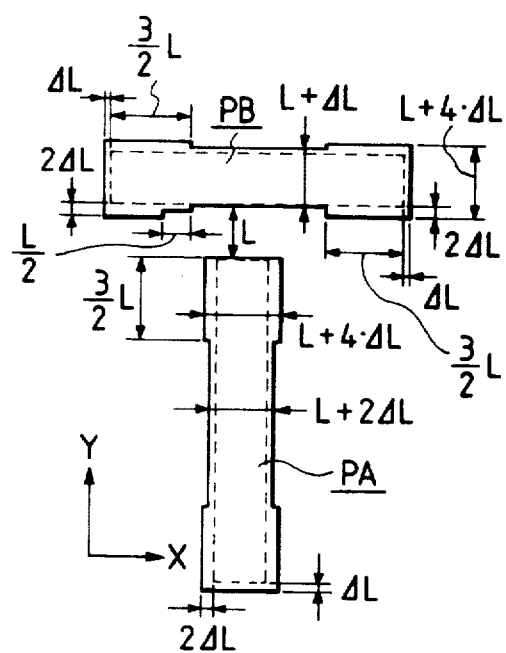

FIG. 40D shows the corrected shape of the patterns PA and PB in FIG. 39D. In this case, the pattern PA is also corrected as shown in FIG. 40A along the widthwise direction (X direction). However, an edge portion adjacent to the pattern PB is not corrected along the longitudinal direction. The pattern PB is corrected by 2ΔL along its longitudinal direction. The edge (i.e., upper edge in FIG. 40D) of the pattern PB opposite to the pattern PA is corrected by ΔL throughout its overall length. A portion near the longitudinal end portion is corrected by ΔL. The longitudinal central portion at the lower edge of the pattern PB is not corrected because the pattern PA is present adjacent to the central portion.

(7) Description of Pattern Correction Device

The same mask manufacturing system as in FIG. 8 can be used in this embodiment, except that the arrangement of the pattern correction device 10 in FIG. 8 in the first and second embodiments is different.

Figure 41:
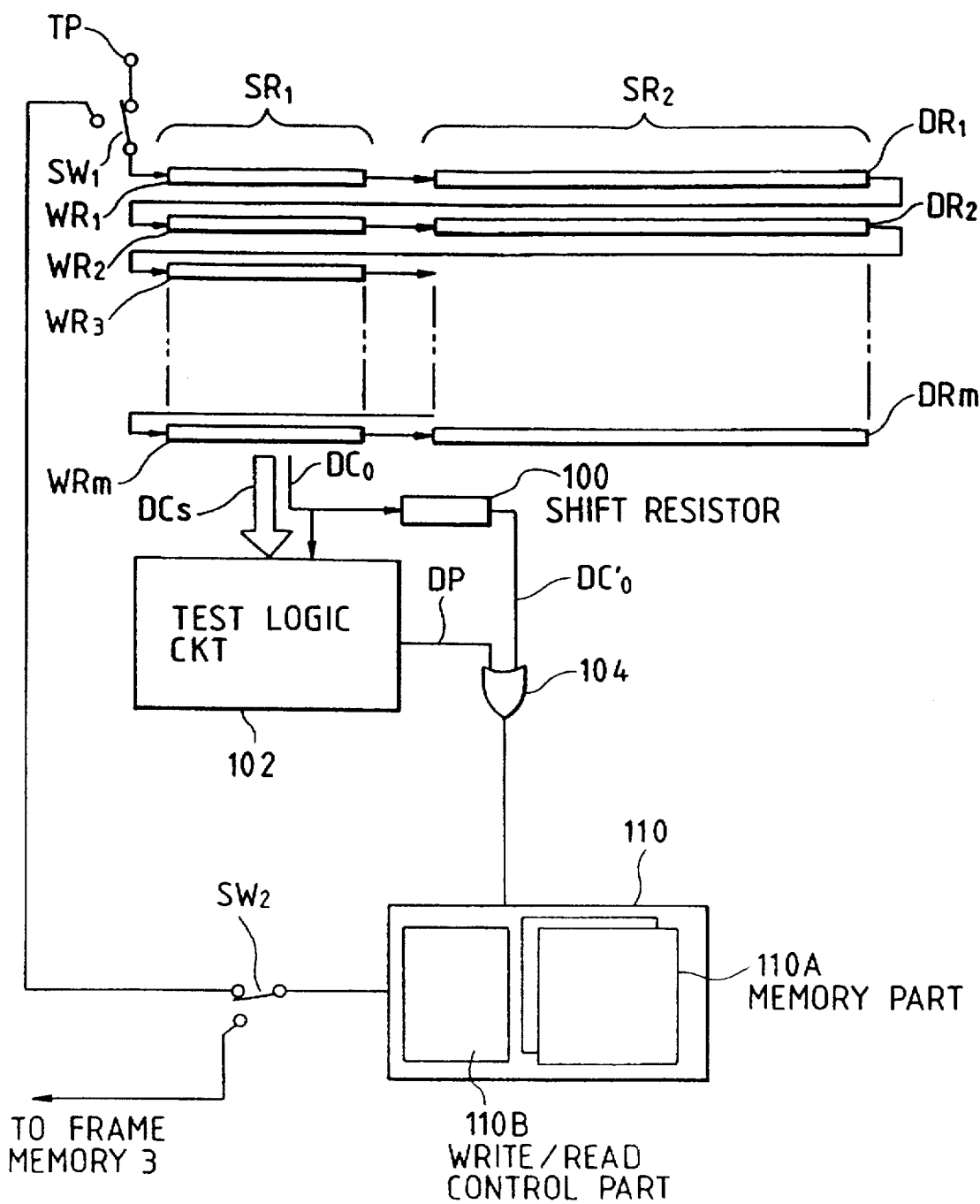
FIG. 41 is a view showing a schematic arrangement of a pattern correction device.

FIG. 41 is a block diagram showing the schematic arrangement of the correction device 10 in FIG. 8. Bit image data of one field developed in a frame memory 3 is converted into "0" and "1" serial data. The serial data is then supplied to a terminal TP. Bit serial data read out from the frame memory 3 is input to a first shift register WR1 of an extraction window shift register group SR1 through the terminal TP and a switch SW1. Output data from this shift register WR1 is input to a first shift register DR1 of a next shift register group SR2. Output data from the shift register DR1 is input to a second shift register WR2 of the shift registers SR1. In this manner, the bit serial data from the frame memory 3 is sequentially shifted bit by bit through the shift registers WR1, DR1, WR2, DR2, . . . , WRm, and DRm.

The number bw of bits of each of the shift registers WR1 to WRm of the shift register group SR1 is set to be about 40 to 60. The number of bits of each of the shift registers DR1 to DRm of the shift register group SR2 is defined as n-bw. That is, the total number of bits of the shift registers WR1 and DR1 is set to be equal to the number n (e.g., 50,000) of bits of one line. Each of the numbers R of shift registers WRm and DRm respectively constituting the shift register groups SR1 and SR2 is set equal to the number bw of bits of each of the shift registers WR1 to WRm. When the number bw is set to be 40, m=40 is set. This can be achieved by setting the extraction window (bw×bw bits) of the shift register group SR1 to be a square. However, the extraction window need not be set to be a square.

Serial data DCo of the central bit (of the extraction window) corresponding to the target point $A_{px}$ is delayed by a predetermined number of bits by a shift register 100, and delayed serial data DCo' is input to an OR gate 104. On the other hand, serial data group DCs and the data DCo from a plurality of test bits in the extraction window are input to a test logic circuit 102 having the template shown in FIG. 37. The test logic circuit 102 determines whether a pattern edge located at the target central bit position is corrected. If correction is required, correction data (either logic value "1" or "0") DP is output to the OR gate 104 in units of bits. The OR gate 104 logically ORs the design original bit image data (DCo') and data (DP) for only correction. The logically ORed result as serial data is output to a temporary memory 110 consisting of a frame memory part 110A of at least two fields and a write read control part 110B.

The test element template and the bit image are subjected to relative scan in a total of four directions, i.e., +X, −X, +Y, and −Y directions, as described above. For example, correction by the scan in the +X direction is performed when the bit image data is read from the frame memory 3 through the switch SW1, and the correction result is temporarily stored in the first field in the memory part 110A in the temporary memory 110. In correction by the scan in the −X direction, the state of the switch SW1 is switched from the illustrated state, the read direction of the bit image data from the temporary memory 110 is controlled to be the −X direction, and the corrected data is stored in the second field of the memory part 110A through the extraction window again. The scan operations in the +Y and −Y directions can be performed in the same manner as described above.

The four scan modes cannot be simultaneously set. Bit serial data access of one field from the temporary memory 110 is performed a total of three times by switching the memory part of the two fields. Scan must be performed four times for one field due to the characteristics of the test logic circuit 102. When the arrangement of the test logic circuit 102 is changed, two-dimensionally corrected data can be obtained by only one scan cycle.

The corrected bit image data stored in the temporary memory 110 in one scan direction is converted into bit serial data, and the bit serial data is sent to the shift register group SR1 again through the switches SW2 and SW1. The same correction operation in another scan direction is performed as described above. When the scan operations in the four directions are completed, the finally corrected bit image data (serial) generated in the temporary memory 110 is returned to the frame memory 3 through the switch SW2. The bit image based on the design data stored in the frame memory 3 is converted into the bit image in which a predetermined pattern is corrected.

Note that in practical reticle manufacture, a correction operation (i.e., MTR 1→developing means 2→frame memory 3→correction device 10→frame memory 3) is repeated every field, and the corrected bit image data obtained in units of fields are sequentially transferred from the frame memory 3 to another MTR, and the corrected bit image data in units of fields is read out from this MTR to the frame memory 3.

The block diagram in FIG. 41 is a schematic diagram. In practice, a processor and a clock generator for systematically controlling shift operations of the shift register groups SR1 and SR2, the test timings of the test logic circuit 102, or the addressing timings of the frame memory 3 and the temporary memory 110 are provided.

FIG. 42 represents the extraction window by the shift register group SR1 in FIG. 41. Each square in FIG. 42 corresponds to one bit in the shift register, and the bit at the upper left corner corresponds to the first bit of the shift register WR1. Since the extraction window is constituted by 41 bits in the X direction and 41 bits in the Y direction, each of the shift registers WR1, WR2, . . . , WRm in FIG. 41 is constituted by 41 bits, and the number m of shift registers is 41. A target point (bit) $A_{px}$ represented by ■ is set to be coordinates (21,21) when the pixel array of the extraction window is defined by the X-Y coordinate system having the pixel at the upper left corner as the origin (1,1). FIG. 42 shows a state in which the test element template shown in FIG. 37 is rotated about the target bit $A_{px}$ through 180°. Therefore, the linear test element portion $C_{px}$ is located to the left of the target point $A_{px}$ because a bit image appearing within the extraction window is always shifted bit by bit from the left to the right (in the +X direction) in FIG. 42.

In this embodiment, a size value L of a resolving limit corresponds to 10 pixels on the bit image. An edge correction amount (thickening amount) ΔL falls within the range of about 10% to about 15% of the line width L so that the correction amount is defined as one pixel. A linear region of 10 bits from bit (10,21) spaced apart from the target bit $A_{px}$ in the −X direction within the extraction window to bit (1,21) within the window is defined as the test element portion $C_{px}$. 10 bits are arranged in the test element portion $C_{px}$. Of these bits, bits (1,21), (4,21), (7,21), and (10,21) are defined as test bits.

The width (substantially L) of the elliptical test element portion $B_{px}$ in the +X direction is defined by detection bit (32,21) spaced apart from the target bit $A_{px}$ by 10 bits in the +X direction and detection bit (41,21) located at the ninth bit from bit (32,21) in the +X direction. The size of the elliptical test element portion $B_{px}$ in the Y direction is defined by four test bits (34,11), (39,11), (34,31), and (39,31). In addition, four test bits (32,16), (41,16), (32,26), and (41,26) are defined to define the outline of the test element portion $B_{px}$.

The outline of the wing-like test element portion $DA_p$ is defined by nine test bits (15,21), (14,19), (16,19), (13,16), (17,16), (13,11), (17,11), (14,6), and (17,6) so as to define a width of L/2 in the X direction and a length of 3L/2 in the Y direction in accordance with the size in FIG. 37. The test bits defining the wing-like test element portion $EA_p$ are symmetrical with those of the test element portion $DA_p$ about a center line having the Y coordinate value=21 and consist of bits (15,21), (14,23), (16,23), (13,26), (17,26), (13,31), (17,31), (14,36), and (17,36). Of these test bits, bit (15,21) defines an overlapping portion between the two wing-like test element portions $DA_p$ and $EA_p$.

Each of the circular test element portions $EB_p$, $DC_p$, $EB_p$, and $EC_p$ is constituted by one bit in this embodiment. These element portions $EB_p$, $DC_p$, $EB_p$, and $EC_p$ have coordinate values (6,31), (26,31), (6,11), and (26,11), respectively. Note that in this embodiment, test bit (21,22) is set to the right of the target bit $A_{px}$ to detect whether an edge of a pattern extending in the Y direction is located at the target bit $A_{px}$ (21,21). Therefore, when the target bit $A_{px}$ is set at logic "1" (pattern side) and the adjacent bit (21,22) is set at logic "0" (background side), it is determined that the pattern edge is located at the target bit.

A serial bit data group from the test bits is output as data DCs (FIG. 41) to the test logic circuit 102. Logic arithmetic units corresponding to the functions of the respective test element portions are arranged in the test logic circuit 102.

Figure 43A:
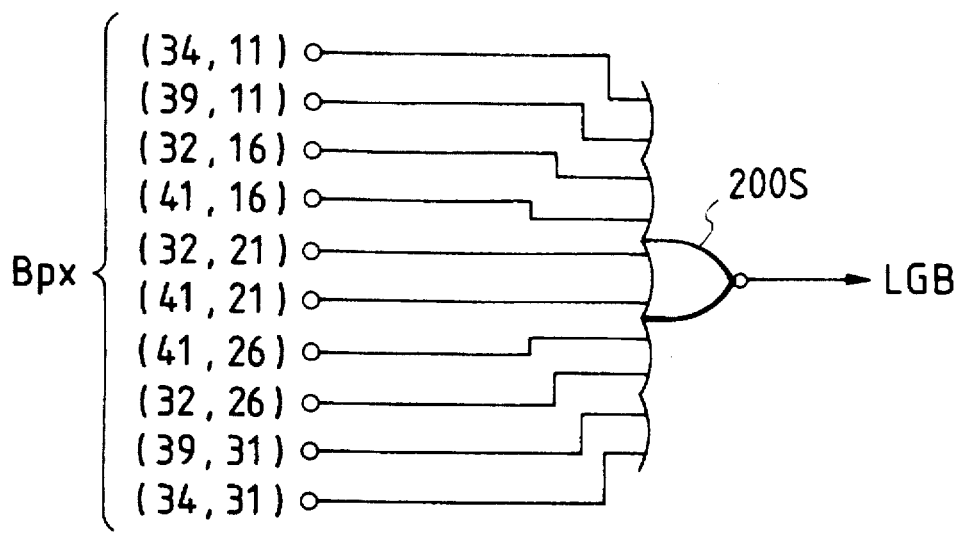
FIGS. 43A, 43B, and 43C show determination logic circuits respectively corresponding to the test bits.
Figure 43B:
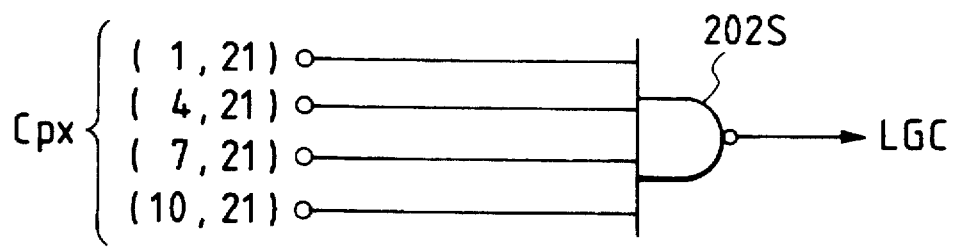

FIG. 43A shows a NOR gate 200S for calculating the logical OR signal of 10-bit data constituting the elliptical test element portion $B_{px}$, and FIG. 43B shows a NAND gate 202S for calculating the logical AND signal of 4-bit data constituting the linear test element portion $C_{px}$. If all the bits of the data input to the NOR gate 200S are set at logic "0" (transparent portion), an output LGB is set at logic "1" to determine that the pattern edge portion located at the target bit $A_{px}$ is an isolated edge portion viewed from the right side in FIG. 42. Similarly, any one of the bits of the data input to the NAND gate 202S is set at logic "0", an output LGC is set at logic "1" to determine that the pattern edge portion located at the target bit $A_{px}$ is an isolated edge portion viewed from the left side in FIG. 42.

Figure 43C:
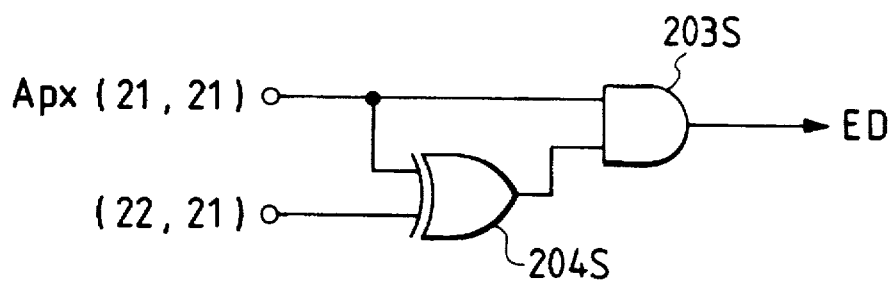

FIG. 43C shows a circuit for detecting the presence/absence of an edge at the target bit. Data $DC_o$ from the target bit (21,21) is supplied to one input of each of an AND gate 203S and an exclusive OR (EX-OR) gate 204S. Data from the bit (22,21) next to the target bit is input to the other input of the EX-OR gate 204S, and an output from the EX-OR gate 204S is input to the other input of the AND gate 203S. In the circuit shown in FIG. 43C, if the target bit $A_{px}$ is set at logic "1" and the adjacent bit (22,21) is set at logic "0", the EX-OR gate 204S outputs logic "1", and therefore an output ED from the AND gate 203S becomes logic "1". Otherwise, the output ED is kept at logic "0".

Figure 44:
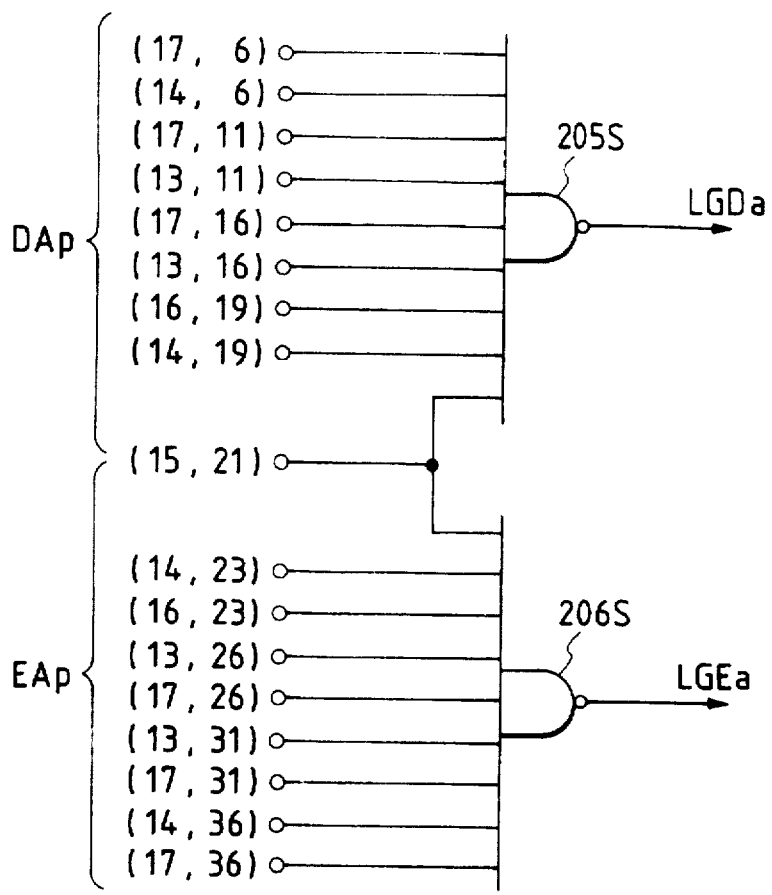
FIG. 44 is a diagram showing a determination logic circuit corresponding to each test bit.

FIG. 44 shows a logic circuit representing the functions of the two wing-like test element portions $DA_p$ and $EA_p$. Each of the wing-like test element portions $DA_p$ and $EA_p$ can detect whether any pattern edge is present within the corresponding region. The wing-like test element portions $DA_p$ and $EA_p$ are constituted by two 9-bit input NAND gates 205S and 206S, respectively. The NAND gate 205S generates an output LGDa of logic "0" when all the bit data within the test element portion $DA_p$ are set at logic "1" (pattern). If any transparent portion (logic "0") is mixed in the region of the test element portion $DA_p$, an output LGDa from the NAND gate 205S goes to logic "1". Similarly, when all the bit data within the test element portion $EA_p$ are set at logic "1" (pattern), the NAND gate 206S generates an output LGEa of logic "0". Otherwise, the output LGEa from the NAND gate 206S goes to logic "1".

Figure 45:
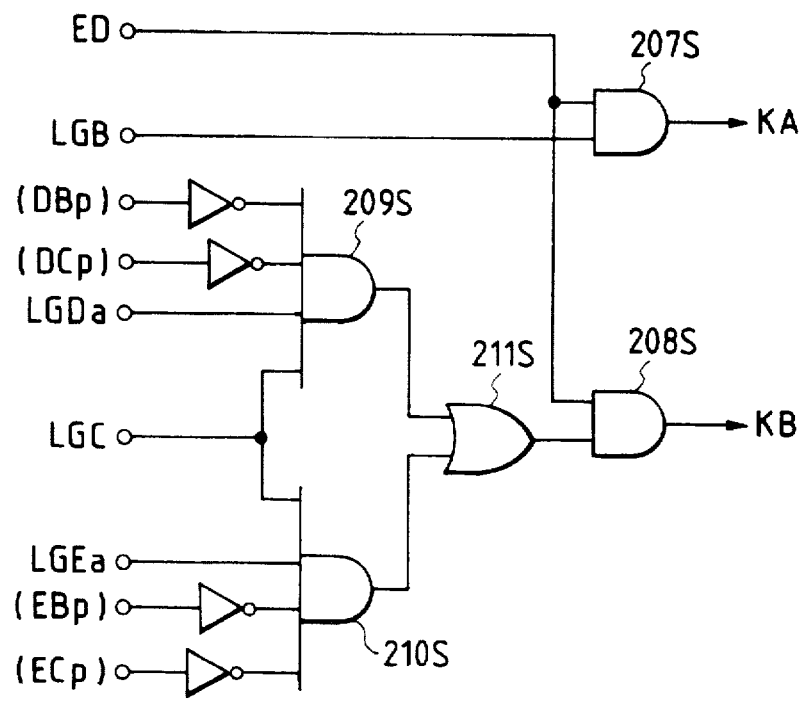
FIG. 45 is a diagram showing a circuit for determining an isolated edge and determination of an edge near a longitudinal end portion.

FIG. 45 shows a logic circuit for systematically determining pieces of information from the test element portions shown in FIG. 42. An output signal ED from the edge determination AND gate 203S is input to one input of each of AND gates 207S and 208S. The output signal LGB from the NOR gate 200S is input to the other input of the AND gate 207S. When the target bit coincides with the edge position and the signal ED goes to logic "1", the AND gate 207S determines that no pattern is found within the elliptical test element portion $B_{px}$. While the signal LGB is kept at logic "1", an output KA from the AND gate 207S is set at logic "1", thereby representing that the edge is an isolated edge.

On the other hand, output signals from two AND gates 209S and 210S are supplied to the other input of the AND gate 208S through an OR gate 211S. The 4-input AND gate 209S receives data from the test element portion $DB_p$ (6,31) within the extraction window through an inverter (NOT), data from the test element portion $DC_p$ (26,31) through an inverter (NOT), the output signal LGDa from the NAND gate 205S, and the output signal LGC from the NAND gate 202S. The 4-input AND gate 209S logically ANDs these four input signals and supplies an output signal to one input of the OR gate 211S. The 4-input AND gate 210S receives data from the test element portion $EB_p$ (6,11) within the extraction window through an inverter (NOT), data from the test element portion $EC_p$ (26,11) through an inverter (NOT), the output signal LGEa from the NAND gate 206S, and the output signal LGC from the NAND gate 202S. The 4-input AND gate 210S logically ANDs these four input signals and supplies an output signal to the other input of the OR gate 211S. The two AND gates 209S and 210S calculate conditions of the first determination ① and the second determination ② of (B) longitudinal end determination.

When the signal ED is set at logic "1" and the OR gate 211S outputs a signal of logic "1", the edge portion located at the target bit $A_{px}$ is determined as a portion near the longitudinal end portion. In this case, the output KB from the AND gate 208S goes to logic "1".

FIG. 46 shows a circuit for supplying correction bit data to an edge (located at the target position) of the bit image obtained through the extraction window on the basis of the signal KA representing the determination result of an isolated edge and the signal KB representing the determination result of the edge near the longitudinal end portion. This circuit is also arranged in the test logic circuit 102 in FIG. 41.

Referring to FIG. 46, the signals KA and KB are supplied to a timing control circuit 221S through a 2-input OR gate 220S. An output from the OR gate 220S is supplied as preset data to the LSB (Least Significant Bit) of a resettable 4-bit shift register 222S and can be input as preset data to the second bit of the shift register 222S through a switch SWa.

As described above, assume that the thickening amount ΔL of the pattern edge is defined as one bit (one pixel) on the bit image. The preset switch SWa and preset switches SWb and SWc for the shift register 222S are set at the positions illustrated in FIG. 46. For this reason, the signal KB representing the determination result of the longitudinal end portion is logically ANDed with the signal KA by the AND gate 223S, and the AND signal is supplied as the preset data to the second bit of the shift register 222S. In order to intentionally change the thickening amount, the three switches SWa, SWb, and SWc are switched from the positions illustrated in FIG. 46. This switching operation will be described in detail later.

As shown in FIG. 41, the serial bit data $DC_0$ from the target bit $A_{px}$ is supplied to the 4-bit shift register 100 bit by bit in response to the shift register shift operation clock pulse CK. The shift register 100 comprises a 4-bit shift register because the correction data addition shift register 222S comprises a 4-bit shift register. The data preset in the shift register 222S is shifted bit by bit toward the MSB (Most Significant Bit) in response to the clock pulse CK. The shifted data is output from the MSB as correction data DP to the OR gate 104.

Since the clock pulse CK is applied to all the shift registers in the apparatus so as to allow shift operations, the clock pulse CK is always supplied to the shift register 222S. The preset data is output in response to four clock pulses CK. After the preset data is output, Logic "0"s are set in all bits in the shift registers 222S until the next preset operation is performed.

This preset operation is performed in response to a strobe pulse STB from the timing control circuit 221S. Immediately before the next clock pulse CK is generated after the output from the OR gate 220S goes from logic "0" to logic "1", the control circuit 221S outputs the strobe pulse STB. The shift register 222S performs a preset operation only when it receives the strobe pulse STB.

Assume that one of the signals KA and KB goes from logic "0" to logic "1". In this case, before the next clock pulse CK is generated, the control circuit 221S outputs the strobe pulse STB. In response to this, in the states of the three switches in FIG. 46, a data string "1000" is preset from the LSB side in the shift register 222S. Meanwhile, in this state, the outermost bit (logic "1") of the pattern edge is located at the target bit $A_{px}$, and all the four bits of the shift register 100 are set at logic "0".

When the next clock pulse CK is generated, the data (logic "1") of the target bit $A_{px}$ is shifted to the LSB of the shift register 100, and the data in the shift register 100 when viewed from the LSB is "1000". At the same time, the data in the shift register 222S is shifted by one bit from the LSB side to the MSB side. Therefore, the data in the shift register 222S when viewed from the LSB side is "0100".

When the clock pulses CK are sequentially generated, and a state one pulse before the first bit (logic "1") of the pattern edge is output from the MSB of the shift register 100 is obtained, the shift register 222S outputs 1-bit data of logic "1" corresponding to the signal KA from the MSB side. The OR gate 104 outputs serial bit data representing that the pattern edge is thickened by one pixel.

When both the signals KA and KB go from logic "0" to logic "1", the strobe pulse STB is generated in the same manner as described above, and the AND gate 223S outputs data of logic "1". A data string "1100" when viewed from the LSB side is preset in the shift register 222S. For this reason, correction data representing that the pattern edge is thickened by two pixels is added to the serial bit data $DC_0$ from the target bit $A_{px}$ through the OR gate 104.

When the three switches SWa, SWb, and SWc are switched from the states shown in FIG. 46, the thickening amount can be intentionally changed. For example, when only the switch SWa is changed from the illustrated state, data preset in the shift register 222S is always given as "1100" from the LSB side in correspondence with the signal KA or KB. In this case, an output from the AND gate 223S is not used at all, thickening of the line width at the longitudinal end portion of the pattern is inhibited. That is, the line width is increased by two pixels on an assumption that the target edge is an isolated edge.

When only the switch SWb is switched from the illustrated state, the pattern is thickened by one pixel (ΔL) in response to one of the signals KA and KB. At the same time, data of logic "1" are set in the second and third bits of the shift register 222S in response to the signals KA and KB. In this case, the pattern is thickened by two pixels (2×ΔL). Therefore, the isolated pattern edge can be thickened by a total of three pixels in a direction opposite to the scan direction.

When all the three switches SWa, SWb, and SWc are switched from the illustrated states, the pattern edge portion is expanded by two pixels in accordance with the determination result of an isolated edge or a portion near a longitudinal end portion. In addition, when this pattern edge is determined to be isolated or located near the longitudinal end portion, the edge is expanded by two pixels. Therefore, the pattern can be thickened by a maximum of four pixels.

The contents of the data string to be preset in the shift register 222S are changed in accordance with the signals KA and KB and the switch group. The pattern line width and length can be arbitrarily corrected within a given range.

In this embodiment, a bit image appearing in the extraction window flows from the left to the right (+X direction). To the contrary, the test element template is set such that the linear test element portion $C_{px}$ is located to the left of the target bit within the extraction window because a right edge extending in the Y direction of the pattern edges as a set of logic "1"s appearing within the extraction window is to be corrected.

However, when the test element template is rotated from the state in FIG. 42 about the target window through 180° within the extraction window, the delay shift register 100 shown in FIGS. 41 and 46 can be omitted. In this case, the edge detection bit adjacent to the target bit is set as bit (20,21) located to the left of the target bit within the extraction window. Therefore, a pattern edge to be corrected is a left edge extending in the Y direction within the extraction window, as indicated by a hatched portion in FIG. 47.

In this case, the bit image pattern shown in FIG. 47 is shifted by a shift register in the +X direction as indicated by an arrow. When the target bit (21,21) is located at the left edge of the pattern, and this edge is determined to be corrected, logic "1" is added as the correction data to the serial bit data $DC_o$ from the target bit upon the next shift operation from the state shown in FIG. 47. For this purpose, in principle, in the circuit shown in FIG. 46, the data $DC_0$ from the target bit must be directly input to one input of the OR gate 104, and the shift operation of the shift register 222S is directed from the MSB side to the LSB side. In addition, the LSB output is supplied to the other input of the OR gate 104.

(8) Description of Pattern Correction Operation

A detailed operation of the circuit arrangements shown in FIGS. 41 to 46 will be described below. As described above, the unit thickening amount ΔL for correction is defined as one pixel. Under this condition, the three switches SWa, SWb, and SWc in FIG. 46 are set at the illustrated positions. A test element template is the one shown in FIG. 42. For descriptive convenience, a U-shaped pattern PQ (i.e., a set of logic "1"s) indicated by a hatched portion shown in FIG. 48 is used.

Assume that a bit image of the pattern PQ appearing within the extraction window upon sequential shifting of the design bit serial data from the frame memory 3 within the extraction window after the design pattern data is developed in a frame memory 3 is the U-shaped pattern shown in FIG. 48. The line width of the pattern PQ is about a resolving limit and is defined as 10 pixels on the bit image. The pattern PQ consists of three line portions $PQ_1$, $PQ_2$, and $PQ_3$, and a distance (space portion) between the parallel line portions $PQ_1$, and $PQ_3$ is defined as 10 pixels.

The line portion $PQ_1$ extending in the X direction is defined by a 10-pixel edge $Eg_1$ serving as an end, a 29-pixel $Eg_2$ extending in the X direction, and a 19-pixel $Eg_8$ extending in the X direction. The line portion $PQ_2$ extending in the Y direction is defined by a 30-pixel edge $Eg_3$ extending in the Y direction and a 10-pixel edge $Eg_6$ extending in the Y direction. The line portion $PQ_3$ extending in the X direction is defined by a 10-pixel edge $Eg_5$ serving as an end, a 21-pixel edge $Eg_4$ extending in the X direction, and an 11-pixel edge $Eg_7$ extending in the X direction.

This pattern PQ is shifted by n bits (e.g., 50,000 bits) in units of bits within the extraction window in the +X direction, and the pattern PQ is shifted by one bit in the −Y direction as a whole. Shifting is then continued in the +X direction again. For this reason, when the test element template shown in FIG. 42 is used, the edge $Eg_3$ is corrected first.

FIG. 49 shows a state in which the edge $Eg_3$ is located at the target bit $A_{px}$ during the scan of the bit image. In this case, since the output ED from the edge detector in FIG. 43C is set at logic "1", the two AND gates 207S and 208S in FIG. 45 are kept enabled. In addition, since the elliptical test element portion $B_{px}$ is entirely located on a transparent portion (logic "0") on the basis of the layout of the test bits in FIG. 42, the output LGB from the NOR gate 200S in FIG. 43A is set at logic "1", and the output KA from the AND gate 207S is also set at logic "1".

On the other hand, the upper wing-like test element portion $EA_p$ is entirely located on the pattern within the extraction window, the output LGEa from the NAND gate 206S in FIG. 44 is set at logic "0", and the AND gate 210S always outputs logic "0" regardless of the conditions of other inputs. In the lower wing-like test element portion $DA_p$ within the extraction window, only the bit (15,21) overlapping the test element portion $EA_p$ is located on a pattern (logic "1"), and the remaining eight test bits are located on the transparent portion (logic "0"). For this reason, the output LGDa from the NAND gate 205S in FIG. 44 is set at logic "1", and at the same time, the two circular test element portions $DB_p$ and $DC_p$ are set at logic "0". For this reason, three of the four inputs to the AND gate 209S in FIG. 45 are set at logic "1".

However, since the linear test element portion $C_{px}$ is entirely located on the pattern (logic "1"), the output LGC from the NAND gate 202S in FIG. 43B is set at logic "0". As a result, an output from the OR gate 211S in FIG. 45 is set at logic "0", and the output KB from the AND gate 208S is kept at logic "0".

When the output KA is set at logic "1" and the output KB is set at logic "0" by the circuit in FIG. 46, an edge portion located at the target bit in FIG. 49 is thickened by one pixel. The bit image is sequentially scanned, and the corrected bit image data is stored in the first page of the frame memory part 110A in the temporary memory 110 in FIG. 41.

FIG. 50 shows a state in which the edge $Eg_3$ is located at the target bit when scan progresses from the state in FIG. 49. In this case, since the elliptical test element portion $B_{px}$ is entirely located on the transparent portion, the output KA is set at logic "1". Since the upper wing-like test element portion $EA_p$ is entirely located on the pattern portion, the output LGEa is set at logic "0", and an output from the AND gate 210S is also set at logic "0".

On the other hand, since the lower wing-like test element portion $DA_p$ partially overlap the pattern, the output LGEa is set at logic "1". Since the linear test element portion $C_{px}$ is entirely located on the transparent portion, the output LGC is also set at logic "1". However, since the circular test element portion $DP_p$ is located on the pattern, an output from the AND gate 209S is set at logic "0". As a result, the output KB is kept at logic "0". In the state shown in FIG. 50, the edge $Eg_3$ can be expanded by one pixel.

Of all bits adjacent to the edge $Eg_3$, bits represented by crosses represent bits expanded on the corrected bit image. In this manner, the entire edge $Eg_3$ of the pattern PQ is expanded by one pixel in the +X direction scan mode of the bit image.

The switch SW2 in FIG. 41 is set in the illustrated state, and the switch SW1 is switched from the illustrated state. The control part 110B in the temporary memory 110 changes the read order of the serial bit data from the first page of the frame memory part 110A. The bit image appearing within the extraction window is rotated from the state in FIG. 48 through 180°. In the −X direction scan mode, the edges $Eg_1$, $Eg_5$, and $Eg_6$ of the pattern PQ are corrected.

FIG. 51 shows a state in which the edge $Eg_1$ is located at the target bit in the −X direction scan mode. In this case, since the elliptical test element portion $B_{px}$ is entirely located on the transparent portion, the output KA is set at logic "1". Since the linear test element portion $C_{px}$ is entirely located on the pattern portion, the output LGC is set at logic "0". Outputs from the two AND gates 209S and 210S in FIG. 45 go to logic "0". In FIG. 51, the output KA is set at logic "1", and the output KB is set at logic "0". The edge $Eg_1$ is expanded by one pixel.

When the pattern PQ is shifted within the extraction window in the −X direction scan mode, the edge $Eg_6$ is located at the target bit, as shown in FIG. 52. Of all bits adjacent to the edge $Eg_3$, bits represented by crosses represent a corrected and expanded portion. These corrected bits appear as the bit image within the extraction window. Of all bits adjacent to the edge $Eg_1$, bits represented by crosses do not appear within the extraction window in this stage.

In FIG. 52, since the pattern and transparent portions are mixed within the elliptical test element portion $B_{px}$, the output KA is set at logic "0". At the same time, the linear test element portion $C_{px}$ is entirely located on the transparent portion, the output LGC is set at logic "1". Since the upper wing-like test element portion $EA_p$ is entirely located on the pattern portion, the output LGEa is set at logic "0". Since the pattern and transparent portions are mixed within the lower wing-like test element portion $DA_p$, the output LGDa is set at logic "1". Since the test element portion $DC_p$ is located on the pattern, outputs from the two AND gates 209S and 210S are set at logic "0", and the output KB is also set at logic "0". Therefore, in the state shown in FIG. 52, the edge $Eg_6$ is not corrected.

As described above, the edge $Eg_5$ is expanded by one pixel. The serial data of the corrected bit image is sequentially written in the second page of the frame memory part 110A in the temporary memory 110. Thereafter, the serial bit data is read out from the second page of the memory part 110A as if −Y direction scan is performed by the control part 110B. The readout image passes through the extraction window. The pattern PQ appearing within the extraction window is a pattern rotated from the state of FIG. 48 through 90°. The edges to be corrected are the edges $Eg_2$ and $Eg_7$.

FIG. 53 shows a state in which the edge $Eg_2$ is located at a bit immediately before the target bit in the −Y direction scan mode. In this case, in practice, bits (crosses) of a correction portion of the edge $Eg_3$ are located at a bit immediately before the target bit. This state is substantially the same as that in FIG. 49. Finally, the edge $Eg_2$ is expanded by one pixel so as to include a portion extended by the correction. However, when the edge $Eg_2$ is located at the target bit, as shown in FIG. 54, two test bits at the distal end (upper end) of the upper wing-like test element portion $EA_p$ fall outside the range of the correction portion (bits represented by crosses) of the edge $Eg_1$. The output LGEa is set at logic "1". At this time, the two circular test element portions $EB_p$ and $EC_p$ are set at logic "0". Logic "0" and logic "1" are mixed in the linear test element portion $C_{px}$. In this case, the output from the AND gate 210S goes to logic "1", and the output KB also goes to logic "1". Therefore, the edge $Eg_2$ is expanded by two pixels up to the distal end from the state shown in FIG. 54.

Bits represented by crosses and adjacent to the edges $Eg_1$, $Eg_3$, and $Eg_5$ in FIG. 54 represent correction portions, and the correction portions appear within the extraction window in this stage. However, bits represented by crosses and adjacent to the edge $Eg_2$ do not appear within the extraction window in this stage.

The edge $Eg_7$ is located at the target bit, as shown in FIG. 55, during the scan. In FIG. 55, since the elliptical test element portion $B_{px}$ is entirely located on the pattern portion, the output KA is kept at logic "0". At this time, since the linear test element portion $C_{px}$ is entirely located on the transparent portion, the output LGC goes to logic "1". Since the pattern and transparent portions are mixed in the upper wing-like test element portion $EA_p$, the output LGEa goes to logic "1". Since the two test element portions $EB_p$ and $EC_p$ are set at logic "0", the AND gate 210S in FIG. 45 outputs data of logic "1". As a result, the output KB goes to logic "1". Under the conditions that the outputs KA and KB are set logic "0" and logic "1", respectively, the edge $Eg_7$ is expanded by one pixel throughout its length so as to include the correction bit portion of the edge $Eg_5$ by the circuit in FIG. 46.

The serial bit data corrected as described above is stored in the first page of the memory part 110A of the temporary memory 110. At this time, although the first page has already stored the corrected bit image generated in the +X direction scan mode, this data is unnecessary and can be deleted.

The bit image data of the first page is passed through the extraction window in the +Y direction scan mode to correct the data, and the corrected data is stored in the second page of the memory part 110A. At this time, read access of the serial bit data from the memory part 110A is controlled so that the bit image passing through the extraction window is rotated counterclockwise through 90° from the state in FIG. 48. For this reason, the edges to be corrected are the edges $Eg_4$ and $Eg_8$.

FIG. 56 shows a state in which the edge $Eg_8$ is located at the target bit in the +Y direction scan mode. In this case, since the pattern and transparent portions are mixed in the elliptical test element portion $B_{px}$, the output KA is set at logic "0". In addition, logic "0"s and logic "1"s are also mixed in the lower wing-like test element portion $DA_p$ and the linear test element portion $C_{px}$, and the two circular test element portions $DB_p$ and $DC_p$ are set at logic "0". For this reason, the output LGC goes to logic "1", and the output LGDa goes to logic "1". The AND gate 209S in FIG. 45 outputs data of logic "1", and the output KB goes to logic "1". Therefore, the edge $Eg_8$ is expanded by one pixel in the state shown in FIG. 56.

Assume that the scan progresses and the target bit is located on the edge $Eg_8$, as shown in FIG. 57. At this time, since logic "0" and logic "1" are mixed in the elliptical test element portion $B_{px}$, the output KA is kept at logic "0". Since both the upper wing-like test element portion $EA_p$ and the lower wing-like test element portion $DA_p$ are included in the pattern, the output KB also goes to logic "0". During the downward scan of the pattern PQ from the position in FIG. 57, no correction is performed. Note that of all correction bits, correction bits represented by crosses and adjacent to the edge $Eg_8$ in FIG. 57 do not appear within the extraction window in this stage. Correction bits of other edges have already appeared within the extraction window in this stage.

FIG. 58 shows a state in which the edge $Eg_4$ is located at the target bit. In this case, since no pattern is present within the elliptical test element portion $B_{px}$, the output KA goes to logic "1". Since logic "0" and logic "1" are mixed in the lower wing-like test element portion $DA_p$, the output LGDa goes to logic "1". At the same time, since logic "0" and logic "1" are mixed within the linear test element portion $C_{px}$, the output LGC also goes to logic "1". Since no pattern is present at positions of the two test element portions $DB_p$ and $DC_p$, the AND gate 209S in FIG. 45 outputs data of logic "1", and the output KB goes to logic "1". The edge $Eg_4$ in the state of FIG. 58 is expanded by two pixels. Note that correction bits represented by crosses and adjacent to the edges $Eg_8$ and $Eg_4$ in FIG. 58 do not appear within the extraction window in this stage.

Assume that the pattern PQ is further scanned downward and that the edge $Eg_8$ is located at the target bit, as shown in FIG. 59. At this time, since the linear test element portion $C_{px}$ is entirely located on the pattern region, the output LGC goes to logic "0", and the output KB goes to logic "0" accordingly. However, since the output KA is set at logic "1", expansion is performed by only one pixel.

Correction in all the directions is thus completed, and the corrected bit image is stored in the second page of the memory part 110A. As described above, the switch SW2 is switched to transfer the corrected bit image data to the EB exposure frame memory 3. The corrected bit image is shown in FIG. 60. Referring to FIG. 60, bits represented by ■ constitute a portion added by correction.

EMBODIMENT 4

The line width of an isolated portion of a pattern is increased in the third embodiment described above. However, the line width of a portion except for the isolated portion can be decreased from a design value by a predetermined amount to obtain the same effect as described above. In this case, the same test element shown in FIG. 42 can be used without any modifications. When a target pixel is located at an edge portion of a given pattern, it is determined that this edge portion is not an isolated edge portion and/or a portion near a longitudinal end. The edge is thinned inward from the edge position of the target pixel by a predetermined number of pixels. That is, an algorithm for forcibly replacing a portion having logic value "1" on the design with a portion having logic value "0" is employed.

A logic circuit having this algorithm will be described with reference to FIG. 61.

The circuit shown in FIG. 61 is obtained by adding a logic for decreasing the line width of a portion except for an isolated portion of a pattern so as to switch between a thickening algorithm and a thinning algorithm. When an isolated portion of a pattern is to be thickened, logic "0" (or L level) is set in a selection signal SLC. When a portion except for the isolated portion is to be thinned, logic "1" (or H level) is set in the selection signal SLC.

Elements newly added in the circuit of FIG. 61 are a four-way switch SWd for supplying preset data to a 4-bit shift register 222S, an AND gate 104' for receiving bit data $DC_0$ from a target bit $A_{px}$ and output data DP from the shift register 222S, and a switching logic (an inverter 230S, AND gates 231S and 232S, and an OR gate 233S) for selecting one of an output from an OR gate 104 and an output from the AND gate 104' in response to the selection signal SLC. In addition, a timing control circuit 221S can generate a strobe pulse STB in response to an edge detection signal ED in FIG. 43C.

When the signal SLC is set at logic "0" in the illustrated state of the switch SWd in FIG. 61, the AND gate 232S is disabled, and the AND gate 213S is enabled. An OR signal of data $DC_0'$ from a delay shift register 100 and the correction bit data DP from the shift register 222S is output from the OR gate 233S. This operation is substantially the same as that in FIG. 46.

When the four-way switch SWd is switched from the illustrated position in FIG. 61 and the signal SLC goes to logic "1" (or H level), two-bit data of logic "1" (H) is supplied as preset data to the LSB (first bit) and the second bit of the shift register 222S. An output from an OR gate 220S is supplied to the third bit of the shift register 222S. An output from an AND gate 223S is supplied to the MSB (fourth bit) of the shift register 222S. Since the signal SLC is set at logic "1", the AND gate 231S is disabled, and the AND gate 232S is enabled. For this reason, an output from the AND gate 104' is output as final correction bit data.

Output signals KA and KB are output from the circuit shown in FIG. 45. When the signals KA and KB are simultaneously set at logic "1", it indicates that the edge is determined as an end portion of a pattern in the longitudinal direction and at the same time as an isolated portion. When the logic for thinning the pattern is employed, and the signals KA and KB are simultaneously set at logic "1", the data of a pixel located at the target bit $A_{px}$ should not be corrected.

The shift register 222S sequentially shifts the data of the signal SLC from the LSB side to the MSB side in response to clock pulses CK. Since the signal SLC is set at logic "1", all the four bits in the shift register 222S are set at logic "1" to continue a shift operation unless the strobe pulse STB is generated.

When both the signals KA and KB are set at logic "1", data of logic "1" are set in the third bit and the fourth bit (MSB) of the shift register 222S. For this reason, the output DP from the shift register 222S is set at logic "1". The data $DC_0$ (this data is set at logic "1" since the target bit is located at an edge) from the target bit $A_{px}$ is output from the AND gate 104' without any modification.

When only one of the signals KA and KB goes to logic "0", the edge is thickened by only one pixel in the third embodiment. In FIG. 61, however, the edge is thinned from the design value by only one pixel. At this time, the output from the AND gate 223S is set at logic "0", and the output from the OR gate 220S is set at logic "1". Therefore, only data of logic "0" is set in only the MSB of the shift register 222S in response to the strobe pulse STB. The edge pixel of logic "1" located at the target bit $A_{px}$ is corrected to logic "0" by the AND gate 104'. Therefore, the edge is thinned by one pixel.

When both the signals KA and KB are set at logic "0", data of logic "0" are set in the third bit and the fourth bit (MSB) of the shift register 222S in response to the strobe pulse STB. For this reason, the edge pixel (logic "1") located at the target bit $A_{px}$ and a pixel of logic "1" located inside the edge pixel by one bit are corrected to logic "0"s by the AND gates 104'. Therefore, when the edge pixel at the target bit is neither an isolated portion nor an end portion in the longitudinal direction of the pattern, the line width is decreased by two pixels.

According to the fourth embodiment, the logic for thickening a pattern and the logic for thinning a pattern with respect to design data of one field can be selectively and easily applied by switching operations of the selection signal SLC and the switch SWd.

A correction pattern used upon application of the algorithm for decreasing the line width of a pattern is exemplified in FIGS. 62A and 62B. In FIGS. 62A and 62B, the logic for expanding the line pattern in the longitudinal direction is canceled, and the length of the line is kept to be the design value.

FIG. 62A shows a correction result of an isolated line pattern having a line width a. In the pattern shown in FIG. 62A, a length d of an end portion of the pattern in the longitudinal direction is not corrected at all, and both edges of the central portion of the pattern are reduced by c/2. According to the SHRINC method described above, if the pitch of the periodic pattern is a resolving limit is defined as Pm, conditions 0.1 Pm≤c≤0.2 Pm and 0.5 Pm≤d≤1.0 Pm (preferably d=0.75 Pm) are satisfied.

FIG. 62B shows a correction result of a periodic pattern in which four line portions each having the design line width a are arranged at a pitch 2a in the X direction.

In FIG. 62B, the central portions of the outer edges of the end line portions of the four line portions are thinned by c/2 in the same manner as in FIG. 62A. The distal end portions (length: d) of adjacent edges are thinned by a size b or e/2. The adjacent edges of the central portions of the four line patterns are thinned by c/2.

The sizes b and e fall within ranges of 0.05 Pm≤b≤0.1 Pm and 0.1 Pm≤e≤0.2 Pm. For example, b=c/2=e/2=0.05 Pm is preferable.

The algorithm for decreasing the line width from the design value is suitable to improve image contrast when a pattern to which this algorithm is applied is a pattern serving as a transparent portion on a reticle. In exposure of a pattern formed by the thinning algorithm, it is effective to use a negative resist.

Note that an exposure amount is determined such that the line width of a resist image obtained in exposure is set to be the design value a regardless of the thickening or thinning algorithm.

EMBODIMENT 5

An edge defining a longitudinal end of a pattern is expanded by only one pixel to elongate each line portion in the template shown in FIG. 42. As shown in FIGS. 62A and 62B, correction of only the line width is sometimes required without changing the length of the pattern. In this case, a logic circuit may be arranged to forcibly set an output KA or the like at logic "0" if conditions are given such that an elliptical test element portion $B_{px}$ is included in a given pattern, i.e., an output LGB is set at logic "1", a linear test element portion $C_{px}$ is entirely included in any pattern, i.e., an output LGC is set at logic "0", and two wing-like test element portions $DA_p$ and $EA_p$ are partially located on any patterns, i.e., both outputs LGDa and LGEa are set at logic "1". More specifically, as shown in FIG. 63, an AND gate 240S for receiving inverted signals of the outputs LGB and LGC and the outputs LGDa and LGEa is arranged. A gate 241S may be arranged to cause a control circuit 221S to inhibit transmitting an edge detection signal ED or an output from an OR gate 220S when an output from the AND gate 240S is set at logic "1".

The logic circuit in FIG. 63 is obtained by adding the AND gate 240S and the gate (AND) 241S to the logic circuit in FIG. 45. The control circuit 221S generates a strobe pulse STB in response to an output from the gate 241S.

EMBODIMENT 6

A target pattern element in each embodiment described above has only edges extending in the X direction (bit shift direction) and the Y direction (line shift direction) within the extraction window. The test element shown in FIG. 12 or 42 may be relatively scanned in the ±Y direction to correct an edge extending in a direction crossing both the X and Y directions, e.g., a 45° direction. Alternatively, the respective test bits may be arranged such that the test element shown in FIG. 12 or 42 is rotated through 45°. As in the SHRINC method, when light from a light source is focused as four beam spots at four positions within the Fourier transform plane in the illumination optical system and sides of a rectangle defined by the central points of the four beam spots have a specific relationship (e.g., parallel) with the X and Y directions, a linear pattern (or a chevron pattern or the like) having a 45° edge is not substantially tapered at the distal end and is transferred. For this reason, a correction operation of a pattern having a 45° (or 30° to 60°) edge may be inhibited. In this case, several test bits are set within an extraction window to detect an edge extending in the Y direction (or X direction) from all edges passing through a target bit $A_{px}$. The above correction may be performed for only the edge (extending in the Y or X direction by a predetermined number of pixels or more) detected by these test bits. This example is shown in FIG. 64A. As shown in FIG. 64A, test bits represented by ● are set at a position (21,19) or (21,18) spaced apart upward from a target bit (21,21) by a few pixels and a position (21,23) or (21,24) spaced apart downward from the target bit (21,21) by a few pixels. When the target bit (21,21) detects an edge (i.e., when logic "1" is set), it is determined whether the upper and lower test bits are set at logic "1". In this case, a logic circuit includes a 3-input AND gate 245S for receiving data from the upper and lower test bits (21,19) and (21,23), as shown in FIG. 64B, and an output from an AND gate 203S shown in FIG. 43C. An output from the AND gate 245S is applied as a signal ED, as shown in FIG. 45 or 63.

In FIG. 64A, part of a 45° pattern edge is located at the target bit $A_{px}$, the bit (21,19) goes to logic "1", the bit (21,23) goes to logic "0". An output from the AND gate 245S in FIG. 64B is kept at logic "0".

Other Modifications

First, in each of the third to sixth embodiments, the bit image is scanned four times, i.e., in the +X, −X, +Y, and −Y directions, but can be scanned once. The test element template shown in FIG. 42 and a template obtained by rotating the test element template in FIG. 42 through 90° about the target bit as in FIG. 21 are set within the same extraction window. When any edge is located at the target bit, the direction of this edge is detected. The test element template suitable for this detected direction is used to correct the edge. For this purpose, a logic circuit can be arranged as in the second embodiment of FIG. 27.

Second, in the third embodiment, as shown in FIG. 46, the output from the OR gate 220S is always supplied to the LSB of the correction data addition shift register 222S, and the edge is corrected by one pixel in accordance with the determination result obtained such that the target edge is an isolated edge (output KA="1") or a portion near the longitudinal end (output KB="1"). However, correction may be performed by a predetermined number of pixels in accordance with only the condition that the detected edge is a portion near the longitudinal end. In this case, since the determination result of an isolated edge need not be used, the AND gate 223S in FIG. 46 can be omitted, the output of the OR gate 220S is disconnected from the LSB of the shift register 222S, and the output KB is directly connected to the switches SWa, SWb, and SWc. At a parallel edge portion between the adjacent pattern portions, a correction amount may be reduced for the edge as the portion near the longitudinal edge, or the parallel edge portion need not be corrected. For this reason, the algorithm may be modified as follows. If the output KA is set at logic "0" for the output KB="1", the correction amount may be defined as one pixel (or zero pixel). However, if the output KA is set at logic "1", the correction amount may be defined as two pixels (or one pixel). In this case, when the output KB is set at logic "0", correction is not performed regardless of the logic state of the output KA. Such a modification in algorithm can be easily achieved by changing connections of the OR gate 220S, the AND gate 223S, and the switches SWa, SWb, and SWc and an operation for applying preset data to the respective bits of the shift register 222S in FIG. 64B.

Third, although the pattern is regarded as a light-shielding portion (logic "1") in each logic circuit described in each embodiment described above, the pattern may be defined as a transparent portion. In this case, the line width of a portion near longitudinal end of a line pattern as a transparent portion is increased. At this time, an inverter (NOT) is arranged at an extraction window portion to which design bit image flows from the frame memory 3 in FIG. 41, i.e., at the position of the terminal TP in FIG. 41. At the same time, an inverter is arranged between the switch SW2 and the frame memory 3.

In each of the third to sixth embodiments described above, correction need not be limited to all pattern data within one reticle, but to pattern data of a specific portion.

In each of the third to the sixth embodiments described above, the pattern data stored in the apparatus need not be all data of portions subjected to correction. Partial data blocks may be prepared. After the portions to be corrected are corrected, the corrected data may be stored in an auxiliary device, and the next block data is read to perform correction. In this case, the volume of the data simultaneously read by the apparatus is preferably larger than the area subjected to correction by the size of the determination template (i.e., the test element and the extraction widow required for the test element).

If reticle patterns include a pattern group having the same shape, i.e., a memory reticle pattern, one pattern group may be corrected by the method described above, and the corrected pattern may be duplicated for other patterns including the same pattern as the corrected pattern, thereby greatly shortening the processing time.

In each embodiment described above, pattern correction is performed by the hardware shown in FIG. 10 or 41. However, correction may be performed by software having the same function as the hardware.

Finally, patterns to be corrected in the third embodiment will be briefly described with reference to FIGS. 65A to 66B.

Figure 65A:
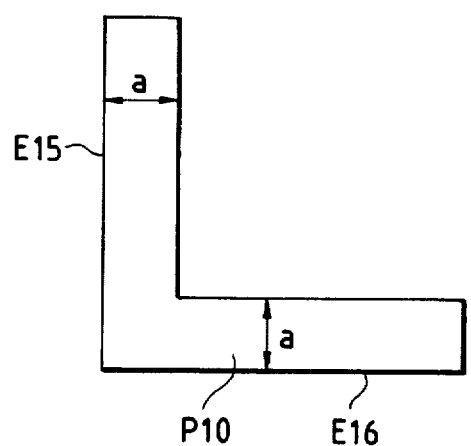
Figure 65B:
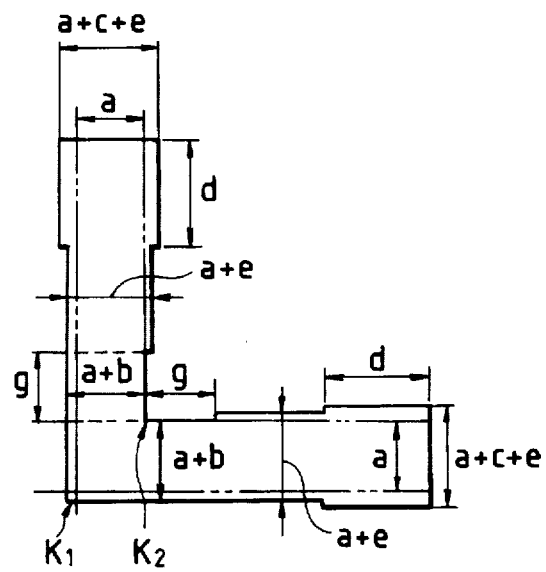

FIG. 65A shows the design shape of an L-shaped pattern element P10 (line width: a) formed as a transparent portion in the background of a light-shielding portion. The end portion of the L-shaped pattern element can be corrected in the same manner as in correction of the end portion of the pattern element in FIG. 62A. The line width is also corrected substantially in the same manner as that of the pattern element in FIG. 62A. The corrected pattern is shown in FIG. 65B. Even if an outer corner portion K1 of the L-shaped pattern element is simply thickened in the direction of short side of the L-shaped pattern element, the corner portion K1 cannot be corrected. For example, an outer edge El5 of the L-shaped pattern element is corrected such that the edge El5 elongated by expanding an edge El6 is expanded so as to continue the corrected edge. This also applies to the operation described with reference to FIGS. 49 to 60.

Figure 65C:
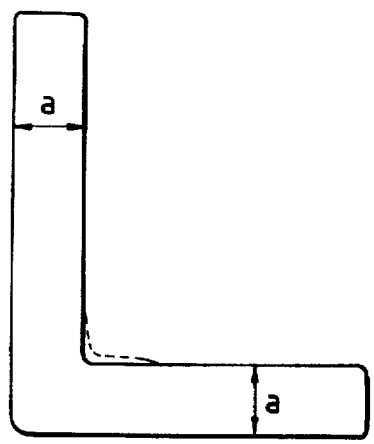

When an inner corner portion K2 of the L-shaped pattern element is thickened in the same manner as other portions, the inner corner of the resist pattern is expanded as indicated by a dotted portion in FIG. 65C. The image cannot be faithfully transferred. For this reason, an increase in line width of this corner portion is preferably smaller than that of other portions (in this embodiment, the edge of the inner portion is not corrected, and the edge of the outer portion is corrected to thicken the corner portion). In this embodiment, the line width of the corner portion is increased by b to obtain about a+b. A length g whose thickening amount is small preferably has a thickening amount of about 0.25 Pm to about 0.5 Pm. In this manner, the line thickening amount of the length g at the corner portion is small because the edge is not detected as an isolated edge since the adjacent edges at the corner near the inner corner portion K2 are not spaced apart from each other by a maximum pitch Pm or more in the background.

The pattern shown in FIG. 65B is exposed using the apparatus shown in FIGS. 29 to 33 to obtain a resist image (negative resist) free from any deformation, as indicated by a solid line in FIG. 65C.

FIGS. 66A and 66B show another example of reticle pattern correction. FIG. 66A shows the design shape of a pattern element P11 (line width: a) of a transparent portion formed in the background of a light-shielding portion. Correction of the end portions, the central portion (except for the end portions), and the inner corner portion is performed in the same manner as in FIG. 65B. Therefore, the pattern shape is corrected, as shown in FIG. 66B.

Correction in FIGS. 65B and 66B also has an effect for a case in which a light-shielding pattern is formed in the transparent background under an assumption that a line is drawn in a positive resist to transfer a pattern.

Correction of a square isolated pattern may be performed such that sides of the square are expanded by 0.05 Pm as in the line width correction amount in FIG. 62B. In particular, when a plurality of square transparent isolated patterns having different sizes are formed in the light-shielding background, a smaller square is corrected by an amount larger than that of a larger square to maintain mask linearity. In the pattern shown in FIG. 33C, all edge portions surrounding the entire pattern are expanded outward by about 0.05 Pm (Px,Py).

What is claimed is:

1. A lithographic mask serving as an original plate for exposing and transferring a micropattern onto a photosensitive substrate, said lithographic mask being obtained such that a plurality of transparent or light-shielding pattern elements complementary with a transparent or light-shielding background substrate with respect to exposure light are two-dimensionally arranged on said transparent or light-shielding background substrate, wherein a portion of a pattern element line width is increased or decreased from design data by a small amount in accordance with two geometrical conditions of said pattern element, one said condition being whether a target edge portion of said pattern element is an isolated edge portion;

the other said condition being whether a cross-dimension of said pattern element from said target edge portion is smaller than a predetermined value.

2. A mask according to claim 1, wherein said plurality of pattern elements include at least one linear pattern element, and the linear pattern element line width is corrected from the design data so as to be greater at a longitudinal end portion thereof than at a central portion thereof.

3. A mask according to claim 2, wherein for at least one edge of each pattern element having an adjacent predetermined region in which other pattern elements are not present, the pattern element line width of the design data is corrected to expand said at least one edge by the small amount.

4. A mask according to claim 2, wherein for each pattern element having at least one edge near which another pattern element is present within a predetermined distance, the pattern element line width of the design data is corrected to decrease the line width of said at least one edge by the small amount.

5. A mask according to claim 1, wherein the pattern element line width of the design data is a mask line width corresponding to from a desired line width of said pattern element as transferred onto said photosensitive substrate through a projection optical system.

6. A pattern according to claim 1, wherein said mask element is a transparent portion, and said background substrate is a light-shielding portion.

7. A mask according to claim 1, wherein said pattern element is a light-shielding portion, and said background substrate is a transparent portion.

8. A mask according to claim 1, wherein for at least one edge of each pattern element having an adjacent predetermined region in which other pattern elements are not present, the pattern element line width of the design data is corrected to expand said at least one edge by the small amount.

9. A mask according to claim 1, wherein for each pattern element having at least one edge near which another pattern element is present within a predetermined distance, the pattern element line width of the design data is corrected to decrease the line width of said at least one edge by the small amount.

10. A method of forming a pattern having a plurality of transparent or light-shielding pattern elements with respect to a predetermined energy beam on an original plate serving as a mask on the basis of design data defining shapes and layout of the pattern elements, comprising:

testing whether a target pattern element of said plurality of pattern elements has a pattern end portion of not more than a predetermined width 3L, where L is substantially equal to a predetermined resolving limit; and on the condition that said target patterns element is determined to have such an end portion, correcting said target pattern element from a shape defined by said design data, such that a width-delimiting outer edge of said target pattern element at said end portion is expanded outwardly by a predetermined small amount relative to another portion of said outer edge.

11. A method of forming a plurality of transparent or light-shielding pattern elements with respect to a predetermined energy beam on an original plate serving as a mask on the basis of design data defining shapes and layout of the pattern elements, comprising:

specifying part of an outer edge portion of a target pattern element of said plurality of pattern elements as a target outer edge portion; and resizing said target outer edge portion outward by a predetermined small amount with respect to an outer edge portion linearly continuous with said target outer edge portion on the conditions that a width of said target pattern element from said target outer edge is smaller than a predetermined value and that there is no adjacent pattern element within a predetermined spacing from said target outer edge portion.

12. A method according to claim 11, wherein said conditions are determined by the use a template which detects whether a pattern element exists at each of mutually different positions spaced apart from a reference point by a predetermined distance.

13. A method according to claim 12, wherein said conditions are determined by scanning of said pattern elements defined by the design data with said template.

14. A method of forming a pattern having a plurality of transparent or light-shielding pattern elements with respect to a predetermined energy beam on an original plate serving as a mask on the basis of design data defining shapes and layout of the pattern elements, comprising:

testing a target outer edge defining the entire perimeter of a target pattern element selected from said plurality of pattern elements to determine if there is no other pattern element adjacent to said target outer edge within a predetermined spacing, and testing whether said target pattern element has a pattern end portion of not more than a predetermined width;

defining a first small amount for relative outward correction of an isolated target outer edge portion for which there is no adjacent pattern element within said predetermined spacing, and defining a second small amount for relative outward correction of a width-delimiting edge portion of a target pattern element pattern end portion of not more than said predetermined width; and correcting an outer edge from design data for said target pattern element in accordance with one of the first and second small amounts or a sum of the first and second small amounts.

15. A pattern forming system for forming a plurality of transparent or light-shielding pattern elements with respect to a predetermined energy beam on an original plate serving as a mask on the basis of design data defining shapes and layout of the pattern elements, comprising:

binary developing means for developing an image of design pattern elements for at least partial region on said original plate into a binary pixel image on the basis of the design data;

first testing means for testing a target outer edge portion of a target pattern element on the basis of information of the developed binary image, and outputting a first test signal on the conditions that there is no adjacent pattern element spaced within a first predetermined number of pixels from said target edge portion and a width of said target pattern element from said target edge portion is smaller than a second predetermined number of pixels;

second testing means for testing on the basis of the information of the developed binary image whether said target edge portion is a width-delimiting edge portion of a pattern element end portion of not more than a predetermined width, and for outputting a second test signal on the condition that said target edge portion is determined to be such a width-delimiting edge portion; and correcting means for correcting the binary image so that the target edge portion is expanded outward relative to other edge portions by a first small amount in units of pixels on the condition that the first test signal is output, correcting the binary image so that the target edge portion is expanded outward relative to other edge portions by a second small amount in units of pixels on the condition that the second test signal is output, and correcting the binary image so that the target edge portion is expanded outward relative to other edge portions by an amount determined by synthesis of the first and second small amounts on the condition that both the first and second test signals are output.

16. A pattern forming system for forming a plurality of transparent or light-shielding pattern elements with respect to a predetermined energy beam on an original plate serving as a mask on the basis of design data defining shapes and layout of the pattern elements, comprising:

binary developing means for developing an image of design pattern elements for at least partial region on said original plate into a binary pixel image on the basis of the design data;

testing means for testing on the basis of information of the developed binary image whether a target outer edge portion of a target pattern element selected from said plurality of pattern elements is a width-delimiting edge portion of a pattern element end portion of not more than a predetermined width 3L, where L is substantially equal to a predetermined resolving limit, and for outputting a test signal on the condition that said target edge portion is determined to be such a width-delimiting edge portion; and correcting means for correcting the binary image so that said target edge portion is expanded outward relative to other edge portions by a predetermined small amount in units of pixels in response to the test signal.

17. A method of manufacturing a lithographic mask by forming a plurality of transparent or light-shielding pattern elements with respect to a predetermined energy beam on an original plate on the basis of design data defining shapes and layout of the pattern elements, comprising:

testing whether a target outer edge portion of a specific pattern element of not more than a predetermined width 3L in said plurality of pattern elements has no other pattern element adjacent thereto within a predetermined spacing 2L, where n is substantially equal to a minimum pattern element width to be formed on the original plate;

correcting the design data so that said target outer edge portion is expanded relatively outward by a small amount on the condition that it is determined that there is no such adjacent pattern element within the predetermined spacing 2L; and generating the plurality of pattern elements on said original plate on the basis of the corrected design data.

18. A system for manufacturing a lithographic mask by forming a plurality of transparent or light-shielding pattern elements with respect to a predetermined energy beam on an original plate on the basis of design data defining shapes and layout of the pattern elements, comprising:

binary developing means for developing an image of design pattern elements for at least a partial region on said original plate into a binary pixel image on the basis of the design data;

testing means for testing on the basis of information of the developed binary image whether a target outer edge portion of a specific pattern element of not more than a predetermined width 3L has no other pattern element adjacent thereto within a predetermined spacing 2L, Where L is substantially equal to a minimum pattern element width to be formed on the original plate; and correcting means for correcting the binary image so that said target outer edge portion of said specific pattern element is expanded relatively outward by a small amount in units of pixels on the condition that said testing means determines that there is no such adjacent pattern element within the predetermined spacing, wherein said plurality of pattern elements are generated on said original plate on the basis of the binary image corrected by said correcting means.

19. An exposure method for illuminating a mask with light from an illumination system and projecting a plurality of pattern elements formed on said mask onto a sensitive substrate with a projection optical system, said method comprising:

providing in a projecting path of said projection optical system a corrected mask having a pattern including a plurality of pattern elements which are two-dimensionally arranged on the basis of corrected design data defining shapes and layout of the pattern elements, and at least part of which constitute a pattern portion which is periodic in a predetermined direction;

the design data having been corrected so that a target outer edge portion of a target pattern element is expanded relatively outward in response to a determination that the target outer edge portion has no other pattern element adjacent thereto within a predetermined spacing and that the target pattern element has a cross-dimension from the target outer edge portion which is smaller than a predetermined value; and confining illumination light passing through a Fourier transform plane in said illumination system to at least one local region in the Fourier transform plane having a center shifted from an optical axis of said illumination system by a distance determined according to the periodicity of said periodic pattern portion and in a direction substantially corresponding to said predetermined direction.

20. An exposure method for illuminating a mask with light from an illumination system and projecting a plurality of pattern elements formed on said mask onto a sensitive substrate with a projection optical system, said method comprising:

providing in a projecting path of said projection optical system a corrected mask having a pattern including a plurality of pattern elements which are two-dimensionally arranged on the basis of corrected design data defining shapes and layout of the pattern elements, and at least part of which define a pattern portion which is periodic in a predetermined direction;

said design data having been corrected so that the width of a longitudinal end portion of a linear target pattern element is outwardly expanded relative to the width of an intermediate portion of the target pattern element in response to a determination that said end portion has no more than a predetermined width; and confining illumination light passing through a Fourier transform plane in said illumination system to at least one local region in the Fourier transform plane having a center shifted from an optical axis of said illumination system by a distance determined according to the periodicity of said periodic pattern portion and in a direction substantially corresponding to said predetermined direction.

21. An exposure method for illuminating a mask with a light from an illumination system and projecting a plurality of pattern elements formed on said mask onto a sensitive substrate with a projection optical system, said method comprising:

providing in a projecting path of said projection optical system a corrected mask having a pattern including a plurality of pattern elements which are two-dimensionally arranged on the basis of corrected design data defining shapes and layout of the pattern elements, and at least a part of which constitutes a pattern portion which is periodic in a predetermined direction;

the design data having been corrected so that a target outer edge portion of a target pattern element is expanded relatively outward in response to a determination that the target outer edge portion has no other pattern element adjacent thereto within a predetermined spacing and that the target pattern element has a cross-dimension from the target outer edge portion which is smaller than a predetermined value; and confining illumination light passing through a Fourier transform plane in said illumination system to have an intensity distribution of annular shape.

22. An exposure method for illuminating a mask with a light from an illumination system and projecting a plurality of pattern elements formed on said mask onto a sensitive substrate with a projection optical system, said method comprising:

provided in a projecting path of said projection optical system a corrected mask having a pattern including a plurality of pattern elements which are two-dimensionally arranged on the basis of corrected design data defining shapes and layout of the pattern elements, and at least a part of which defines a pattern portion which is periodic in a predetermined direction;

said design data having been corrected so that the width of a longitudinal end portion of a linear target pattern element is outwardly expanded relative to the width of an intermediate portion of the target pattern element in response to a determination that said end portion has no more than a predetermined width; and confining illumination light passing through a Fourier transform plane in said illumination system to have an annular shaped intensity distribution.

23. An exposure method for illuminating a mask with a light from an illumination system and projecting a plurality of pattern elements formed on said mask onto a sensitive substrate with a projection optical system, said method comprising:

providing in a projecting path of said projection optical system a phase shifting mask having a pattern including a plurality of pattern elements which are two-dimensionally arranged on the basis of corrected design data defining shapes and layout of the pattern elements, and at least a part of which constitutes a pattern portion which is periodic in a predetermined direction;

the design data having been corrected so that a target outer edge portion of a target pattern element is expanded relatively outward in response to a determination that the target outer edge portion has no other pattern element adjacent thereto within a predetermined spacing 2L and that the target pattern element has a cross-dimension from the target outer edge portion which is smaller than a predetermined value 3L, wherein L substantially corresponds to a minimum line width capable of being projected onto the sensitive substrate; and illuminating said phase shifting mask with an illumination light from the illumination system to transfer said plurality of pattern elements onto the sensitive substrate.

* * * * *